United States Patent
Oshiyama et al.

(10) Patent No.: US 9,797,949 B2
(45) Date of Patent: Oct. 24, 2017

(54) TEST CIRCUIT AND METHOD OF CONTROLLING TEST CIRCUIT

(71) Applicant: FUJITSU LIMITED, Kawasaki-shi, Kanagawa (JP)

(72) Inventors: Gen Oshiyama, Kawasaki (JP); Osamu Moriyama, Yokohama (JP); Takahiro Shikibu, Kawasaki (JP); Akihiro Chiyonobu, Yokohama (JP); Iwao Yamazaki, Atami (JP)

(73) Assignee: FUJITSU LIMITED, Kawasaki (JP)

( * ) Notice: Subject to any disclaimer, the term of this patent is extended or adjusted under 35 U.S.C. 154(b) by 35 days.

(21) Appl. No.: 14/919,105

(22) Filed: Oct. 21, 2015

(65) Prior Publication Data

US 2016/0187421 A1 Jun. 30, 2016

(30) Foreign Application Priority Data

Dec. 26, 2014 (JP) ................... 2014-264678

(51) Int. Cl.
*G01R 31/28* (2006.01)
*G01R 31/3177* (2006.01)
(Continued)

(52) U.S. Cl.
CPC ... *G01R 31/3177* (2013.01); *G01R 31/31727* (2013.01); *G01R 31/318513* (2013.01)

(58) Field of Classification Search
CPC ........ G01R 31/3177; G01R 31/318513; G01R 31/31727
See application file for complete search history.

(56) References Cited

U.S. PATENT DOCUMENTS 4,672,639 A * 6/1987 Tanabe .................. H04L 7/0338
                                                                                                     327/231
6,292,045 B1 * 9/2001 Bongiorno ................ G06F 1/08
                                                                                                     327/298
(Continued)

FOREIGN PATENT DOCUMENTS

JP         62-169355         7/1987
JP         2002-185309       6/2002
(Continued)

OTHER PUBLICATIONS

Extended European Search Report mailed Jun. 27, 2016 in related European Application No. 15192467.7.

*Primary Examiner* — Thien D Nguyen
(74) *Attorney, Agent, or Firm* — Staas & Halsey LLP

(57) ABSTRACT

A test circuit, provided to a semiconductor device including a plurality of semiconductor chips, includes: a test clock terminal provided to a first chip; a plurality of clock paths disposed between the first chip and a second chip through which the test clock is transmitted from the first chip to the second chip; a test unit provided to the second chip for testing the second chip by using the test clock transmitted to the second chip; a clock detection unit provided to the second chip, and detects the test clock that is received through each of the plurality of clock paths; and a clock path selection unit which is provided to the second chip, selects a first clock path among the plurality of clock paths as a test clock path, and supplies the test clock transmitted through the test clock path to the test unit.

15 Claims, 16 Drawing Sheets

(51) Int. Cl.
 *G01R 31/3185* (2006.01)
 *G01R 31/317* (2006.01)

(56) References Cited

U.S. PATENT DOCUMENTS

| | | |
|---|---|---|
| 2002/0074609 A1 | 6/2002 | Maruyama |
| 2003/0197515 A1 | 10/2003 | Ishigaki |
| 2003/0223522 A1* | 12/2003 | Fukushima ............ H04L 7/0338 375/354 |
| 2008/0204091 A1* | 8/2008 | Choo ........................ G11C 5/02 327/149 |
| 2010/0225364 A1* | 9/2010 | Choi ......................... G06F 1/10 327/109 |
| 2010/0332177 A1 | 12/2010 | Wu et al. |
| 2011/0084758 A1 | 4/2011 | Shibata et al. |
| 2012/0313647 A1* | 12/2012 | Carpenter ............ G11C 29/025 324/612 |
| 2013/0043897 A1 | 2/2013 | Sethuram et al. |
| 2013/0168672 A1 | 7/2013 | Lewis |
| 2013/0265033 A1 | 10/2013 | Lee et al. |
| 2014/0232434 A1* | 8/2014 | Koazechi ................. G06F 1/08 327/40 |
| 2015/0234420 A1* | 8/2015 | Lin .......................... G06F 1/08 327/292 |

FOREIGN PATENT DOCUMENTS

| | | |
|---|---|---|
| JP | 2003-309183 | 10/2003 |
| JP | 2004-317352 | 11/2004 |
| JP | 2011-81887 | 4/2011 |
| JP | 2013-105996 | 5/2013 |

\* cited by examiner

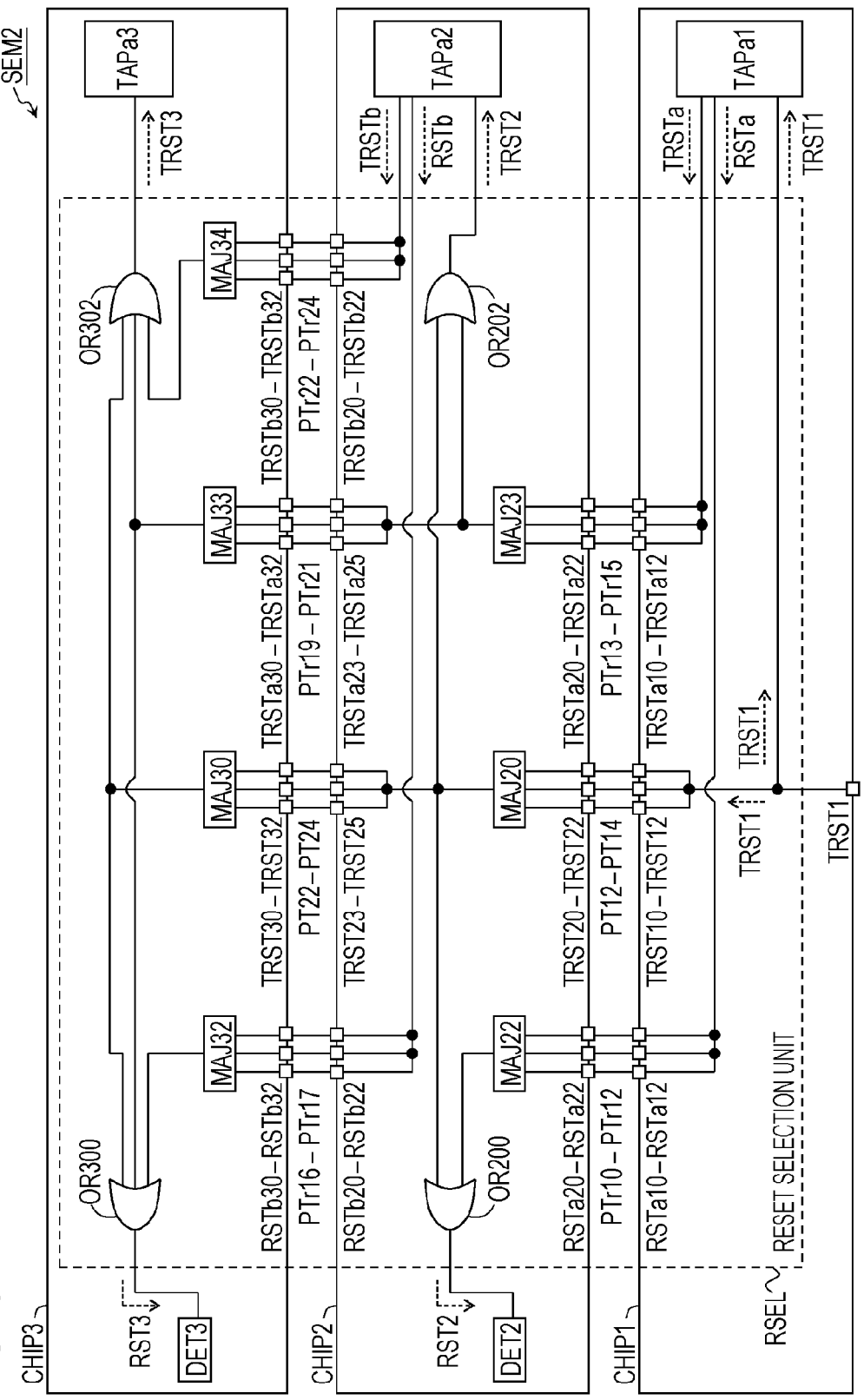

FIG. 10

| | FIRST RESET STATE | SECOND RESET STATE | THIRD RESET STATE | FOURTH RESET STATE |
|---|---|---|---|---|
| TEST UNIT TAPa1 OF SEMICONDUCTOR CHIP CHIP1 | RESET | RESET RELEASE | RESET RELEASE | RESET RELEASE |
| CLOCK DETECTION UNIT DET2 OF SEMICONDUCTOR CHIP CHIP2 | RESET | RESET | RESET RELEASE | RESET RELEASE |
| TEST UNIT TAPa2 OF SEMICONDUCTOR CHIP CHIP2 | RESET | RESET | RESET | RESET RELEASE |
| RESET SIGNAL TRST1 | 1 | 0 | 0 | 0 |
| RESET SIGNAL RSTa | — | 1 | 0 | 0 |
| RESET SIGNAL TRSTa | — | 1 | 1 | 0 |

(0: RESET RELEASE, 1: RESET, —: LOGICAL VALUE 0 OR LOGICAL VALUE 1)

TEST CIRCUIT AND METHOD OF CONTROLLING TEST CIRCUIT

CROSS-REFERENCE TO RELATED APPLICATION

This application is based upon and claims the benefit of priority of the prior Japanese Patent Application No. 2014-264678, filed on Dec. 26, 2014, the entire contents of which are incorporated herein by reference.

FIELD

The embodiments disclosed herein are related to a test circuit of a semiconductor device, and a method of controlling the test circuit.

BACKGROUND

In a system in package (SiP) that is one of package technologies of a semiconductor device, a plurality of semiconductor chips are stored in a single package. I/O (input/output) terminals of the plurality of semiconductor chips, which are stacked in SiP, are joined to each other by a bump such as a microbump and the like. In a semiconductor device in which the plurality of semiconductor chips are stacked, there is a possibility that a failure may occur in a signal path including the I/O terminals, the microbump, and the like due to a manufacturing defect of the microbump, and the like. For example, a failure in which the signal path including the I/O terminals, the microbump, and the like enters an open state, a failure in which interconnections adjacent to each other are short-circuited, and the like occur. There is suggested a method in which two semiconductor chips are connected to each other through a bump, and then a connection state of the semiconductor chips is tested so as to detect the failure in the signal path of the semiconductor chips which are stacked (for example, refer to Japanese Laid-open Patent Publication No. 2004-317352).

In addition, a decrease in a yield ratio (yield ratio of the semiconductor chips) due to a joining defect at the microbump becomes a cause for increasing the cost of SiP. So as to suppress an increase in the cost of SiP, with regard to the semiconductor device in which the plurality of semiconductor chip are stacked, there is suggested a technology of relieving the defect by bypassing a failure site (for example, refer to Japanese Laid-open Patent Publication Nos. 2011-81887, 2013-105996, and 2003-309183).

Detection of the failure site in the signal path between the semiconductor chips is carried out by using a scan flip-flop that is provided in correspondence with each terminal that is an inspection target, and the like. The scan flip-flop is a flip-flop circuit corresponding to a scan test, and operates in synchronization with a clock for test (hereinafter, also referred to as a test clock). A test circuit that is embedded in a semiconductor device operates in synchronization with the test clock, and sets test data in the scan flip-flip on one side of the semiconductor chips, which are connected to each other, through a scan chain and the like.

In addition, the test circuit transmits test data from the scan flip-flop on one side of the semiconductor chips which are connected to each other to the scan flip-flop on the other side. According to this, the test data is retained in the scan flip-fop of the semiconductor chip on the other side. In addition, the test circuit acquires the test data that is retained in the scan flip-flop of the semiconductor chip on the other side through the scan chain and the like, and detects a failure site in the signal path between the semiconductor chips based on the data that is acquired.

In addition, there is suggested a data retaining circuit in which the flip-flop circuit is made redundant to reduce an effect of malfunction of the flip-flop circuit (for example, refer to Japanese Laid-open Patent Publication No. 2002-185309). For example, this kind of data retaining circuit retains input data in three flip-flop circuits, and outputs data in accordance with a logical value which occupies the half or greater among a plurality of pieces of output data of the three flip-flop circuit. In addition, with regard to a semiconductor integrated circuit that is manufactured by using a silicon on insulator (SOI) technology, there is suggested a configuration in which a test circuit is made redundant (for example, refer to Japanese Laid-open Patent Publication No. 62-169355).

In signal paths between the semiconductor chips which are connected to each other, a failure may occur in a signal path (hereinafter, also referred to as a clock path) of the test clock. In this case, it is difficult to operate the scan flip-flop and the like, and thus it is difficult to carry out a test for detecting a failure site in the signal path between the semiconductor chips. That is, in a case where a failure occurs in the clock path among signal paths between the semiconductor chips which are connected to each other, it is difficult to retrieve the failure by bypassing a failure site. As a result, a yield ratio of the semiconductor device decreases, and thus the manufacturing cost of the semiconductor device increases.

According to an aspect, an object of the test circuit and the method of controlling the test circuit according to the disclosure is to improve the yield ratio of the semiconductor device.

SUMMARY

According to an aspect of the invention, a test circuit, provided to a semiconductor device including a plurality of semiconductor chips, includes: a test clock terminal provided to a first chip; a plurality of clock paths disposed between the first chip and a second chip through which the test clock is transmitted from the first chip to the second chip; a test unit provided to the second chip for testing the second chip by using the test clock transmitted to the second chip; a clock detection unit provided to the second chip, and detects the test clock that is received through each of the plurality of clock paths; and a clock path selection unit which is provided to the second chip, selects a first clock path among the plurality of clock paths as a test clock path, and supplies the test clock transmitted through the test clock path to the test unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating an example of a reset selection unit illustrated in FIG. 8.

FIG. 10 is a diagram illustrating an example of a reset state of a test circuit illustrated in FIG. 8.

DESCRIPTION OF EMBODIMENTS

Figure 1:
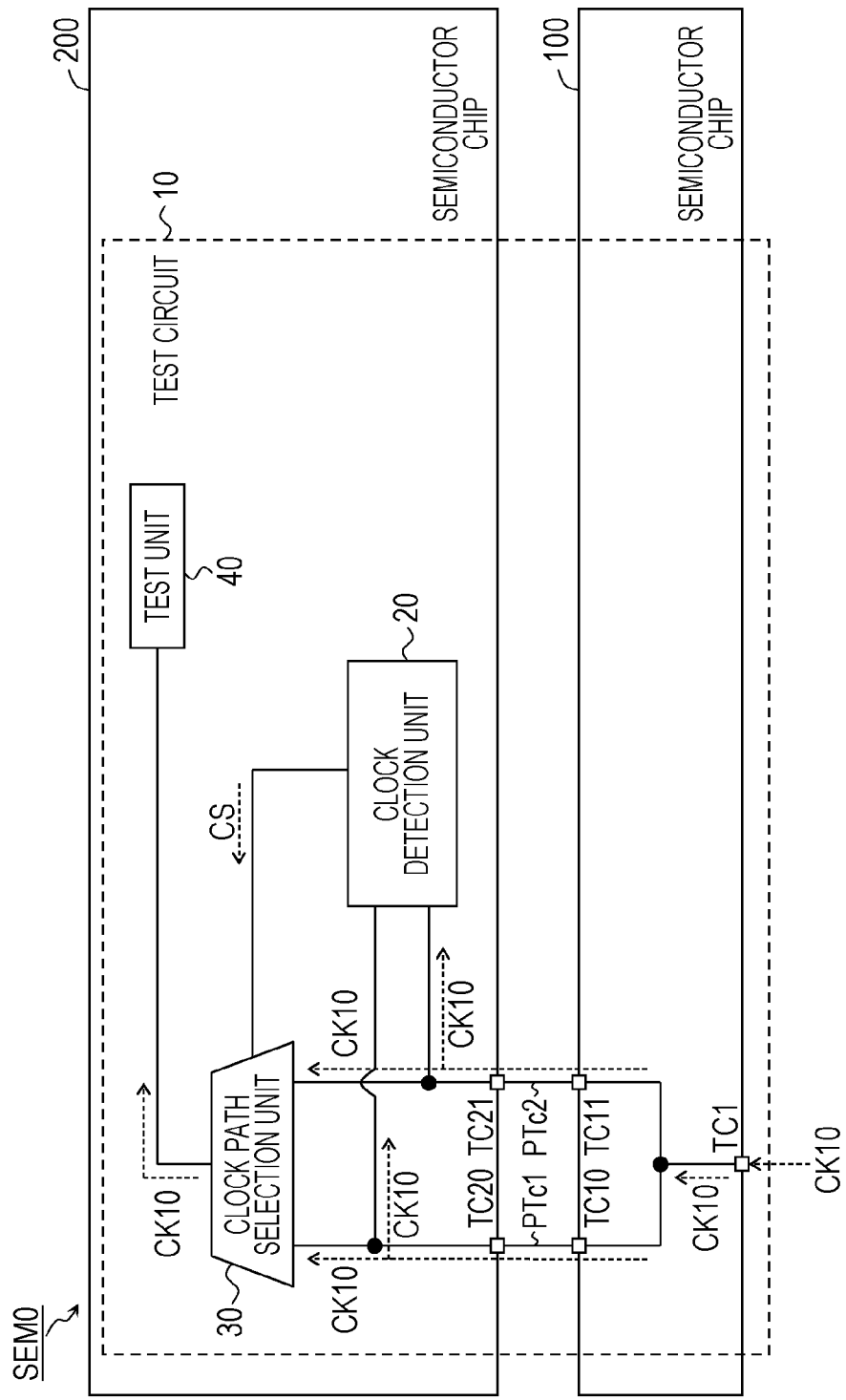
FIG. 1 is a diagram illustrating an embodiment of a test circuit and a method of controlling the test circuit.

Hereinafter, embodiments will be described with reference to the accompanying drawings. Broken line arrows illustrated in the drawings represents a signal flow.

FIG. 1 illustrates an embodiment of a test circuit and a method of controlling the test circuit. A test circuit 10 tests a semiconductor device SEM0 including a plurality of semiconductor chips 100 and 200. The semiconductor device SEM0 has a system in package (SiP) type in which the plurality of semiconductor chips 100 and 200 are stored in a single package. For example, the plurality of semiconductor chips 100 and 200 are stacked and disposed in the SiP. Input/output (I/O) terminals of the plurality of semiconductor chips 100 and 200 are joined to each other by a bump such as a microbump, and the like.

The semiconductor device SEM0 includes a test circuit 10 that is disposed across the plurality of semiconductor chips 100 and 200. The test circuit 10 includes terminals TC1, TC10, TC11, TC20, and TC21, a clock detection unit 20, a clock path selection unit 30, and a test unit 40.

The terminal TC1 a test clock terminal that receives from a test clock CK10 (for example, the test clock Ck10 that is used in the test unit 40 of the semiconductor chip 200), which is used during test of the semiconductor device SEM0, from an outer side of the semiconductor device SEM0.

The test clock terminal TC1 corresponds to an external terminal of the semiconductor device SEM0. For example, the test clock terminal TC1 is disposed on a front surface (surface on which a logic circuit realizing a function of the semiconductor chip 100 is formed) of the semiconductor chip 100. The terminals TC10 and TC11 are disposed on a rear surface of the semiconductor chip 100. A test clock CK10 that is received by the test clock terminal TC1 is transmitted to the terminal TC10 and TC11 through a through-electrode that passes through a substrate of the semiconductor chip 100, and the like. The terminals TC20 and TC21 are disposed on a surface of the semiconductor chip 200, and are connected to the terminals TC10 and TC11, respectively, through a bump and the like.

A signal path PTc1 between the terminals TC10 and TC20, a signal path PTc2 between the terminals TC11 and TC21 are signal paths for a test clock, through which the test clock CK10 that is received by the test clock terminal TC1, is transmitted. Hereinafter, the signal path (signal path PTc1 or the like) for the test clock is also referred to as a clock path.

The clock paths PTc1 and PTc2 are disposed between the semiconductor chip 100 and the semiconductor chip 200, and transmits the test clock CK10 received by the test clock terminal TC1 from the semiconductor chip 100 and the semiconductor chip 200. As described above, the test circuit 10 includes a plurality of the clock paths PTc1 and PTc2 which transmits the test clock CK10 received by the test clock terminal TC1 in a redundant manner.

The clock detection unit 20 is provided to the semiconductor chip 200, and detects the test clock CK10 that is received through each of a plurality of the clock paths PTc1 and PTc2. For example, the clock detection unit 20 detects the test clock CK10, of which the number of clocks reaches a predetermined number for the first time, among the test clocks CK10 which are received through the plurality of clock paths PTc1 and PTc2, respectively.

The clock detection unit 20 is connected to the semiconductor chip 100 through the plurality of clock paths PTc1 and PTc2. The clock detection unit 20 receives the test clock CK10, which is received by the semiconductor device SEM0, through the semiconductor chip 100 and the plurality of clock paths PTc1 and PTc2, and outputs a clock selection signal CS to the clock path selection unit 30.

For example, the test device that tests the semiconductor device SEM0 supplies the test clock CK10 to the test clock terminal TC1. According to this, the test clock CK10 is transmitted from the test clock terminal TC1 to the clock detection unit 20 through the plurality of clock paths PTc1 and PTc2. In addition, the clock detection unit 20 counts the number of clocks of the test clock CK10 that is received through each of the clock paths PTc1 and PTc2, and generates a clock selection signal CS based on the number of clocks counted.

For example, in a case where a failure (for example, opening at the microbump) in which the clock path PTc2 between the plurality of clock paths PTc1 and PTc2 enters an open state occurs, the test clock CK10 transmitted to the terminal TC11 is not transmitted to the terminal TC21. Accordingly, the number of clocks of a signal, which is transmitted from the terminal TC21 to the clock detection unit 20, does not reach a predetermined number. In addition, the test clock CK10, which is transmitted to the terminal TC10, is transmitted to the clock detection unit 20 through the clock path PTc1 and the terminal TC20.

Accordingly, when the test device continuously supplies the test clock CK10 to the test clock terminal TC1, the number of clocks of the test clock CK10, which is transmitted from the terminal TC20 to the clock detection unit 20, reaches a predetermined number. In addition, in a case where the number of clocks of the test clock CK10, which is received through the clock path PTc1, reaches a predetermined number, the clock detection unit 20 generates a clock selection signal CS that represents the clock path PTc1.

Similarly, in a case where a failure (for example, opening at the microbump) in which the clock path PTc1 between the plurality of clock paths PTc1 and PTc2 enters an open state occurs, the test clock CK10 transmitted to the terminal TC10 is not transmitted to the terminal TC20. Accordingly, in a case where the number of clocks of the test clock CK10, which is received through the clock path PTc2, reaches a predetermined number, the clock detection unit 20 generates a clock selection signal CS that represents the clock path PTc2.

In addition, in a case where a failure does not occur in all of the plurality of clock path PTc1 and PTc2, the test clock CK10, which are respectively transmitted to the terminals TC10 and Tc11, are transmitted to the terminal TC20 and the terminal TC21, respectively. In this case, the clock detection unit 20 generates a clock selection signal CS that represents any one side of the clock paths PTc1 and PTc2. For example, the clock detection unit 20 generates a clock selection signal CS that represents a clock path PTc, through which a test clock CK10 of which the number of clocks reaches a predetermined number in advance is transmitted, among the test clocks CK10 received through the clock paths PTc1 and PTc2. Hereinafter, the clock path PTc, through which the test clock CK10 of which the number of clocks reaches a predetermined number is transmitted, is also referred to as a clock path PTc through which a predetermined number of clocks are transmitted.

As described above, in a case where the number of clock of the test clock CK10, which is received through any one of the plurality of clock paths PTc1 and PTc2, reaches a predetermined number, the clock detection unit 20 generates a clock selection signal CS that represents a clock path PTc through which a predetermined number of clocks are transmitted. That is, the clock detection unit 20 determines the clock path PTc, through which the predetermined number of clocks are transmitted, as a normal clock path PTc.

In addition, detection of the test clock CK10 may be realized by a method other than the method of detecting that the number of clocks of the test clock CK10 reaches a predetermined number. For example, the clock detection unit 20 delays the test clock CK10, which is received through the clock path PTc1, by one fourth of a cycle of the test clock CK10, and generates a delay clock. In addition, in a case where a level of the test clock CK10 during beginning of the delay clock is a high logic level, the clock detection unit 20 may determines that a normal test clock Ck10 is received through the clock path PTc1. Similarly, the clock detection unit 20 delays the test clock CK10, which is received through the clock path PTc2, by one fourth of the cycle of the test clock CK10, and generates a delay clock. In addition, in a case where a level of the test clock CK10 during beginning of the delay clock is a high logic level, the clock detection unit 20 may determine that a normal test clock CK10 is received through the clock path PTc2.

The clock path selection unit 30 is provided to the semiconductor chip 200 including the clock detection unit 20, and is connected to the plurality of clock paths PTc1 and PTc2. In addition, the clock path selection unit 30 selects a clock path PTc, which is used during test of the semiconductor device SEM0, between the plurality of clock paths PTc1 and PTc2 based on the clock selection signal CS. For example, in a case where a failure occurs in the clock path PTc2 among the plurality of clock paths PTc1 and PTc2, the clock path selection unit 30 receives a clock selection signal CS that represents the clock path PTc1 from the clock detection unit 20.

In this case, the clock path selection unit 30 selects the clock path PTc1, which is represented by the clock selection signal CS, between the plurality of clock paths PTc1 and PTc2 as a clock path PTc between the test unit 40 of the semiconductor chip 200 and another semiconductor chip 100. That is, the clock path selection unit 30 transmits the test clock CK10, which is received from the test clock terminal TC1 through the clock path PTc1, to the test unit 40 of the semiconductor chip 200.

As described above, the clock path selection unit 30 is provided to the semiconductor chip 200, and selects the clock path PTc, through which the test clock CK10 detected by the clock detection unit 20 is transmitted, between the plurality of clock paths PTc1 and PTc2 as a test clock path. In addition, the clock path selection unit 30 supplies the test clock CK10, which is transmitted through the test clock path, to the test unit 40 during test of the semiconductor chip 200.

The test unit 40 is provided to the semiconductor chip 200, and tests the semiconductor chip 200 by using the test clock CK10 that is transmitted to the semiconductor chip 200. For example, the test unit 40 includes a scan flip-flop (a flip-flop circuit corresponding to a scan test) that operates in synchronization with the test clock CK10. The scan flip-flop, which is included in the test unit 40 of the semiconductor chip 200, operates in synchronization with the test clock CK10 that is transmitted from the clock path selection unit 30, and tests the semiconductor chip 200.

According to this, even in a case where one of the clock paths PTc1 and PTc2, through which the test clock Ck10 received by the test clock terminal TC1 is transmitted, fails, the test circuit 10 can carry out a test for detecting a failure site in the signal path between the semiconductor chips 100 and 200. As a result, it is possible to retrieve the failure by bypassing the failure site in the signal path between the semiconductor chips 100 and 200.

For example, a test device for testing the semiconductor device SEM0 supplies the test clock CK10 to the test clock terminal TC1. In addition, after the clock path selection unit 30 selects the clock path PTc (the clock path PTc1 or the clock path PTc2) that is used during test of the semiconductor device SEM0, the test device supplies test data to a test input terminal (not illustrated) of the semiconductor device SEM0. The test data is data that is used to test the semiconductor device SEM0. The test circuit 10 carries out a test for detecting a failure site in the signal path between the semiconductor chips 100 and 200 by using the test data that is received from the test input terminal.

For example, the test circuit 10, which receives the test data from the test device, sets the test data in the scan flip-flop that is included in the test unit 40 of the semiconductor chip 200 through a scan chain, and the like. In addition, the test circuit 10 transmits the test data from the scan flip-flop that is included in the test unit 40 of the semiconductor chip 200 to a scan flip-flop that is included in a test unit (not illustrated) of the semiconductor chip 100. According to this, the test data is retained in the scan flip-flop that is included in the test unit of the semiconductor chip 100. In addition, the test circuit 10 outputs the test data, which is retained in the scan flip-flop that is included in the test unit of the semiconductor chip 100, to the test device through the scan chain, and the like. The test device detects a failure site in the signal path between the semiconductor chips 100 and 200 based on the data that is received from the test circuit 10. As described above, the test unit 40 tests the semiconductor device SEM0.

In addition, the configuration of the test circuit 10 is not limited to an example illustrated in FIG. 1. For example, the clock path PTc (PTc1 and PTC2), through which the test clock CK10 received by the test clock terminal TC1 is transmitted, may be made redundant with three or more clock paths PTc. In addition, for example, the test circuit 10 may be embedded in a semiconductor device SEM0 in which three semiconductor chips are stacked. In this case, the clock detection unit 20 and the clock path selection unit 30 may be provided to two semiconductor chips among the three semiconductor chips. Alternatively, the test circuit 10 may be embedded in a semiconductor device SEM0 in which four or more semiconductor chips are stacked. For example, the clock detection unit 20 and the clock path selection unit 30 is provided to at least one of a plurality of semiconductor chips, and is connected to other semiconductor chips through a plurality of clock paths PTc1 and PTc2.

As described above, in the embodiment illustrated in FIG. 1, even when one of the clock paths PTc1 and PTc2, through which the test clock CK10 received by the test clock terminal TC1 is transmitted, fails, it is possible to carry out a test for detecting a failure site in the signal path between the semiconductor chips 100 and 200. According to this, it is possible to retrieve the failure by bypassing the failure site in the signal path between the semiconductor chips 100 and 200. As a result, in this embodiment, it is possible to improve a yield ratio of the semiconductor device SEM0. Accordingly, in this embodiment, it is possible to reduce the manufacturing cost of the semiconductor device SEM0.

Figure 2:
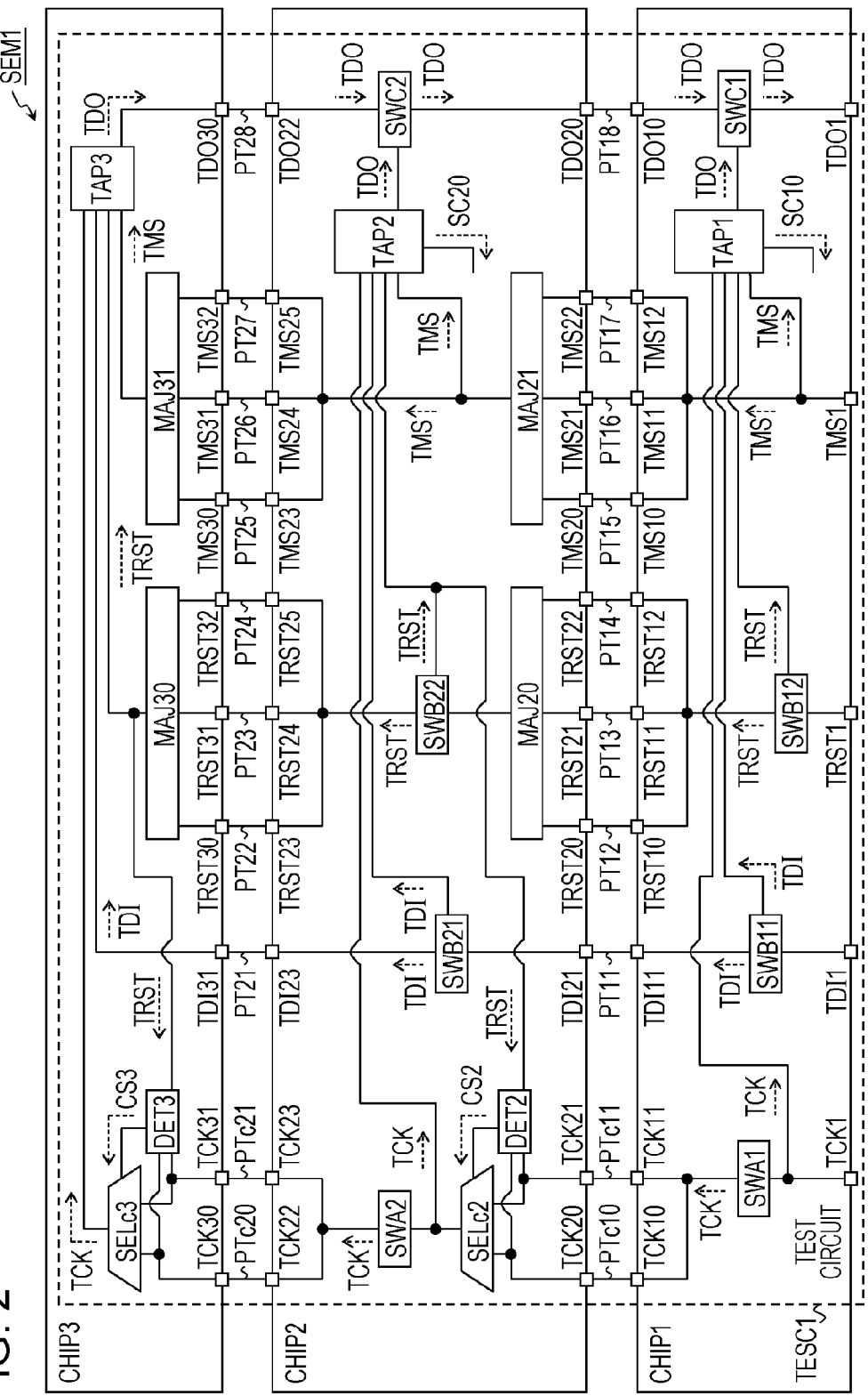
FIG. 2 is a diagram illustrating another embodiment of the test circuit and the method of controlling the test circuit.

FIG. 2 illustrates another embodiment of the test circuit and the method of controlling the test circuit. The same or similar symbols will be given to elements which are the same as or similar to those illustrated in FIG. 1, and details description thereof will not be repeated. A test circuit TESC1 tests a semiconductor device SEM1 including a plurality of semiconductor chips CHIP (CHIP1, CHIP2, and CHIP3). The semiconductor device SEM1 has a type of SiP in which the plurality of semiconductor chips CHIP is stored in a single package. For example, the plurality of semiconductor chips CHIP are stacked and disposed in the SiP.

I/O terminals of the plurality of semiconductor chips CHIP are joined to each other by a bump such a microbump. A terminal that is disposed on a rear surface of the semiconductor chip CHIP1 is joined to a terminal that is disposed on a front surface of the semiconductor chip CHIP2 by a bump. In addition, a terminal that is disposed on a rear surface of the semiconductor chip CHIP2 is joined to a terminal that is disposed on a front surface of the semiconductor chip CHIP3 by a bump.

In addition, the front surface of each of the semiconductor chips CHIP is a surface on which a logic circuit realizing a function of the semiconductor chip CHIP is formed. In addition, the terminal that is disposed on the rear surface of each of the semiconductor chips CHIP is connected to a circuit and the like in the semiconductor chip CHIP through a through-electrode that passes through a substrate of the semiconductor chip CHIP, and the like.

The semiconductor device SEM1 corresponds to a test method that is standardized by Joint Test Action Group (JTAG) as IEEE1149.1. Hereinafter, IEEE1149.1 is also referred to as JTAG. For example, the semiconductor device SEM1 are provided with interface signal terminals TCK (Test Clock), TMS (Test Mode Select), TRST (Test Reset), TDI (Test Data In), and TDO (Test Data Out) which are called TAP (Test Access Port).

The test circuit TESC1 includes a clock detection unit DET (DET2, DET3), a clock path selection unit SELc (SELc2, SELc3), a test unit TAP (TAP1, TAP2, TAP3), a majority decision selection unit MAJ (MAJ20, MAJ21, MAJ30, MAJ31). In addition, the test circuit TESC1 includes a clock transmission switching unit SWA (SWA1, SWA2), a transmission destination switching unit SWB (SWB11, SWB12, SWB21, SWB22), and a transmission data switching unit SWC (SWC1, SWC2). Hereinafter, the clock transmission switching unit SWA, the transmission destination switching unit SWB, and the transmission data switching unit SWC are also referred to as switching units SWA, SWB, and SWC, respectively.

In addition, the test circuit TESC1 includes terminals TDI, TDO, TCK, TMS, and TRST which are provided to each of the semiconductor chips CHIP.

The terminal TCK1 is a test clock terminal that receives a test clock TCK for test (hereinafter, also referred to as a signal TCK) from an outer side of the semiconductor device SEM1.

A terminal TDI1 is a test data input terminal that receives the data TDI for test of the semiconductor device SEM1 (for example, data that is scanned in to each of the semiconductor chips CHIP) from an outer side of the semiconductor device SEM1. Hereinafter, the test data input terminal is also referred to as a test input terminal.

A terminal TRST1 is a test reset terminal that receives a signal TRST (hereinafter, also referred to as a test reset TRST), which resets a state of the test unit TAP, from an outer side of the semiconductor device SEM1.

A terminal TMS1 is a test mode select terminal that receives a signal TMS (hereinafter, also referred to as a test mode select TMS), which selects a test mode, from an outer side of the semiconductor device SEM1. A terminal TDO1 is a test output terminal that outputs data TDO corresponding to a test result of each of the semiconductor chips CHIP (for example, data that scanned out from the semiconductor chip CHIP) to an outer side of the semiconductor device SEM1. Hereinafter, the two pieces of data TDI and TDO are also referred to as signals TDI and TDO.

That is, the test clock terminal TCK1, the test input terminal TDI1, the test reset terminal TRST1, the test mode select terminal TMS1, and the test output terminal TDO1 correspond to external terminals of the semiconductor device SEM1. The test clock terminal TCK1, the test input terminal TDI1, the test reset terminal TRST1, the test mode select terminal TMS1, and the test output terminal TDO1 are disposed on a front surface of the semiconductor chip CHIP1.

Terminals TCK10, TCK11, TDI11, TRST 10, TRST11, TRST12, TMS10, TMS11, TMS12, and TDO10 are disposed on a rear surface of the semiconductor chip CHIP1. Terminals TCK20, TCK21, TDI21, TRST20, TRST21, TRST22, TMS20, TMS21, TMS22, and TDO20 are disposed on a front surface of the semiconductor chip CHIP2.

The terminals TCK20, TCK21, TDI21, TRST20, TRST21, and TRST22 are connected to the terminals TCK10, TCK11, TDI11, TRST10, TRST11, and TRST12, respectively, through a bump and the like. In addition, the terminals TMS20, TMS21, TMS22, and TDO20 are connected to the terminals TMS10, TMS11, TMS12, and TDO10, respectively, through a bump and the like.

Terminals TCK22, TCK23, TDI23, TRST23, TRST24, TRST25, TMS23, TMS24, TMS25, and TDO22 are disposed on a rear surface of the semiconductor chip CHIP2.

Terminals TCK30, TCK31, TDI31, TRST30, TRST31, TRST32, TMS30, TMS31, TMS32, and TDO30 are disposed on a front surface of the semiconductor chip CHIP3.

The terminals TCK30, TCK31, TDI31, TRST30, TRST31, and TRST32 are connected to the terminals TCK22, TCK23, TDI23, TRST23, TRST24, and TRST25, respectively, through a bump and the like. In addition, the terminals TMS30, TMS31, TMS32, and TDO30 are connected to the terminals TMS23, TMS24, TMS25, and TDO22, respectively, through a bump and the like.

In addition, signal paths PTc10 and PTc11 between the semiconductor chips CHIP1 and CHIP2, and signal paths PTc20 and PTc21 between the semiconductor chips CHIP2 and CHIP3 are signal paths for a test clock through which the test clock TCK for test is transmitted. In addition, signal paths PT11 to PT18 between the semiconductor chips CHIP1 and CHIP2, and signal paths PT21 to PT28 between the semiconductor chips CHIP2 and CHIP3 are signal paths for test through which a signal for test (an interface signal such as data TDI) is transmitted. Hereinafter, the signal path for test (signal path PT11 or the like) is also referred to as a test path.

For example, the signal path PTc10 between the terminals TCK10 and TCK20, and the signal path PTc11 between the terminals TCK11 and TCK21 are clock paths between the semiconductor chips CHIP1 and CHIP2 through which the test clock TCK received by the test clock terminal TCK1 is transmitted. In addition, the signal path PTc20 between the terminals TCK22 and TCK30, and the signal path PTc21 between the terminals TCK23 and TCK31 are clock paths between the semiconductor chips CHIP2 and CHIP3 through which the test clock TCK received by the test clock terminal TCK1 is transmitted. As described above, the test circuit TESC1 includes a plurality of the clock paths PTc10, PTc11, PTc20, and PTc21 through which the test clock TCK received by the test clock terminal TCK1 is redundantly transmitted.

Hereinafter, description will be given of each functional block such as the clock transmission switching unit SWA in the test circuit TESC1 for each of the semiconductor chips CHIP1, CHIP2, and CHIP3. First, description will be given of each functional block of the test circuit TESC1 that is included in the semiconductor chip CHIP1.

The semiconductor chip CHIP1 includes the clock transmission switching unit SWA1, the transmission destination switching units SWB11 and SWB12, and the transmission data switching unit SWC1, and the test unit TAP1 as a part of the test circuit TESC1. The switching units SWA1, SWB11, SWB12, and SWC1 are controlled, for example, by a control signal SC10 that is output from the test unit TAP. In addition, in FIG. 2, description of a signal line between the switching units SWA1, SWB11, SWB12, and SWC1, and the test unit TAP1 is omitted for easy comprehension of the drawing.

The clock transmission switching unit SWA1 is set to either a passing state or a non-passing state based on the control signal SC10 that is received from the test unit TAP1. In the passing state, the test clock TCK that is received by the clock transmission switching unit SWA is transmitted to another semiconductor chip CHIP through the clock path PTc. In the non-passing state, the test clock TCK that is received by the clock transmission switching unit SWA is not transmitted to another semiconductor chip CHIP.

That is, in a case where the passing state is set by the control signal SC10, the clock transmission switching unit SWA1 transmits the test clock TCK received from the test clock terminal TCK1 to the semiconductor chip CHIP2 through the clock paths PTc10 and PTc11, and the like. According to this, the test clock TCK, which is supplied to the test clock terminal TCK1, is transmitted to the clock detection unit DET2 and the clock path selection unit SELc2 of the semiconductor chip CHIP2 through a plurality of the clock paths PTc10 and PTc11. In addition, in a case where the non-passing state is set by the control signal SC10, the clock transmission switching unit SWA1 does not transmit the test clock TCK, which is transmitted from the test clock terminal TCK1, to the semiconductor chip CHIP2.

For example, the clock transmission switching unit SWA1 is realized by an AND circuit that outputs an AND operation result between the control signal SC10 and the test clock TCK transmitted from the test clock terminal TCK1. In addition, the clock transmission switching unit SWA1 may be realized by a two to one selector (one output selector with two inputs) which selects one of two inputs based on the control signal SC10. In this case, one of two input terminals of the two to one selector receives the test clock TCK from the test clock terminal TCK1, and the other of the two input terminals of the two to one selector is fixed to a logical value "1" or a logical value "0".

The transmission destination switching units SWB11 and SWB12 are set to either an internal transmission state or a passing state based on the control signal SC10 that is received from the test unit TAP1. In the internal transmission state, a signal (data TDI in the transmission destination switching unit SWB11), which is received by the transmission destination switching unit SWB, is transmitted to the test unit TAP of the semiconductor chip CHIP itself. In addition, in the passing state, the signal (data TDI in the transmission destination switching unit SWB11), which is received by the transmission destination switching unit SWB, is transmitted to another semiconductor chip CHIP.

Figure 4:
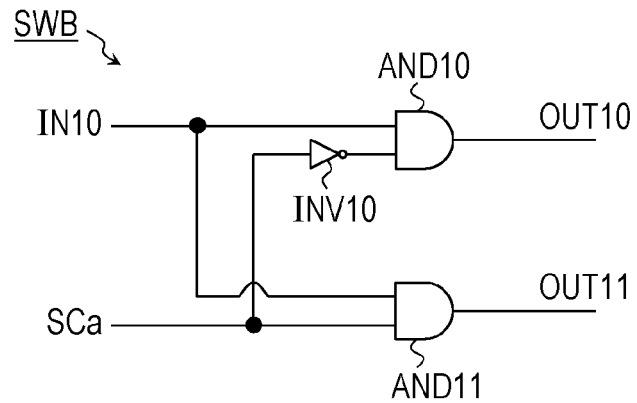
FIG. 4 is a diagram illustrating an example of a transmission destination switching unit illustrated in FIG. 2.

An input terminal (for example, a terminal IN10 illustrated in FIG. 4) of the transmission destination switching unit SWB11 is connected to the test input terminal TDI1. One of two output terminals of the transmission destination switching unit SWB11 is connected to the terminal TDI11, and the other of the two output terminals of the transmission destination switching unit SWB11 is connected to the test unit TAP1. In addition, the two output terminals of the transmission destination switching unit SWB11 is, for example, terminals OUT10 and OUT11 which are illustrated in FIG. 4. In addition, the transmission destination switching unit SWB11 receives the control signal SC10 from the test unit TAP1 by a terminal SCa illustrated in FIG. 4.

For example, in a case where the internal transmission state is set by the control signal SC10, the transmission destination switching unit SWB11 transmits data TDI, which is transmitted from the test input terminal TDI1, to the test unit TAP of the semiconductor chip CHIP1. In addition, in a case where the passing state is set by the control signal SC10, the transmission destination switching unit SWB11 transmits the data TDI, which is transmitted from the test input terminal TDI1, to the semiconductor chip CHIP2 through the signal path PT11 and the like.

An input terminal of the transmission destination switching unit SWB12 is connected to the test reset terminal TRST1. In addition, one of two output terminals of the transmission destination switching unit SWB12 is connected to the terminals TRST10, TRST11, and TRST 12, and the other of the two output terminals of the transmission destination switching unit SWB12 is connected to the test unit TAP1.

Accordingly, in a case where the transmission destination switching unit SWB of the semiconductor chip CHIP1 is set to the internal transmission state, the test unit TAP1 of the semiconductor chip CHIP1 receives the signal TDI and TRST from the terminals TDI1 and TRST1. In addition, since the terminal TCK1 is connected to the test unit TAP1, the signal TCK is transmitted to the test unit TAP1 regardless of the state of the switching unit SWA1.

In addition, in a case where the switching units SWA and SWB of the semiconductor chip CHIP1 is set to the passing state, the signals TCK, TDI, and TRST, which are received by the terminals TCK1, TDI1, and TRST1, are transmitted to the semiconductor chip CHIP2. Here, since the terminal TMS1 is connected to the terminals TMS10, TMS11, and TMS12, and the test unit TAP1, the signal TMS is transmitted to the test unit TAP1 and the semiconductor chip CHIP2.

The test unit TAP1 carries out a test corresponding to JTAG. For example, the test unit TAP1 includes a TAP controller, an instruction register, a data register, and the like. The TAP controller in the test unit TAP1 is a synchronization type state machine that is controlled by the signals TCK, TMS, and TRST. For example, the TAP controller generates a control signal (for example, a drive clock) of the instruction register, the data register, and the like based on the signals TCK, TMS, and TRST.

In addition, the state of the control signal SC10 is controlled by a state transition (mode) of the TAP controller. The state of the control signal SC10 may be allocated in a plurality of modes of the TAP controller.

The instruction register in the test unit TAP1 is used, for example, for selection of a data register that is subjected to a scan operation. For example, the instruction register receives data TDI that represents a command code and the like, and a control signal from the TAP controller. According to this, the command code is set to the instruction register. In addition, for example, the data TDI that represents the command code and the like is supplied from a test device that tests the semiconductor device SEM1 to the test input terminal TDI1.

Examples of the data register in the test unit TAP1 include a boundary scan register, a bypass register, and the like. For example, the data register receives a control signal from the TAP controller, and the data TDI received by the test input terminal TDI1, and retains the data TDI that is received. In addition, the data register transmits the data TDI that is retained to the test output terminal TDO1 as data TDO. As described above, the test unit TAP1 transmits the data TDO corresponding to a test result of the semiconductor device SEM1 to the test output terminal TDO1.

The transmission data switching unit SWC1 is set to either an internal transmission state or a passing state based on the control signal SC10 that is received from the test unit TAP1. In the internal transmission state, the transmission data switching unit SWC1 transmits data TDO, which is received from the test unit TAP1 of the semiconductor chip CHIP1, to the test output terminal TDO1. In addition, in the passing state, the transmission data switching unit SWC1 transmits the data TDO (data TDO transmitted from the test unit TAP2 or the test unit TAP3), which is received from the semiconductor chip CHIP2, to the test output terminal TDO1.

Figure 5:
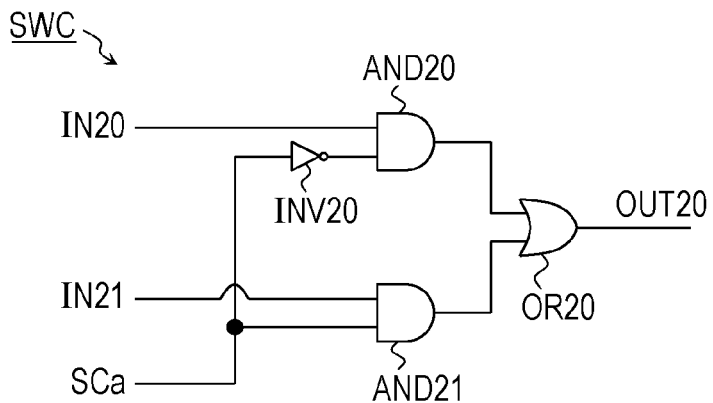
FIG. 5 is a diagram illustrating an example of a transmission data switching unit illustrated in FIG. 2.

One of two input terminals (for example, terminals IN20 and IN21 which are illustrated in FIG. 5) of the transmission data switching unit SWC1 is connected to the terminal TDO10, and the other of the two input terminals of the transmission data switching unit SWC1 is connected to the test unit TAP1. An output terminal (for example, a terminal OUT20 illustrated in FIG. 5) of the transmission data switching unit SWC1 is connected to the test output terminal TDO1. In addition, the transmission data switching unit SWC1 receives the control signal SC10 from the test unit TAP1 by a terminal SCa illustrated in FIG. 5.

For example, in a case where the internal transmission state is set by the control signal SC10, the transmission data switching unit SWC1 transmits the data TDO, which is transmitted from the test unit TAP1, to the test output terminal TDO1. In addition, in a case where the passing state is set by the control signal SC10, the transmission data switching unit SWC1 transmits the data TDO, which is transmitted from the semiconductor chip CHIP2, to the test output terminal TDO1.

Next, description will be given of each function block of the test circuit TESC1 that is included in the semiconductor chip CHIP2.

The semiconductor chip CHIP2 includes the clock transmission switching unit SWA2, the transmission destination switching units SWB21 and SWB22, and the transmission data switching unit SWC2, and the test unit TAP2 as a part of the test circuit TESC1. In addition, the semiconductor chip CHIP2 includes the clock detection unit DET2, the clock path selection unit SELc2, and the majority decision selection units MAJ20 and MAJ21 as a part of the test circuit TESC1.

Figure 3:
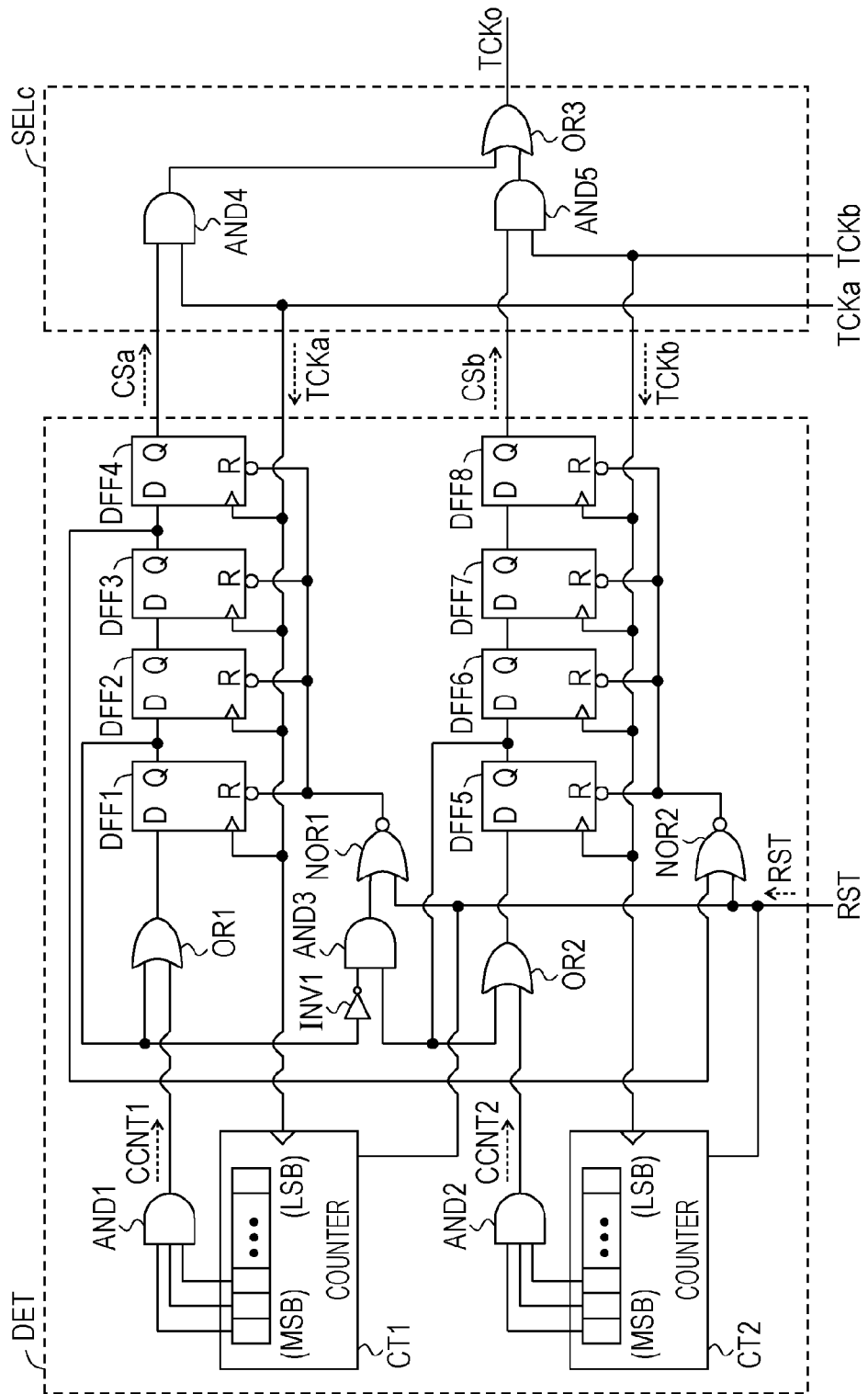
FIG. 3 is a diagram illustrating an example of a clock detection unit and a clock path selection unit which are illustrated in FIG. 2.

Two input terminals (for example, terminals TCKa and TCKb which are illustrated in FIG. 3) of the clock detection unit DET2 are connected to the terminals TCK20 and TCK21. That is, the clock detection unit DET2 of the semiconductor chip CHIP2 is connected to the terminals TCK10 and TCK11 of the semiconductor chip CHIP1 through the clock paths PTc10 and PTc11. An output terminal of the clock detection unit DET2 is collected to a control terminal of the clock path selection unit SELc2. A reset terminal (for example, a terminal RST illustrated in FIG. 3) of the clock detection unit DET2 is connected to one (output terminal connected to the test unit TAP2) of two output terminals of the transmission destination switching unit SWB22.

The clock detection unit DET2 receives the test clock TCK, which is received by the test clock terminal TCK1, through another semiconductor chip CHIP1 and a plurality of clock paths PTc10 and PTc11, and outputs the clock selection signal CS2 to the clock path selection unit SELc2. In addition, the clock detection unit DET2 receives the signal TRST from the transmission destination switching unit SWB22.

In a case where the number of clocks of the test clock TCK received from any one of the plurality of clock paths PTc10 and PTc11 reaches a predetermined number, the clock detection unit DET2 generates a clock selection signal CS2 that represents the clock path PTc through which the predetermined number of clocks are transmitted. In addition, the clock detection unit DET2 transmits the clock selection signal CS2, which is generated, to a control terminal of the clock path selection unit SELc2.

For example, in a case where a failure occurs in the clock path PTc10 between the plurality of clock paths PTc10 and PTc11, the clock detection unit DET2 receives the test clock TCK through the clock path PTc11. In addition, in a case where the number of clocks of the test clock TCK, which is received through the clock path PTc11, reaches a predetermined number, the clock detection unit DET2 generates a clock selection signal CS2 that represents the clock path PTc11 through which the predetermined number of clocks are transmitted.

As described above, the clock detection unit DET2 detects a test clock TCK, of which the number of clocks reaches a predetermined number for the first time, between test clocks TCK which are received through the plurality of clock paths PTc10 and PTc11. In addition, the clock detection unit DET2 generates the clock selection signal CS2 representing the clock path PTc through which the test clock TCK that is detected is transmitted.

Two input terminals of the clock path selection unit SELc2 are connected to the terminals TCK20 and TCK21, respectively. That is, the clock path selection unit SELc2 of the semiconductor chip CHIP2 is connected to the terminals TCK10 and TCk11 of the semiconductor chip CHIP1 through the clock paths PTc10 and PTc11. In addition, an output terminal of the clock path selection unit SELc2 is connected to the clock transmission switching unit SWA2 and the test unit TAP2.

The clock path selection unit SELc2 selects the clock path PTc, which is used during test of the semiconductor device SEM1, between the plurality of clock path PTc10 and PTc11, based on the clock selection signal CS2. For example, in a case where a failure occurs in the clock path PTc10 between the plurality of clock paths PTc10 and PTc11, the clock path selection unit SELc2 receives the clock selection signal CS2, which represents the clock path PTc11, from the clock detection unit DET2.

In this case, the clock path selection unit SELc2 selects the clock path PTc11, which is represented by the clock selection signal CS2, between the plurality of clock path PTc10 and PTc11, as the clock path PTc between the semiconductor chips CHIP1 and CHIP2. For example, the clock path selection unit SELc2 transmits the test clock TCK, which is received from the test clock terminal TCK1 through the clock path PTc11, to the clock transmission switching unit SWA2.

The clock transmission switching unit SWA2 is the same as or similar to the clock transmission switching unit SWA1 of the semiconductor chip CHIP1. An input terminal of the clock transmission switching unit SWA2 is connected to an output terminal of the clock path selection unit SELc2. An output terminal of the clock transmission switching unit SWA2 is connected to the terminals TCK22 and TCK23.

For example, the clock transmission switching unit SWA2, which is set to the passing state, transmits the test clock TCK transmitted from the clock path selection unit SELc2, to the semiconductor chip CHIP3 through the clock paths PTc20 and PTc21, and the like. According to this, the clock detection unit DET3 and the clock path selection unit SELc3 in the semiconductor chip CHIP3 receives the test clock TCK that is transmitted from the semiconductor chip CHIP2 through the clock paths PTc20 and PTc21, respectively. In addition, the clock transmission switching unit SWA2, which is set to the non-passing state, does not transmit the test clock TCK, which is received from the clock path selection unit SELc2, to the semiconductor chip CHIP3.

The transmission destination switching units SWB21 and SWB22 are the same as or similar to the transmission destination switching units SWB11 and SWB12 of the semiconductor chip CHIP1. An input terminal of the transmission destination switching unit SWB21 is connected to the terminal TDI21. In addition, one of two output terminals of the transmission destination switching unit SWB21 is connected to the terminal TDI23, and the other of the two output terminals of the transmission destination switching unit SWB21 is connected to the test unit TAP2.

For example, the transmission destination switching unit SWB21, which is set to the internal transmission state, transmits the data TDI transmitted from the terminal TDI21 to the test unit TAP2 of the semiconductor chip CHIP2. In addition, the transmission destination switching unit SWB21, which is set to the passing state, transmits the data TDI transmitted from the terminal TDI21 to the semiconductor chip CHIP3 through the signal path PT21 and the like.

An input terminal of the transmission destination switching unit SWB22 is connected to an output terminal of the majority decision selection unit MAJ20. In addition, one of two output terminals of the transmission destination switching unit SWB22 is connected to the terminals TRST23, TRST24, and TRST25, and the other of the two output terminals of the transmission destination switching unit SWB22 is connected to the test unit TAP2.

For example, the majority decision selection units MAJ20 and MAJ21 output a signal of the same logical value as a logical value, which occupies the half or greater, among logical values of three signals which are received by three input terminals. The three input terminals of the majority decision selection unit MAJ20 are connected to the terminals TRST20, TRST21, and TRST22, respectively, and an output terminal of the majority decision selection unit MAJ20 is connected to an input terminal of the transmission destination switching unit SWB22.

For example, in a case where the signal path PT12 among the plurality of signal paths PT12, PT13, and PT14 fails, a logical value of a signal, which is transmitted from the signal paths PT13 and PT14, occupies the half of a logical value of a signal that is transmitted from the signal paths PT12, PT13, and PT14. In this case, the majority decision selection unit MAJ20 outputs a signal TRST of the same logical value as the signal TRST, which is transmitted from the signal paths PT13 and PT14, to the transmission destination switching unit SWB22. Accordingly, even in a case where one of the signal paths PT12, PT13, and PT14 fails, the semiconductor device SEM1 can transmit the signal TRST from the semiconductor chip CHIP1 to the semiconductor chip CHIP2.

The three input terminals of the majority decision selection unit MAJ21 are connected to the terminals TMS20, TMS21, and TMS22, respectively, and an output terminal of the majority decision selection unit MAJ21 is connected to the terminals TMS23, TMS 24, and TMS25, and the test unit TAP2. For example, in a case where the signal path PT15 among the plurality of signal paths PT15, PT16, and PT17 fails, the majority decision selection unit MAJ21 outputs a signal TMS of the same logical value as the signal TMS, which is transmitted from the signal path PT16 and PT17, to the test unit TAP2 and the like. Accordingly, even in a case where one of the signal path PT15, PT16, and PT17 fails, the semiconductor device SEM1 can transmit the signal TMS from the semiconductor chip CHIP1 to the semiconductor chip CHIP2.

The transmission data switching unit SWC2 and the test unit TAP2 are the same as or similar to the transmission data switching unit SWC1 and the test unit TAP1 of the semiconductor chip CHIP1. One of two input terminals of the transmission data switching unit SWC2 is connected to the terminal TDO22, and the other of the two input terminals of the transmission data switching unit SWC2 is connected to the test unit TAP2. In addition, an output terminal of the transmission data switching unit SWC2 is connected to the terminal TDO20.

For example, the clock transmission switching units SWA of the semiconductor chips CHIP1 and CHIP2 are set to the passing state and the non-passing state, respectively, the test clock TCK is transmitted from the test clock terminal TCK1 to the test unit TAP2 of the semiconductor chip CHIP2. In addition, in a case where the transmission destination switching units SWB of the semiconductor chips CHIP1 and CHIP2 are set to the passing state and the internal transmission state, respectively, the signals TDI and TRST, which are received from the terminals TDI1 and TRST1, are transmitted to the test unit TAP of the semiconductor chip CHIP2.

In addition, in a case where the clock transmission switching units SWA of the semiconductor chips CHIP1 and CHIP2 are set to the passing state, the test clock TCK, which is received from the test clock terminal TCK1, is transmitted to the semiconductor chip CHIP3. In addition, in a case where the transmission destination switching units SWB of the semiconductor chips CHIP1 and CHIP2 are set to the passing state, the signals TDI and TRST, which are received from the terminals TDI1 and TRST1, are transmitted to the semiconductor chip CHIP3.

In addition, the transmission data switching units SWC of the semiconductor chips CHIP1 and CHIP2 are set to the passing state and the internal transmission state, respectively, the data TDO, which is transmitted from the test unit TAP2 of the semiconductor chip CHIP2, is transmitted to the test output terminal TDO1. In addition, in a case where transmission data switching units SWC of both of the semiconductor chips CHIP1 and CHIP2 are set to the passing state, the data TDO, which is transmitted from the test unit TAP3 of the semiconductor chip CHIP3, is transmitted to the test output terminal TDO1.

Next, description will be given of each functional block of the test circuit TESC1 that is included in the semiconductor chip CHIP3.

The semiconductor chip CHIP3 includes the clock detection unit DET3, the clock path selection unit SELc3, the majority decision selection units MAJ30 and MAJ31, and the test unit TAP3 as a part of the test circuit TESC1. The clock detection unit DET3, the clock path selection unit SELc3, and the majority decision selection units MAJ30 and MAJ31 are the same as or similar to the clock detection unit DET2, the clock path selection unit SELc2, and the majority decision selection units MAJ20 and MAJ21 of the semiconductor chip CHIP2. In addition, the test unit TAP3 is the same as or similar to the test unit TAP2 of the semiconductor chip CHIP2.

Two input terminals of the clock detection unit DET3 are connected to the terminals TCK30 and TCK31, respectively. That is, the clock detection unit DET3 of the semiconductor chip CHIP3 is connected to the terminals TCK22 and TCK23 of the semiconductor chip CHIP2 through the clock paths PTc20 and PTc21. An output terminal of the clock detection unit DET3 is connected to a control terminal of the clock path selection unit SELc3. In addition, a reset terminal of the clock detection unit DET3 is connected to an output terminal of the majority decision selection unit MAJ30.

Two input terminals of the clock path selection unit SELc3 are connected to the terminals TCK30 and TCK31, respectively. That is, the clock path selection unit SELc3 of the semiconductor chip CHIP3 is connected to the terminals TCK22 and TCK23 of the semiconductor chip CHIP2 through the clock path PTc20 and PTc21. In addition, an output terminal of the clock path selection unit SELc3 is connected to the test unit TAP3.

Three input terminals of the majority decision selection unit MAJ30 are connected to the terminals TRST30, TRST31, and TRST32, respectively, and an output terminal of the majority decision selection unit MAJ30 is connected to the test unit TAP3 and the clock detection unit DET3. Three input terminals of the majority decision selection unit MAJ31 are connected to the terminals TMS30, TMS31, and TMS32, respectively, and an output terminal of the majority decision selection unit MAJ31 is connected to the test unit TAP3.

The test unit TAP3 outputs data TDO to the terminal TDO30. In a case where transmission data switching units SWC of both of the semiconductor chips CHIP1 and CHIP2 are set to the passing state, the data TDO, which is output from the test unit TAP3 of the semiconductor chip CHIP3, is transmitted to the test output terminal TDO1.

In a case where the clock transmission switching units SWA of the semiconductor chips CHIP1 and CHIP2 are set to the passing state, the test clock TCK, which is received by the test clock terminal TCK1, is transmitted to the test unit TAP3 of the semiconductor chip CHIP3. In addition, in a case where the transmission destination switching units SWB of the semiconductor chips CHIP1 and CHIP2 are set to the passing state, the signals TDI and TRST, which are received by the terminals TDI1 and TRST1, is transmitted to the test unit TAP3 of the semiconductor chip CHIP3.

In addition, the configuration of the test circuit TESC1 is not limited to the example illustrated in FIG. 2. For example, the test circuit TESC1 may include a transmission destination switching unit SWB that transmits the signal TMS to either another semiconductor chip CHIP or the test unit TAP of the semiconductor chip CHIP itself. In addition, the clock transmission switching unit SWA may be omitted. In this case, for example, a reset signal (for example, a signal received by a terminal RST illustrated in FIG. 3), which resets a state of the clock detection unit DET2, is transmitted from the test unit TAP1 of the semiconductor chip CHIP1 (lower chip) to the semiconductor chip CHIP2 (upper chip).

In addition, for example, the clock path PTc (PTc10, PTc11, and the like), through which the test clock TCK received by the test clock terminal TCK1 is transmitted, may be made redundant by using three or more clock paths. In addition, for example, the test circuit TESC1 may be embedded in a semiconductor device SEM (the semiconductor device SEM1 from which the semiconductor chip CHIP2 is omitted) in which two semiconductor chips CHIP are stacked. Alternatively, the test circuit TESC1 may be embedded in a semiconductor device SEM in which four or more semiconductor chips CHIP are stacked.

FIG. 3 illustrates an example of the clock detection unit DET and the clock path selection unit SELc which are illustrated in FIG. 2. In the clock detection unit DET2 and the clock path selection unit SELc2 of the semiconductor chip CHIP2, the terminals TCka, TCkb, and RST, which are illustrated in FIG. 3, are connected to the terminals TCK20 and TCK21, and the output terminal of the transmission destination switching unit SWB22. In addition, in the clock path selection unit SELc2 of the semiconductor chip CHIP2, a terminal TCko illustrated in FIG. 3 is connected to the input terminal of the clock transmission switching unit SWA2 and the test unit TAP2. In addition, in the clock detection unit DET3 and the clock path selection unit SELc3 of the semiconductor chip CHIP3, the terminals TCka, TCkb, RST, and TCko are connected to the terminals TCK30, TCK31, the output terminal of the majority decision selection unit MAJ30, and the test unit TAP3, respectively.

Among the clock detection units DET (DET2 and DET3) and the clock path selection units SELc (SELc2 and SELc3), first, the clock detection unit DET will be described with reference to the clock detection unit DET2 as an example. In addition, the configuration and operation of the clock detection unit DET3 are the same as or similar to the configuration and operation of the clock detection unit DET2.

The clock detection unit DET includes counters CT1 and CT2, AND circuits AND1, AND2, and AND3, OR circuits OR1 and OR2, NOR circuits NOR1 and NOR2, an inverter INV1, and flip-flop circuits DFF1 to DFF8.

The counters CT1 and CT2 are provided in correspondence with the plurality of clock paths PTc10 and PTc11, respectively, and count the number of clocks of the test clocks TCKa and TCkb which are received through the plurality of clock paths PTc10 and PTc11, respectively. Reference numerals MSB and LSB, which are illustrated in FIG. 3, represent a most significant bit and a least significant bit, respectively. In an example illustrated in FIG. 3, a logical value of upper three bits of a count value of the counter CT1 is transmitted to the AND circuit AND1, and a logical value of upper three bits of a count value of the counter CT2 is transmitted to the AND circuit AND2.

For example, in a 8-bit counter CT (CT1, CT2), in a case where a count value is 224 or greater, all of the upper three bits of the count value are logical values of "1", and in a case where the count value is less than 224, at least one of the upper three bits of the count value is a logical value "0". In this case, a determination value (predetermined number) of the number of clocks, which is used for detection of the test clock TCK, is 224. In addition, in a case where a reset signal RST that is transmitted to the terminal RST is a logical value "1", the counters CT1 and CT2 resets the count value. In the test circuit TESC1 illustrated in FIG. 2, the reset signal RST that is transmitted to the terminal RST is a reset signal TRST that is supplied to the reset terminal TRST.

The AND circuit AND (AND1, AND2) is an example of a first setting control unit that asserts a control signal CCNT (a control signal CCNT1 or a control signal CCNT2) corresponding to the clock path PTc through which the test clock TCK of which the number of clocks reaches a predetermined number is transmitted.

The AND circuit AND1 operates a logical product of a signal that is received by three input terminals, and outputs an operation result to an input terminal of the OR circuit OR1. That is, in a case where all of the upper three bits of the count value of the counter CT1 are logical values of "1" (in a case where the number of clocks of the test clock TCKa is equal to or greater than a predetermined number), the AND circuit AND1 outputs the control signal CCNT1 of a logical value "1" to the OR circuit OR1. In other words, in a case where the number of clocks of the test clock TCKa reaches a predetermined number, the AND circuit AND1 asserts the control signal CCNT1 corresponding to the clock path PTc10 through which the test clock TCKa is transmitted.

In addition, in a case where at least one of the upper three bits of the count value of the counter CT1 is a logical value "0" (in a case where the number of clocks of the test clock TCKa is less than a predetermined number), the AND circuit AND1 outputs the control signal CCNT1 of a logical value "0" to the OR circuit OR1. That is, in a case where the number of clocks of the test clock TCKa does not reach a predetermined number, the control signal CCNT1 is retained in a negated state.

In a case where all of the upper three bits of the count value of the counter CT2 are logical values of "1" (in a case where the number of clocks of the test clock TCkb is equal to or greater than a predetermined number), the AND circuit AND2 outputs the control signal CCNT2 of a logical value "1" to the OR circuit OR2. In other words, in a case where the number of clocks of the test clock TCkb reaches a predetermined number, the AND circuit AND2 asserts the control signal CCNT2 corresponding to the clock path PTc11 through which the test clock TCkb is transmitted.

In addition, in a case where at least one of the upper three bits of the count value of the counter CT2 is a logical value "0" (in a case where the number of clocks of the test clock TCKb is less than a predetermined number), the AND circuit AND2 outputs the control signal CCNT2 of a logical value "0" to the OR circuit OR2. That is, in a case where the number of clocks of the test clock TCKb does not reach a predetermined number, the control signal CCNT2 is retained in a negated state.

The OR circuits OR1 and OR2 operate a logical sum of a signal that is received by two input terminal, and output an operation result. For example, the two input terminals of the OR circuit OR1 are connected to an output terminal of the AND circuit AND1 and an output terminal Q of the flip-flop circuit DFF1, respectively, and an output terminal of the OR circuit OR1 is connected to an input terminal D of the flip-flop circuit DFF1. In addition, for example, two input terminals of the OR circuit OR2 are connected to an output terminal of the AND circuit AND2 and an output terminal Q of the flip-flop circuit DFF5, respectively, and an output terminal of the OR circuit OR2 is connected to an input terminal D of the flip-flop circuit DFF5.

Accordingly, in a case where a signal of a logical value "1" is stored in the flip-flop circuit DFF1, the OR circuit OR1 receives the signal of a logical value "1" from the flip-flop circuit DFF1. According to this, in a case where the signal of a logical value "1" is stored in the flip-flop circuit DFF1, the OR circuit OR1 outputs the signal of a logical value "1" to the flip-flop circuit DFF1 regardless of a logical value of the control signal CCNT1.

Similarly, in a case where a signal of a logical value "1" is stored in the flip-flop circuit DFF5, the OR circuit OR2 receives the signal of a logical value "1" from the flip-flop circuit DFF5. According to this, in a case where the signal of a logical value "1" is stored in the flip-flop circuit DFF5, the OR circuit OR2 outputs the signal of a logical value "1" to the flip-flop circuit DFF5 regardless of a logical value of the control signal CCNT2.

The flip-flop circuits DFF1 to DFF4, and DFF5 to DFF8 are an example of a plurality of first selection signal storage units which are provided in correspondence with the plurality of clock paths PTc10 and PTc11, respectively, and output the clock selection signals CS2 (CSa, CSb). The flip-flop circuits DFF1 to DFF4, and DFF5 to DFF8 store each of logical values of the plurality of clock paths PTc10 and PTc11, and output the clock selection signal CS2 (CSa, CSb) based on the logical value that is stored.

For example, the flip-flop circuits DFF1 to DFF4 operate in synchronization with the test clock CLKa, and store a signal that is received by the input terminal Q. The input terminals D of the flip-flop circuits DFF2 to DFF4 are connected to the output terminals D of the flip-flop circuits DFF1 to DFF3, respectively. In addition, the output terminal Q of the flip-flop circuit DFF1 is connected to the input terminal of the OR circuit OR1 and an input terminal of the inverter INV1, and the output terminal D of the flip-flop circuit DFF3 is connected to an input terminal of the NOR circuit NOR2.

The output terminal Q of the flip-flop circuit DFF4 is connected to an input terminal of an AND circuit AND4 of the clock path selection unit SELc. That is, a selection signal CSa, which represents a logical value of a signal stored in the flip-flop circuit DFF4, is transmitted to the AND circuit AND4 of the clock path selection unit SELc.

In addition, in a case where a terminal R receives a signal of a logical value "0", the flip-flop circuits DFF1 to DFF4 are reset to an initial state (for example, a state of outputting a signal of a logical value "0"). That is, the flip-flop circuits DFF1 to DFF4 are retained in the initial state during a period in which the terminal R receives a signal of a logical value "0".

The flip-flop circuits DFF5 to DFF8 operate in synchronization with a test clock CLKb, and each of the flip-flop circuits DFF5 to DFF8 stores a signal that is received by the input terminal D. Input terminals D of the flip-flop circuits DFF6 to DFF8 are connected to output terminals Q of the flip-flop circuits DFF5 to DFF7, respectively. In addition, the output terminal Q of the flip-flop circuit DFF5 is connected to the input terminal of the OR circuit OR2, and an input terminal of the AND circuit AND3.

An output terminal Q of the flip-flop circuit DFF8 is connected to an input terminal of an AND circuit AND5 of the clock path selection unit SELc. That is, a selection signal CSb, which represents a logical value of a signal that is stored in the flip-flop circuit DFF8, is transmitted to an AND circuit AND5 of the clock path selection unit SELc.

In addition, in a case where a terminal R receives a signal of a logical value "0", the flip-flop circuits DFF5 to DFF8 are reset to an initial state (for example, a state of outputting a signal of a logical value of "0"). That is, the flip-flop circuits DFF5 to DFF8 are retained in the initial state during a period in which the terminal R receives the signal of a logical value "0".

A block including the inverter INV, the AND circuit AND3, and the NOR circuits NOR1 and NOR2 is an example of a first update control unit that suppresses variation of the logical value of the clock selection signals CSa and CSb which are generated based on the control signal CCNT that is asserted.

The inverter INV1 inverts a signal that is received from the flip-flop circuit DFF1, and outputs an inverted signal to the AND circuit AND3. The AND circuit AND3 operates a logical product of the signal that is received from the flip-flop circuit DFF1 through the inverter INV1, and the signal that is received from the flip-flop circuit DFF5, and outputs an operation result to the NOR circuit NOR1.

The NOR circuit NOR1 operates a negative logical sum between an output signal of the AND circuit AND3, and the reset signal RST that is received from the terminal RST, and outputs an operation result to the terminal R of the flip-flop circuits DFF1 to DFF4. For example, in a case where the reset signal RST that is transmitted to the terminal RST is a logical value "1", the NOR circuit NOR1 outputs a signal of a logical value "0" to the terminal R of the flip-flop circuits DFF1 to DFF4. According to this, in a case where the reset signal RST that is transmitted to the terminal RST is a logical value "1", the flip-flop circuits DFF1 to DFF4 are reset to an initial state.

The NOR circuit NOR1 outputs an inverted signal of the output signal of the AND circuit AND3 to the terminal R of the flip-flop circuits DFF1 to DFF4 during a period in which the reset signal RST transmitted to the terminal RST is a logical value "0". For example, in a case where the flip-flop circuit DFF1 stores the signal of a logical value "1" prior to the flip-flop circuit DFF5, the NOR circuit NOR1 outputs the signal of a logical value "1" regardless of the logical value of the output signal of the flip-flop circuit DFF5.

In addition, the NOR circuit NOR1 outputs the signal of a logical value "1" to the terminal R of the flip-flop circuits DFF1 to DFF4 during a period in which the signal of a logical value "1" is output from the flip-flop circuit DFF1. That is, in a case where the flip-flop circuit DFF1 stores the signal of a logical value "1" prior to the flip-flop circuit DFF5, the NOR circuit NOR1 suppresses the flip-flop circuits DFF1 to DFF4 from being reset to an initial state.

According to this, a logical value of a signal that is stored in the flip-flop circuits DFF1 to DFF4 is retained to a logical value "1". Therefore, in a case where the flip-flop circuit DFF1 stores the signal of a logical value "1" prior to the flip-flop circuit DFF5, the signal of a logical value "1" is output from the flip-flop circuit DFF3 to the NOR circuit NOR2.

In addition, in a case where the flip-flop circuit DFF5 stores the signal of a logical value "1" prior to the flip-flop circuit DFF1, the NOR circuit NOR1 outputs a signal of a logical value "0". According to this, the flip-flop circuits DFF1 to DFF4 are reset to an initial state. In addition, the NOR circuit NOR1 outputs the signal of a logical value "0" to the terminal R of the flip-flop circuits DFF1 to DFF4 during a period in which the output signals of the flip-flop circuits DFF1 and DFF5 are a logical value "0" and a logical value "1", respectively.

According to this, the flip-flop circuits DFF1 to DFF4 are retained in an initial state during a period in which the output signals of the flip-flop circuits DFF1 and DFF5 are a logical value "0" and a logical value "1", respectively. In this case, a signal of a logical value "0" is output from the flip-flop circuit DFF3 to the NOR circuit NOR2.

The NOR circuit NOR2 operates a negative logical sum between the output signal of the flip-flop circuit DFF3 and the reset signal RSt received from the terminal RST, and outputs an operation result to the terminal R of the flip-flop circuits DFF5 to DFF8. For example, in a case where the reset signal RST that is transmitted to the terminal RST is a logical value "1", the NOR circuit NOR2 outputs a signal of a logical value "0" to the terminal R of the flip-flop circuits DFF5 to DFF8. According to this, in a case where the reset signal RST that is transmitted to the terminal RST is a logical value "1", the flip-flop circuits DFF5 to DFF8 are reset to an initial state.

The NOR circuit NOR2 outputs an inverted signal of the output signal of the flip-flop circuit DFF3 to the terminal R of the flip-flop circuits DFF5 to DFF8 during a period in which the reset signal RST that is transmitted to the terminal RST is a logical value "0".

For example, in a case where the flip-flop circuit DFF1 stores the signal of a logical value "1" prior to the flip-flop circuit DFF5, the NOR circuit NOR2 receives the signal of a logical value "1" from the flip-flop circuit DFF3. In addition, the NOR circuit NOR2 outputs a signal (a signal of a logical value "0") inverted from the signal of a logical value "1", which is received from the flip-flop circuit DFF3", to the terminal R of the flip-flop circuits DFF5 to DFF8. According to this, the flip-flop circuits DFF5 to DFF8 are reset to an initial state.

In addition, in a case where the flip-flop circuit DFF5 stores the signal of a logical value "1" prior to the flip-flop circuit DFF1, the NOR circuit NOR2 receives a signal of a logical value "0" from the flip-flop circuit DFF3. In addition, the NOR circuit NOR2 outputs a signal (a signal of a logical value "1") inverted from the signal of a logical value "0", which is received from the flip-flop circuit DFF3", to the terminal R of the flip-flop circuits DFF5 to DFF8. According to this, the logical value of the signal, which is stored in the flip-flop circuits DFF5 to DFF8, is retained to the logical value "1".

As described above, the NOR circuits NOR1 and NOR2 retains a state of a flip-flop circuit DFF other than a flip-flop circuit DFF, which stores a logical value of the control signal CCNT that is asserted among a plurality of the flip-flop circuits DFF, in an initial state. According to this, the NOR circuits NOR1 and NOR2 suppresses variation of the logical value of the clock selection signals CSa and CSb after the logical value of the control signal CCNT that is asserted is stored in any one of the flip-flop circuits DFF1 to DFF4, and DFF5 to DFF8.

That is, in a period after the clock selection signals CSa and CSb representing a clock path PTc, through which the test clock TCK of the number of clocks reaches a predetermined number is transmitted, is generated, the clock detection unit DET can avoid the logical value of the clock selection signals CSa and CSb varying. According to this, the clock detection unit DET can stably supply the clock selection signal CS (CSa, CSb) representing the clock path PTc, through which the test clock TCK of which the number of clocks reaches a predetermined number is transmitted, to the clock path selection unit SELc.

Next, description will be given of the clock path selection unit SELc with reference to the clock path selection unit SELc2 as an example. In addition, the configuration and operation of the clock path selection unit SELc3 are the same as or similar to those of the clock path selection unit SELc2. The clock path selection unit SELc includes the AND circuits AND4 and AND5, and an OR circuit OR3. The AND circuits AND4 and AND5 operate a logical product of signals received from two input terminals, and outputs an operation result.

The two input terminals of the AND circuit AND4 are connected to the terminal TCKa, and the output terminal Q of the flip-flop circuit DFF4, respectively. For example, the AND circuit AND4 operates a logical product of the clock selection signal CSa received from the flip-flop circuit DFF4 of the clock detection unit DET, and a signal received from the terminal TCKa, and outputs an operation result to the OR circuit OR3.

The two input terminals of the AND circuit AND5 are connected to the terminal TCKb and the output terminal Q of the flip-flop circuit DFF8, respectively. For example, the AND circuit AND5 operates a logical product of the clock selection signal CSb received from the flip-flop circuit DFF8 of the clock detection unit DET, and a signal received from the terminal TCKb, and outputs an operation result to the OR circuit OR3.

The OR circuit OR3 operates a logical sum of the signals (output signals of the AND circuits AND4 and AND5) which are received by the two input terminals, and outputs an operation result to the terminal TCKo.

For example, in a case where a failure occurs in the clock path PTc10 connected to the terminal TCKa between the terminals TCKa and TCKb, the AND circuit AND4 receives the clock selection signal CSa of a logical value "0" from the flip-flop circuit DFF4 of the clock detection unit DET. According to this, the AND circuit AND4 outputs a signal of a logical value "0" to the OR circuit OR3 regardless of a logical value of a signal that is transmitted to the terminal TCKa.

In addition, in a case where a failure occurs in the signal path PTc10 that is connected to the terminal TCka between the terminals TCKa and TCKb, the AND circuit AND5 receives the clock selection signal CSb of a logical value "1" from the flip-flop circuit DFF8 of the clock detection unit DET. According to this, the AND circuit AND5 outputs the test clock TCKb, which is transmitted to the terminal TCkb, to the OR circuit OR3.

According to this, in a case where a failure occurs in the signal path PTc10 that is connected to the terminal TCka between the terminals TCKa and TCKb, the OR circuit OR3 outputs the test clock TCKb, which is transmitted to the terminal TCKb, to the terminal TCKo.

In addition, the configuration of the clock detection unit DET and the clock path selection unit SELc is not limited to the example illustrated in FIG. 3. For example, the counter CT (CT1, CT2) may transmit a logical value of a most significant bit of a count value to the AND circuit AND (AND1, AND2), or may transmit a logical value of upper two bits to the AND circuit (AND1, AND2). That is, a bit of a count value, which is transmitted from the counter CT (CT1, CT2) to the AND circuit AND (AND1, AND2), is not limited to upper three bits.

Alternatively, the clock detection unit DET may include a shift register in a predetermined number of stages (predetermined number) instead of the counters CT1 and CT2, and the AND circuits AND1 and AND2. In a case where the reset signal RST that is transmitted to the terminal RST is a logical value "1", the shift register resets the output to a logical value "0". For example, a shift register, which is provided instead of the counter CT1, operates in synchronization with the test clock TCKa. In addition, in the shift register that is provided instead of the counter CT1, an input terminal of a flip-flop circuit at an initial stage is fixed to a logical value "1", and an output terminal of a flip-flop circuit at a final stage is connected to the input terminal of the OR circuit OR1. In addition, a shift register, which is provided instead of the counter CT2, operates in synchronization with the test clock TCKb. In addition, in the shift register that is provided instead of the counter CT2, an input terminal of a flip-flop circuit at an initial stage is fixed to a logical value "1", and an output terminal of a flip-flop circuit at a final stage is connected to the input terminal of the OR circuit OR2.

FIG. 4 illustrates an example of the transmission destination switching unit SWB illustrated in FIG. 2. The transmission destination switching unit SWB (SWB11, SWB12, SWB21, SWB22) includes AND circuits AND10 and AND11, and an inverter INV10. Each of the AND circuits AND10 and AND11 operates a logical product of signals received by two input terminals, and outputs an operation result. The inverter INV10 outputs a signal inverted from a signal that is received by an input terminal.

The input terminal of the inverter INV10 is connected to the terminal SCa, and an output terminal of the inverter INV10 is connected any one of the two input terminals of the AND circuit AND10. The other of the two input terminals of the AND circuit AND10 is connected to the terminal IN10, and an output terminal of the AND circuit AND10 is connected to the terminal OUT10. The two input terminals of the AND circuit AND11 are connected to the terminals IN10 and SCa, respectively, and an output terminal of the AND circuit AND11 is connected to the terminal OUT11.

For example, in the transmission destination switching units SWB11 and SWB12, the terminal SCa receives the control signal SC10 from the test unit TAP1. In addition, in the transmission destination switching units SWB21 and SWB22, the terminal SCa receives a control signal SC20 from the test unit TAP2. In a case where the control signal received by the terminal SCa is a logical value "0", the signal received by the terminal IN10 is output from the terminal OUT10. In a case where the control signal received by the terminal SCa is a logical value "1", the signal received by the terminal IN10 is output from the terminal OUT11.

For example, in the semiconductor chip CHIP2, the terminal IN10 of the transmission destination switching unit SWB21 is connected to the terminal TDI21 of the semiconductor chip CHIP2. In addition, the terminal OUT10 is connected to the test input terminal (terminal that receives the data TDI) of the test unit TAP2, and the terminal OUT11 is connected to the terminal TDI23 of the semiconductor chip CHIP2.

FIG. 5 illustrates an example of the transmission data switching unit SWC illustrated in FIG. 2. The transmission data switching unit SWC (SWC1, SWC2) includes AND circuits AND20 and AND21, an OR circuit OR20, and an inverter INV20. Each of the AND circuit AND20 and AND21 operates a logical product of signals which are received by two input terminals, and outputs an operation result. The OR circuit OR20 operates a logical sum of a signal that is received by two input terminals, and outputs an operation result. The inverter INV20 outputs a signal inverted from the signal that is received by an input terminal.

The input terminal of the inverter INV20 is connected to the terminal SCa, and an output terminal of the inverter INV10 is connected to one of the two input terminals of the AND circuit AND20. The other of the two input terminals of the AND circuit AND20 is connected to the terminal IN20. The two input terminals of the AND circuit AND21 are connected to the terminals IN21 and SCa, respectively. Two input terminals of the OR circuit OR20 are connected to output terminals of the AND circuits AND20 and AND21, respectively, and an output terminal of the OR circuit OR20 is connected to the terminal OUT20.

For example, in the transmission data switching unit SWC1, the terminal SCa receives the control signal SC10 from the test unit TAP1. In addition, in the transmission data switching unit SWC2, the terminal SCa receives the control signal SC20 from the test unit TAP2. In a case where the control signal, which is received by the terminal SCa, is a logical value "0", a signal, which is received by the terminal IN20, is output from the terminal OUT20. In a case where the control signal, which is received by the terminal SCa, is a logical value "1", a signal, which is received by the terminal IN21, is output from the terminal OUT20.

For example, in the semiconductor chip CHIP2, the terminals IN20 and IN21 of the transmission data switching unit SWC2 are connected to the test output terminal (terminal from which the data TDO is output) of the test unit TAP2, and the terminal TDO22 of the semiconductor chip CHIP2, respectively. In addition, the terminal OUT20 of the transmission data switching unit SWC2 is connected to the terminal TDO20 of the semiconductor chip CHIP2.

Figure 6:
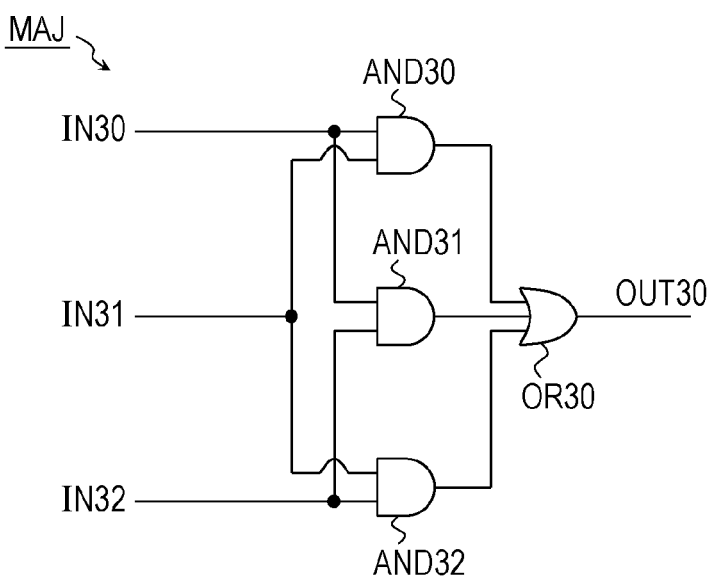
FIG. 6 is a diagram illustrating an example of a majority decision selection unit illustrated in FIG. 2.

FIG. 6 illustrates an example of the majority decision selection unit MAJ illustrated in FIG. 2. The majority decision selection unit MAJ (MAJ20, MAJ21, MAJ30, MAJ31) includes AND circuits AND30, AND31, and AND32, and an OR circuit OR30. Each of the AND circuits AND30, AND31, and AND32 operates a logical product of signals which are received by two input terminals, and output an operation result. The OR circuit OR30 operates a logical sum of signals which are received by three input terminals, and output an operation result.

The two input terminals of the AND circuit AND30 are connected to terminals IN30 and IN31, respectively. The two input terminals of the AND circuit AND31 are connected to terminals IN30 and IN32, respectively. The two input terminals of the AND circuit AND32 are connected to the terminals IN31 and IN32, respectively. The three input terminals of the OR circuit OR30 are connected to output terminals of the AND circuits AND30, AND31, and AND32, respectively, and an output terminal of the OR circuit OR30 is connected to a terminal OUT30.

For example, in a case where signals, which are received by the terminal IN30 and IN31, are the same logical value, a signal of the same logical value as that of the signals received by the terminals IN30 and IN31 is output from the terminal OUT30. In addition, for example, in a case where signals, which are received by the terminals IN30 and IN32, are the same logical value, a signal of the same logical value as that of the signals, which are received by the terminals IN30 and IN32, is output from the terminal OUT30. In addition, for example, in a case where signals, which are received by the terminals IN31 and IN32, are the same logical value, a signal of the same logical value as that of the signals, which are received by the terminals IN31 and IN32, is output from the terminal OUT30.

For example, in the semiconductor chip CHIP2, the terminals IN30, IN31, and IN32 of the majority decision selection unit MAJ20 are connected to the terminals TRST20, TRST21, and TRST22, respectively. In addition, the terminal OUT30 of the majority decision selection unit MAJ20 is connected to the input terminal (terminal IN10 illustrated in FIG. 4) of the transmission destination switching unit SWB22.

Figure 7:
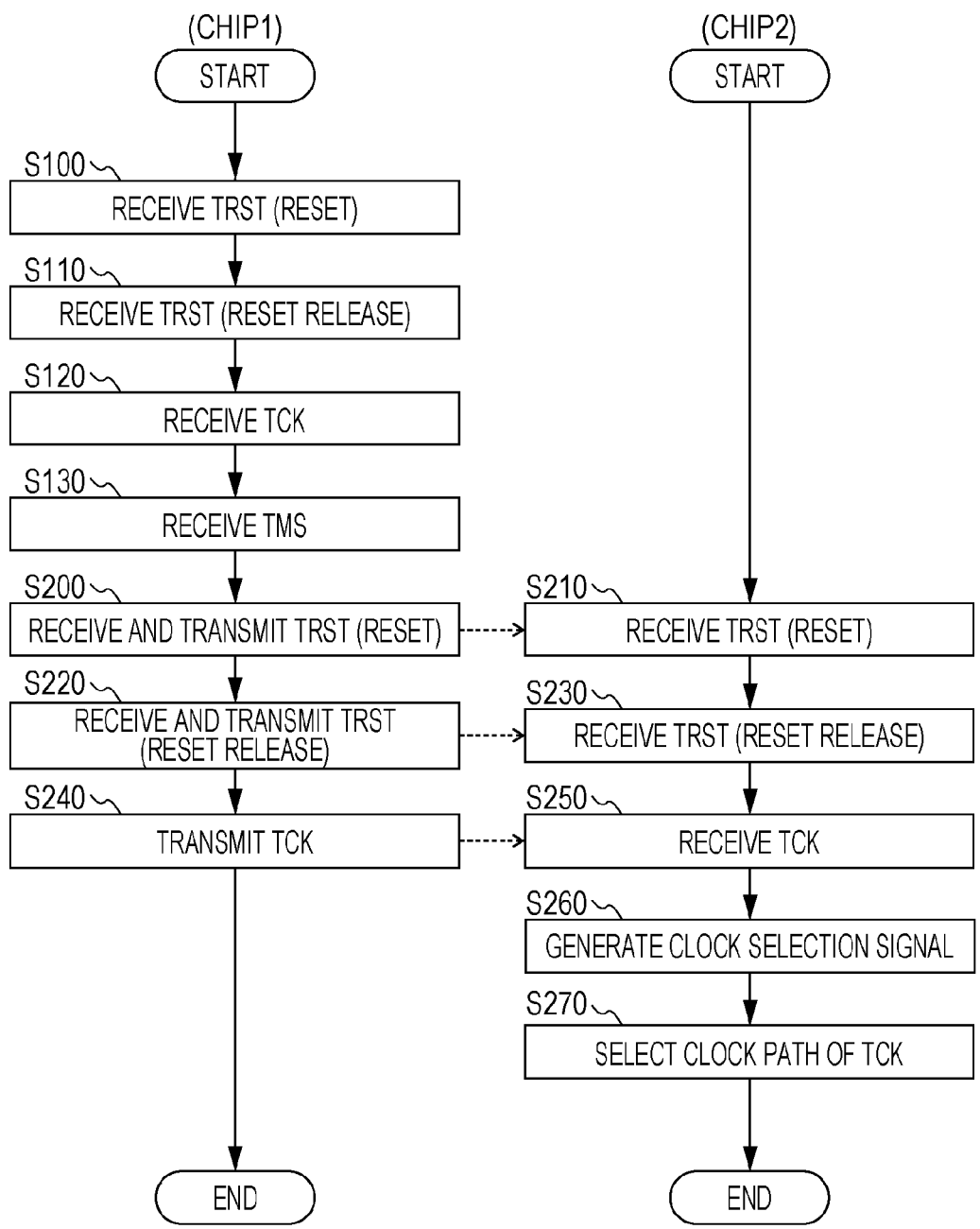
FIG. 7 is a diagram illustrating an example of a method of controlling a test circuit illustrated in FIG. 2.

FIG. 7 illustrates an example of a method of controlling the test circuit TESC1 illustrated in FIG. 2. In addition, FIG. 7 illustrates an example of the method of controlling the test circuit TESC1 during setting of the clock path PTc between the semiconductor chips CHIP1 and CHIP2. Steps S100 to S130, S200, S220, and S240 in FIG. 7 represent the operation of the test circuit TESC1 that is included in the semiconductor chip CHIP1. In addition, steps S210, S230, S250, S260, and S270 represent the operation of the test circuit TESC1 that is included in the semiconductor chip CHIP2. For example, the operation illustrated in FIG. 7 is controlled by a test device that tests the semiconductor device SEM1. In addition, in the operation illustrated in FIG. 7, the initial state of the transmission destination switching unit SWB, and the initial state of the transmission data switching unit SWC are set to the internal transmission state.

In step S100, the semiconductor chip CHIP1 receives a signal TRST, which resets the state of the test unit TAP, from the test reset terminal TRST1. For example, the test device asserts the signal TRST that is supplied to the test reset terminal TRST1. According to this, the signal TRST, which is asserted, is transmitted to the test unit TAP1 of the semiconductor chip CHIP1, and the state of the test unit TAP1 of the semiconductor chip CHIP1 is reset.

In step S110, the semiconductor chip CHIP1 receives a signal TRST, which releases the rest, from the test reset terminal TRST1. For example, the test device negates the signal TRST that is supplied to the test reset terminal TRST1. According to this, the negated signal TRST is transmitted to the test unit TAP1 of the semiconductor chip CHIP1, and a process of resetting the state of the test unit TAP1 of the semiconductor chip CHIP1 is terminated.

In step S120, the semiconductor chip CHIP1 receives the test clock TCK, which is supplied from the test device, by the test clock terminal TCK1. According to this, the test clock TCK is transmitted to the test unit TAP1 of the semiconductor chip CHIP1.

In step S130, the semiconductor chip CHIP1 receives the test mode select TMS, which is supplied from the test device, by the test mode select terminal TMS1. According to this, the test mode select TMS is transmitted to the test unit TAP1 of the semiconductor chip CHIP1, and the state (for example, a mode of a TAP controller in the test unit TAP1) of the test unit TAP1 is determined.

For example, the test device sets the state of the test unit TAP1 of the semiconductor chip CHIP1 to a state for setting a test path PT between the semiconductor chips CHIP1 and CHIP2 by using the test mode select TMS. According to this, the switching units SWA1, SWB11, SWB12, and SWC1 of the semiconductor chip CHIP1 are set to the passing state. Accordingly, the signals TCK, TDI, TRST, and TMS, which are received from the test device by the terminals TCK1, TDI1, TRST1, and TMS1, are transmitted to the semiconductor chip CHIP2.

In step S200, the semiconductor chip CHIP1 receives the signal TRST, which resets the state of the test unit TAP, by the test reset terminal TRST1, and transmits the signal TRST, which is received, to the semiconductor chip CHIP2 by using the three signal paths PT12, PT13, and PT14. According to this, in step S210, the semiconductor chip CHIP2 receives the signal TRST that resets the state of the test unit TAP2. For example, the test device asserts the signal TRST that is supplied to the test reset terminal TRST1. According to this, the signal TRST, which is asserted, is transmitted to the test unit TAP2 of the semiconductor chip CHIP2 through the semiconductor chip CHIP1.

In step S210, the semiconductor chip CHIP2 receives the signal TRST, which resets the state of the test unit TAP, by the terminals TRST20, TRST21, and TRST22. According to this, the majority decision selection unit MAJ20 of the semiconductor chip CHIP2 receives the signals TRST which are transmitted through the three signal paths PT12, PT13, and PT14, respectively. In addition, the majority decision selection unit MAJ20 determines a logical value of a signal, which is transmitted to the transmission destination switching unit SWB22 among logical values of the signals TRST which are transmitted through the three signal paths PT12, PT13, and PT14, based on majority decision logic.

According to this, the signal TRST (signal TRST that is asserted), which resets the state of the test unit TAP, is transmitted to the test unit TAP2 and the clock detection unit DET2 of the semiconductor chip CHIP2. In addition, the state of the test unit TAP2 and the state of the clock detection unit DET2 of the semiconductor chip CHIP2 are reset.

In step S220, the semiconductor chip CHIP1 receives the signal TRST, which releases reset, by the test reset terminal TRST1, and transmits the signal TRST, which is received, to the semiconductor chip CHIP2 by using the three signal paths PT12, PT13, and PT14. According to this, in step S230, the semiconductor chip CHIP2 receives the signal TRST that releases reset. For example, the test device negates the signal TRST that is supplied to the test reset terminal TRST1. According to this, the signal TRST, which is negated, is transmitted to the test unit TAP2 of the semiconductor chip CHIP2 through the semiconductor chip CHIP1.

In step S230, the semiconductor chip CHIP2 receives the signal TRST, which releases reset, by the terminals TRST20, TRST21, and TRST22. According to this, the majority decision selection unit MAJ20 of the semiconductor chip CHIP2 receives signals TRST which are transmitted through the three signal path PT12, PT13, and PT14, respectively. In addition, the majority decision selection unit MAJ20 determines a logical value of a signal, which is transmitted to the transmission destination switching unit SWB22 among logical values of the signals TRST which are transmitted through the three signal paths PT12, PT13, and PT14, based on majority decision logic.

According to this, the signal TRST (signal TRST that is negated), which releases reset, is transmitted to the test unit TAP2 and the clock detection unit DET2 of the semiconductor chip CHIP2. In addition, a process of resetting the state of the test unit TAP2 and the clock detection unit DET2 of the semiconductor chip CHIP2 is terminated.

In step S240, the semiconductor chip CHIP1 transmits the test clock TCK, which is supplied to the test clock terminal TCK1, to the semiconductor chip CHIP2 by using the plurality of clock paths PTc10 and PTc11. According to this, in step S250, the semiconductor chip CHIP2 receives the test clock TCK.

In step S250, the semiconductor chip CHIP2 receives the test clock TCK, which is transmitted from the semiconductor chip CHIP1, by the terminals TCK20 and TCK21. According to this, the test clock TCK is transmitted to the clock detection unit DET2 and the clock path selection unit SELc2 of the semiconductor chip CHIP2.

In step S260, the clock detection unit DET2 of the semiconductor chip CHIP2 generates the clock selection signal CS2. For example, the clock detection unit DET2 counts the number of clocks of the test clock TCK that is received through each of the plurality of clock paths PTc10 and PTc11. In addition, in a case where the number of clocks of the test clock TCK, which is received through any one of the plurality of clock paths PTc10 and PTc11, reaches a predetermined number, the clock detection unit DET2 generates the clock selection signal CS2 that represents the clock path PTc through which the predetermined number of clocks are transmitted.

As described above, the clock detection unit DET2 detects the test clock TCK of which the number of clocks reaches a predetermined number, and generates the clock selection signal CS2 that represents the clock path PTc through which the detected test clock TCk is transmitted. In addition, in a period before the clock selection signal CS2 representing the clock path PTc is generated (period in which the clock selection signals CSa and CSb illustrated in FIG. 3 are a logical value "0"), the test clock TCK is transmitted only to the clock detection unit DET2 and the clock path selection unit SELc2.

In a case where the number of clocks of the test clock TCK, which is transmitted to the clock detection unit DET2 through any one of the plurality of clock paths PTc10 and PTc11, reaches a predetermined number, the operation of the test circuit TESC1 moves to step S270.

In step S270, the clock path selection unit SELc2 of the semiconductor chip CHIP2 selects the clock path PTc through which the test clock TCK of which the number of clock reaches a predetermined number is transmitted. For example, the clock path selection unit SELc2 selects the clock path PTc, which is represented by the clock selection signal CS2 generated in step S260, as a clock path PTc (hereinafter, also referred to as a test clock path PTc) that is used during test of the semiconductor device SEM1.

According to this, the test clock path PTc between the semiconductor chips CHIP1 and CHIP2 is set. In addition, setting of the test clock path PTc between the semiconductor chips CHIP2 and CHIP3 is carried out, for example, after step S270. For example, the test device sets the state of the test unit TAP2 of the semiconductor chip CHIP2 to a state for setting the test path PT between the semiconductor chips CHIP2 and CHIP3 by using the test mode select TMS. According to this, the switching units SWA2, SWB21, SWB22, and SWC2 of the semiconductor chip CHIP2 are set to the passing state.

In addition, the test device carries out the same operations as in step S200, S220, and S240 in the semiconductor chips CHIP1 and CHIP2, and carries out the same operations as in step S210, S230, S250, S260, and S270 in the semiconductor chip CHIP3. According to this, the test clock path PTc between the semiconductor chips CHIP2 and CHIP3 is set.

After the test clock path PTc between the plurality of semiconductor chips CHIP is set, the data TDI, which tests the semiconductor device SEM1, is supplied to the test input terminal TDI1.

For example, in a test that uses the test unit TAP1 of the semiconductor chip CHIP1, the test device sets the transmission destination switching unit SWB and the transmission data switching unit SWC of the semiconductor chip CHIP1 to the internal transmission state by using the test mode select TMS. Since the data TDI and the like are not transmitted to the test unit TAP of the semiconductor chips CHIP2 and CHIP3, it is possible to avoid malfunction of the test unit TAP of the semiconductor chips CHIP2 and CHIP3. In addition, it is possible to avoid the data TDO, which is output from the test unit TAP1 of the semiconductor chip CHIP1, colliding with data TDO that is transmitted from another semiconductor chip CHIP.

In a test that uses the test unit TAP2 of the semiconductor chip CHIP2, for example, the test device sets the switching units SWA, SWB, and SWC of the semiconductor chip CHIP1 to the passing state by using the test mode select TMS. In addition, the test device sets the transmission destination switching unit SWB and the transmission data switching unit SWC of the semiconductor chip CHIP2 to the internal transmission state by using the test mode select TMS. Since the data TDI and the like are not transmitted to the test unit TAP of the semiconductor chips CHIP1 and CHIP3, it is possible to avoid malfunction of the test unit TAP of the semiconductor chips CHIP1 and CHIP3. In addition, it is possible to avoid the data TDO, which is output from the test unit TAP2 of the semiconductor chip CHIP2, colliding with data TDO that is transmitted from another semiconductor chip CHIP.

In a test that uses the test unit TAP of the semiconductor chip CHIP3, for example, the test device sets the switching units SWA, SWB, and SWC of the semiconductor chips CHIP1 and CHIP2 to the passing state by using the test mode select TMS. Since the data TDI and the like are not transmitted to the test unit TAP of the semiconductor chips CHIP1 and CHIP2, it is possible to avoid malfunction of the test unit TAP of the semiconductor chips CHIP1 and CHIP2. In addition, it is possible to avoid the data TDO, which is output from the test unit TAP3 of the semiconductor chip CHIP3, colliding with data TDO that is transmitted from another semiconductor chip CHIP.

In addition, the method of controlling the test circuit TESC1 is not limited to the example illustrated in FIG. 7. For example, the process (reset release) in step S110 may be carried out after the process (clock supply) in step S120. In addition, after the test clock path PTc between the semiconductor chips CHIP1 and CHIP2 is set, the test using the test unit TAP2 of the semiconductor chip CHIP2 may be carried out before the test clock path PTc between the semiconductor chips CHIP2 and CHIP3 is set.

As described above, even in the embodiment illustrated in FIG. 2 to FIG. 7, it is possible to obtain the same effect as in the embodiment illustrated in FIG. 1. For example, in this embodiment, even in a case where one of the clock paths PTc10 and PTc11, and one of the clock paths PTc20 and PTc21 fail, it is possible to carry out the test for detecting a failure site in the signal path between the semiconductor chips CHIP. According to this, it is possible to retrieve the failure by bypassing the failure site. As a result, in this embodiment, it is possible to improve a yield ratio of the semiconductor device SEM1.

In addition, in this embodiment, the test circuit TESC1 includes the transmission destination switching unit SWB that switches a transmission destination of the data TDI and the like, and the transmission data switching unit SWC that switches a transmission source of the data TDO. According to this, the test circuit TESC1 can supply the data TDI and the like to a test unit TAP of the semiconductor chip CHIP, which is a test target, among test units TAP of the plurality of semiconductor chips CHIP. For example, the test circuit TESC1 can avoid the data TDI and the like being transmitted to a test unit TAP other than the test unit TAP of the semiconductor chip CHIP, which is a test target, among test units TAP of the plurality of semiconductor chips CHIP.

In addition, in this embodiment, the test circuit TESC1 includes the clock transmission switching unit SWA that is set to either the passing state (state of transmitting the test clock TCK to another semiconductor chip CHIP) or the non-passing state. According to this, in this embodiment, when setting the test clock path PTc, it is possible to appropriately transmit the reset signal TRST and the test clock TCK to the clock detection unit DET that is an operation target.

In addition, the NOR circuits NOR1 and NOR2 and the like in the clock detection unit DET suppresses variation of a logical value of the clock selection signal CS after a logical value of the control signal CCNT that is asserted is stored in the flop-flop circuit DFF. According to this, in this embodiment, it is possible to stably supply the clock selection signal CS, which represents the clock path PTc through which the test clock TCK of which the number of clocks reaches a predetermined number is transmitted, to the clock path selection unit SELc.

In addition, the clock detection unit DET detects a test clock TCK, of which the number of clocks reaches to a predetermined number for the first time, among test clocks TCK which are received through the plurality of clock paths PTc, respectively. According to this, for example, even in a case where a failure does not occur in any of the clock paths PTc10 and PTc11, the clock detection unit DET2 can transmit the clock selection signal CS2, which represents one of the clock paths PTc10 and PTc11, to the clock path selection unit SELc2. Similarly, even in a case where a failure does not occur in any of the clock paths PTc20 and PTc21, the clock detection unit DET3 can transmit the clock selection signal CS3, which represents one of the clock paths PTc20 and PTc21, to the clock path selection unit SELc3.

According to this, in this embodiment, in the clock path selection unit SELc illustrated in FIG. 3, it is possible to avoid a result of a logical sum of the test clocks TCKa and TCKb which are transmitted to the terminals TCKa and TCKb being output from the clock path selection unit SELc. A clock waveform, which represents the result of the logical sum of the test clocks TCKa and TCKb which are transmitted to the terminals TCKa and TCKb, may deteriorate due to a deviation in a delay time of the test clocks TCKa and TCKb which are transmitted to the terminals TCKa and TCKb, and the like. In this embodiment, since it is possible to avoid both of the clock selection signals Csa and CSb being set to a logical value "1", it is possible to avoid the waveform of the test clock TCKo, which is output from the clock path selection unit SELc, deteriorating.

Figure 8:
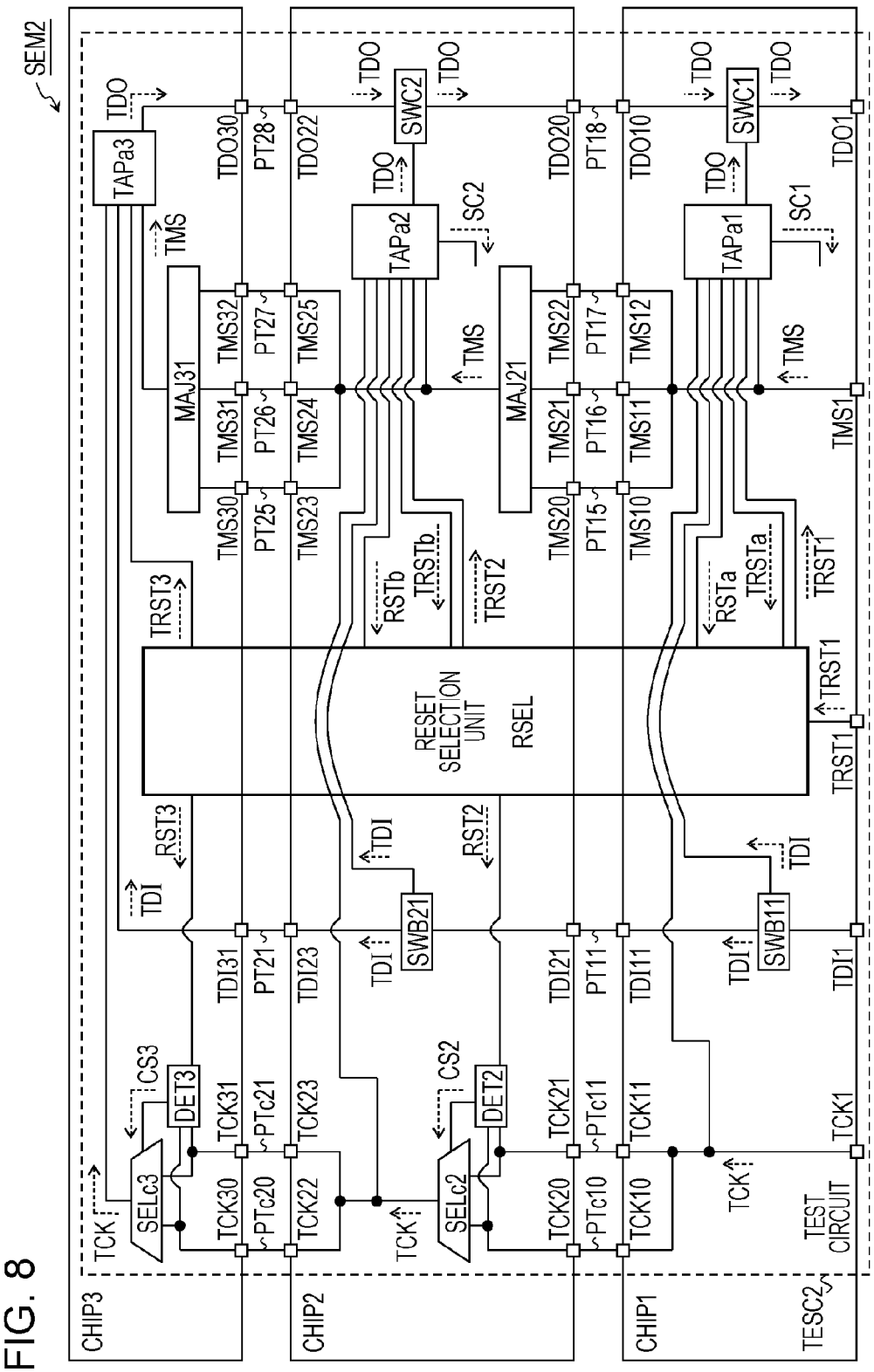
FIG. 8 is a diagram illustrating another embodiment of the test circuit and the method of controlling the test circuit.

FIG. 8 illustrates still another embodiment of the test circuit and the method of controlling the test circuit. The same or similar symbols will be given to elements which are the same as or similar to those illustrated in FIG. 1 to FIG. 7, and details description thereof will not be repeated. A test circuit TESC2 tests a semiconductor device SEM2 including a plurality of semiconductor chips CHIP (CHIP1, CHIP2, and CHIP3). The semiconductor device SEM2 is the same as or similar to the semiconductor device SEM1 illustrated in FIG. 2 except that the semiconductor device includes a test circuit TESC2 instead of the test circuit TESC1 illustrated in FIG. 2.

In addition, in FIG. 8, description of a signal line and the like between switching units SWB and SWC of the semiconductor chips CHIP1 and CHIP2, and a test unit TAPa is omitted for easy comprehension of the drawing.

In the test circuit TESC2, the clock transmission switching units SWA (SWA1 and SWA2), and the transmission destination switching units SWB12 and SWB22 are omitted from the configuration of the test circuit TESC1 illustrated in FIG. 2. In addition, the test circuit TESC2 includes test units TAPa1, TAPa2, and TAPa3 instead of the test units TAP1, TAP2, and TAP3 which are illustrated in FIG. 2. In addition, a reset selection unit RSEL is added to the configuration of the test circuit TESC1 illustrated in FIG. 2. The other configurations of the test circuit TESC2 are the same as or similar to those of the test circuit TESC1 illustrated in FIG. 2.

The test circuit TESC2 includes a clock detection unit DET (DET2, DET3), a clock path selection unit SELc (SELc2, SELc3), a test unit TAPa (TAPa1, TAPa2, TAPa3), a majority decision selection unit MAJ (MAJ21, MAJ31), and a reset selection unit RSEL. In addition, the test circuit TESC2 includes a transmission destination switching unit SWB (SWB11, SWB21), and a transmission data switching unit SWC (SWC1, SWC2).

The test unit TAPa1 of the semiconductor chip CHIP1 is the same as or similar to the test unit TAP1 illustrated in FIG. 1 except that signals RSTa and TRSTa are generated. The signal RSTa is a reset signal that resets a state of the clock detection unit DET2 of the semiconductor chip CHIP2. The signal TRSTa is a reset signal that resets a state of both the test unit TAPa2 of the semiconductor chip CHIP2 and the test unit TAPa3 of the semiconductor chip CHIP3.

The test unit TAPa2 of the semiconductor chip CHIP2 is the same as or similar to the test unit TAP2 illustrated in FIG. 1 except that reset signals RSTb and TRSTb are generated. The signal RSTb is a reset signal that resets a state of the clock detection unit DET3 of the semiconductor chips CHIP3. The signal TRSTb is a reset signal that resets a state of the test unit TAPa3 of the semiconductor chip CHIP3. The test unit TAPa3 of the semiconductor chip CHIP3 is the same as or similar to the test unit TAP3 illustrated in FIG. 1.

The reset selection unit RSEL receives a test reset TRST1 (hereinafter, also referred to as a reset signal TRST1) that is supplied to a test reset terminal TRST1. In addition, the reset selection unit RSEL receives the reset signals RSTa and TRSTa from the test unit TAPa1, and receives the reset signals RSTb and TRSTb from the test unit TAPa2. In addition, the reset selection unit RSEL transmits reset signals TRST1, TRST2, and TRST3, which control reset of the test unit TAPa, to the test units TAPa1, TAPa2, and TAPa3, respectively. In addition, the reset selection unit RSEL transmits reset signals RST2 and RST3, which control reset of the clock detection unit DET, to the clock detection units DET2 and DET3, respectively. Details of the reset selection unit RSEL will be described with reference to FIG. 9.

In addition, the configuration of the test circuit TESC2 is not limited to the example illustrated in FIG. 8. For example, a clock path PTc (PTc10, PTc11, and the like), through which a test clock TCK received by a test clock terminal TCK1 is transmitted, may be made redundant by three or more clock paths. In addition, for example, the test circuit TESC2 may be embedded in a semiconductor device SEM (the semiconductor device SEM2 from which the semiconductor chip CHIP2 is omitted) in which two semiconductor chips CHIP are stacked. Alternatively, the test circuit TESC2 may be embedded in a semiconductor device SEM in which four or more semiconductor chips CHIP are stacked.

For example, in a case where, the semiconductor chip CHIP is disposed on the semiconductor chip CHIP3, the test unit TAPa3 generates two reset signals in a similar manner as in the test unit TAPa1 and TAPa2. In this case, the two reset signals, which are generated in the test unit TAPa3, are reset signals which reset states of a clock detection unit DET and a test unit TAPa of the semiconductor chip CHIP, which is disposed on the semiconductor chip CHIP3, respectively.

FIG. 9 illustrates an example of the reset selection unit RSEL illustrated in FIG. 8. The reset selection unit RSEL includes terminals RSTa, TRST, TRSTa, and TRSTb. In addition, the reset selection unit RSEL includes majority decision selection units MAJ20, MAJ22, MAJ23, MAJ30, MAJ32, MAJ33, and MAJ34, and OR circuits OR200, OR202, OR300, and OR302.

Terminals RSTa10 to RSTa12, TRST10 to TRST12, and TRSTa10 to TRSTa12 are disposed on a rear surface of the semiconductor chip CHIP1. Terminals RSTa20 to RSTa22, TRST20 to TRST22, and TRSTa20 to TRSTa22 are disposed on a front surface of the semiconductor chip CHIP2. The terminals RSTa10 to RSTa12, TRST10 to TRST12, and TRSTa10 to TRSTa12 are connected to the terminals RSTa20 to RSTa22, TRST20 to TRST22, and TRSTa20 to TRSTa22, respectively, through a bump and the like.

Terminals RSTb20 to RSTb22, TRST23 to TRST25, TRSTa23 to TRSTa25, and TRSTb20 to TRSTb22 are disposed on a rear surface of the semiconductor chip CHIP2. Terminals RSTb30 to RSTb32, TRST30 to TRST32, TRSTa30 to TRSTa32, and TRSTb30 to TRSTb32 are disposed on a front surface of the semiconductor chip CHIP3. The terminals RSTb20 to RSTb22 are connected to the terminals RSTb30 to RSTb32, respectively, through a bump and the like. In addition, the terminals TRST23 to TRST25, TRSTa23 to TRSTa25, and TRSTb20 to TRSTb22 are connected to the terminals TRST30 to TRST32, TRSTa30 to TRSTa32, and TRSTb30 to TRSTb32, respectively, through a bump and the like.

The majority decision selection units MAJ20, MAJ22, and MAJ23, and the OR circuits OR200 and OR202 are disposed in the semiconductor chip CHIP2. The majority decision selection units MAJ20, MAJ22, and MAJ23 are the same as or similar to the majority decision selection unit MAJ20 illustrated in FIG. 2.

The majority decision selection unit MAJ20 receives reset signals TRST1, which are transmitted to the three terminals TRST20 to TRST22, as three input signals. In addition, the majority decision selection unit MAJ20 determines a logical value of a reset signal TRST1, which is transmitted to the OR circuits OR200 and OR202, and the terminals TRST23 to TRST 25, among logical values of the three input signals (reset signals TRST1) on the basis majority decision logic.

In addition, the terminals TRST20 to TRST22 are connected to the terminals TRST10 to TRST12 through signal paths PT12 to PT14. In addition, the terminals TRST10 to TRST12 are connected to a test reset terminal TRST1, and the test unit TAPa1. That is, the reset signal TRST1, which is supplied to the test reset terminal TRST1, is transmitted to the terminals TRST10 to TRST12, and the test unit TAPa1.

The majority decision selection unit MAJ22 receives reset signals RSTa, which are transmitted to the three terminals RSTa20 to RSTa22, as three input signals. In addition, the majority decision selection unit MAJ22 determines a logical value of a reset signal RSTa, which is transmitted to the OR circuit OR200, among logical values of the three input signals (reset signals RSTa), based on majority decision logic. In addition, the terminals RSTa20 to RSTa22 are connected to the terminals RSTa10 to RSTa12 through signal paths PTr10 to PTr12, respectively. In addition, the terminals RSTa10 to RSTa12 receive a reset signal RSTa that is generated in the test unit TAPa1.

The majority decision selection unit MAJ23 receives reset signals TRSTa, which are transmitted to the three terminals TRSTa20 to TRSTa22, as three input signals. In addition, the majority decision selection unit MAJ23 determines a logical value of a reset signal TRSTa, which is transmitted to the OR circuit OR202 and the terminals TRSTa23 to TRSTa25, among logical values of the three input signals (reset signals TRSTa) based on majority decision logic. In addition, the terminals TRSTa20 to TRSTa22 are connected to the terminals TRSTa10 to TRSTa12 through signal paths PTr13 to PTr15, respectively. In addition, the terminals TRSTa10 to TRSTa12 receive a reset signal TRSTa that is generated in the test unit TAPa1.

The OR circuit OR200 operates a logical sum of the reset signal TRST1 that is received from the majority decision selection unit MAJ20, and the reset signal RSTa that is received from the majority decision selection unit MAJ22, and outputs an operation result to the clock detection unit DET2 as the reset signal RST2.

The OR circuit OR202 operates a logical sum of the reset signal TRST1 that is received from the majority decision selection unit MAJ20, and the reset signal TRSTa that is received from the majority decision selection unit MAJ23, and outputs an operation result to the test unit TAPa2 as a reset signal TRST2.

The majority decision selection units MAJ30, MAJ32, MAJ33, and MAJ34, and the OR circuits OR300 and OR302 are disposed in the semiconductor chip CHIP3. The majority decision selection units MAJ30, MAJ32, MAJ33, and MAJ34 are the same as or similar to the majority decision selection unit MAJ30 illustrated in FIG. 2.

The majority decision selection unit MAJ30 receives reset signals TRST1, which are transmitted to the three terminals TRST30 to TRST32, as three input signals. In addition, the majority decision selection unit MAJ30 determines a logical value of a reset signal TRST1, which is transmitted to the OR circuits OR300 and OR302, among logical values of the three input signals (reset signals TRST1) based on majority decision logic. In addition, the terminals TRST30 to TRST32 are connected to the terminals TRST23 to TRST25 through signal paths PT22 to PT24, respectively.

The majority decision selection unit MAJ32 receives reset signals RSTb, which are transmitted to the three terminals RSTb30 to RSTb32, as three input signals. In addition, the majority decision selection unit MAJ32 determines a logical value of a reset signal RSTb, which is transmitted to the OR circuit OR300, among logical values of the three input signals (reset signals RSTb) based on majority decision logic. In addition, the terminals RSTb30 to RSTb32 are connected to the terminals RSTb20 to RSTb22 through signal paths PTr16 and PTr17. In addition, the terminals RSTb20 to RSTb22 receive the reset signal RSTb that is generated in the test unit TAPa2.

The majority decision selection unit MAJ33 receives reset signals TRSTa, which are transmitted to the three terminals TRSTa30 to TRSTa32, as three input signals. In addition, the majority decision selection unit MAJ33 determines a logical value of a reset signal TRSTa, which is transmitted to the OR circuits OR300 and OR302, among logical values of the three input signals (reset signals TRSTa) based on majority decision logic. In addition, the terminals TRSTa30 to TRSTa32 are connected to the terminals TRSTa 23 to TRSTa25 through signal paths PTr19 to PTr21, respectively.

The majority decision selection unit MAJ34 receives reset signals TRSTb, which are transmitted to the three terminals TRSTb30 to TRSTb32, as three input signals. In addition, the majority decision selection unit MAJ34 determines a logical value of a reset signal TRSTb, which is transmitted to the OR circuit OR302, among logical values of the three input signals (reset signals TRSTb) based on majority decision logic. In addition, the terminals TRSTb30 to TRSTb32 are connected to the terminals TRSTb20 to TRSTb22 through signal paths PTr22 to PTr24, respectively. In addition, the terminals TRSTb20 to TRSTb22 receive a reset signal TRSTb that is generated in the test unit TAPa2.

The OR circuit OR300 operates a logical sum of the reset signal TRST1 that is received from the majority decision selection unit MAJ30, the reset signal RSTa that is received from the majority decision selection unit MAJ32, and the reset signal TRSTa that is received from the majority decision selection unit MAJ33. In addition, the OR circuit OR300 outputs an operation result to the clock detection unit DET3 as the reset signal RST3.

The OR circuit OR302 operates a logical sum of the reset signal TRST1 that is received from the majority decision selection unit MAJ30, the reset signal TRSTa that is received from the majority decision selection unit MAJ33, and the reset signal TRSTb that is received from the majority decision selection unit MAJ34. In addition, the OR circuit OR302 outputs an operation result to the test unit TAPa3 as a reset signal TRST3.

As described above, the test circuit TESC2 can separately control reset with respect to the clock detection unit DET, and reset with respect to the test unit TAPa.

In addition, the configuration of the reset selection unit RSEL is not limited to the example illustrated in FIG. 9. For example, in a case where a semiconductor chip CHIP is disposed on the semiconductor chip CHIP3, the semiconductor chip CHIP3 transmits the reset signals TRST1 and the like to the semiconductor chip CHIP, which is disposed on the semiconductor chip CHIP3, in a similar manner as in the semiconductor chip CHIP2. Examples of the reset signal, which is transmitted to the semiconductor chip CHIP that is disposed on the semiconductor chip CHIP3, include two reset signals which are generated in the test unit TAPa3, and the reset signals TRST1, TRSTa, and TRSTb.

In addition, the reset selection unit RSEL may transmit an output signal (reset signal TRST2) of the OR circuit OR202 instead of an output signal (reset signal TRST1) of the majority decision selection unit MAJ20 to the terminals TRST23 to TRST25. In this case, the majority decision selection unit MAJ33, the terminals TRSTa23 to TRSTa25, TRSTa30 to TRSTa32, and the like are omitted. Accordingly, it is possible to reduce the signal path PT between the semiconductor chips CHIP. For example, in a case where four semiconductor chips CHIP are stacked, examples of a reset signal, which is transmitted to a semiconductor chip CHIP disposed on the semiconductor chip CHIP3, include two reset signals which are generated in the test unit TAPa3, and the reset signal TRST3.

FIG. 10 illustrates an example of a reset state of the test circuit TESC2 illustrated in FIG. 8. In addition, FIG. 10 illustrates an example of a reset state of the semiconductor chips CHIP1 and CHIP2. In addition, items of the reset signals TRST1, RSTa, and TRSTa which are illustrated in FIG. 10 illustrate an example of logical values of the reset signals TRST1, RSTa, and TRSTa at respective reset states. A symbol "–" in FIG. 10 represents either a logical value "0" or a logical value "1". In addition, in FIG. 10, the logical value "0" represents reset release, and the logical value "1" represents reset. The logical values of the reset signals RSTa and TRSTa which are illustrated in FIG. 10 are set by a TAP controller in the test unit TAPa1.

In a first reset state, the reset signal TRST1 is set to a logical value "1", and all of the semiconductor chips CHIP are reset.

In a second reset state, the reset signal TRST1 is set to a logical value "0", and reset with respect to the semiconductor chip CHIP1 is released. In addition, in the second reset state, both of the clock detection unit DET2 and the test unit TAPa2 of the semiconductor chip CHIP2 are reset. For example, in a case where a mode of the TAP controller in the test unit TAPa1 is set to a mode including the second reset state, both of the reset signals RSTa and TRSTa are set to a logical value "1".

In a third reset state, the reset signal TRST1 is set to a logical value "0", and reset with respect to the semiconductor chip CHIP1 is released. In addition, in the third reset state, reset with respect to the clock detection unit DET2 of the semiconductor chip CHIP2 is released, and the test unit TAPa2 of the semiconductor chip CHIP2 is reset. For example, in a case where the mode of the TAP controller in the test unit TAPa1 is set to a mode including the third reset state, the reset signals RSTa and TRSTa are set to a logical value "0" and a logical value "1", respectively.

In a fourth reset state, the reset signal TRST1 is set to a logical value "0", and reset with respect to the semiconductor chip CHIP1 is released. In addition, in the fourth reset state, reset with respect to both of the clock detection unit DET2 and the test unit TAPa2 of the semiconductor chip CHIP2 is released. For example, in a case where of the TAP controller in the test unit TAPa1 is set to a mode including the fourth reset state, both of the reset signals RSTa and TRSTa are set to a logical value "0".

In addition, in a case where the reset signals TRST1, RSTa, and TRSTa are set to a logical value "0", a reset state of the semiconductor chip CHIP3 is set in accordance with a mode of a TAP controller in the test unit TAPa2 of the semiconductor chip CHIP2. Hereinafter, description will be given of an example of a reset state of the semiconductor chip CHIP3 in a case where the reset signals TRST1, RSTa, and TRSTa are set to a logical value "0".

In a case where the mode of the TAP controller in the test unit TAPa2 is set to a mode including the second reset state, both of the reset signals RSTb and TRSTb are set to a logical value "1". In this case, reset with respect to the semiconductor chips CHIP1 and CHIP2 is released, and both of the clock detection unit DET2 and the test unit TAPa2 of the semiconductor chip CHIP3 is reset.

In addition, in a case where the mode of the TAP controller in the test unit TAPa2 is set to a mode including the third reset state, the reset signals RSTb and TRSTb are set to a logical value "0" and a logical value "1", respectively. In this case, reset with respect to the clock detection unit DET3 of the semiconductor chip CHIP3 is released, and the test unit TAPa3 of the semiconductor chip CHIP3 is reset.

In a case where the mode of the TAP controller in the test unit TAPa2 is set to a mode including the fourth reset state, both of the reset signals RSTb and TRSTb are set to a logical value "0". In this case, reset with respect to both of the clock detection unit DET2 and the test unit TAPa2 of the semiconductor chip CHIP3 is released. That is, reset with respect to all of the semiconductor chips CHIP1, CHIP2, and CHIP3 is released.

Figure 11:
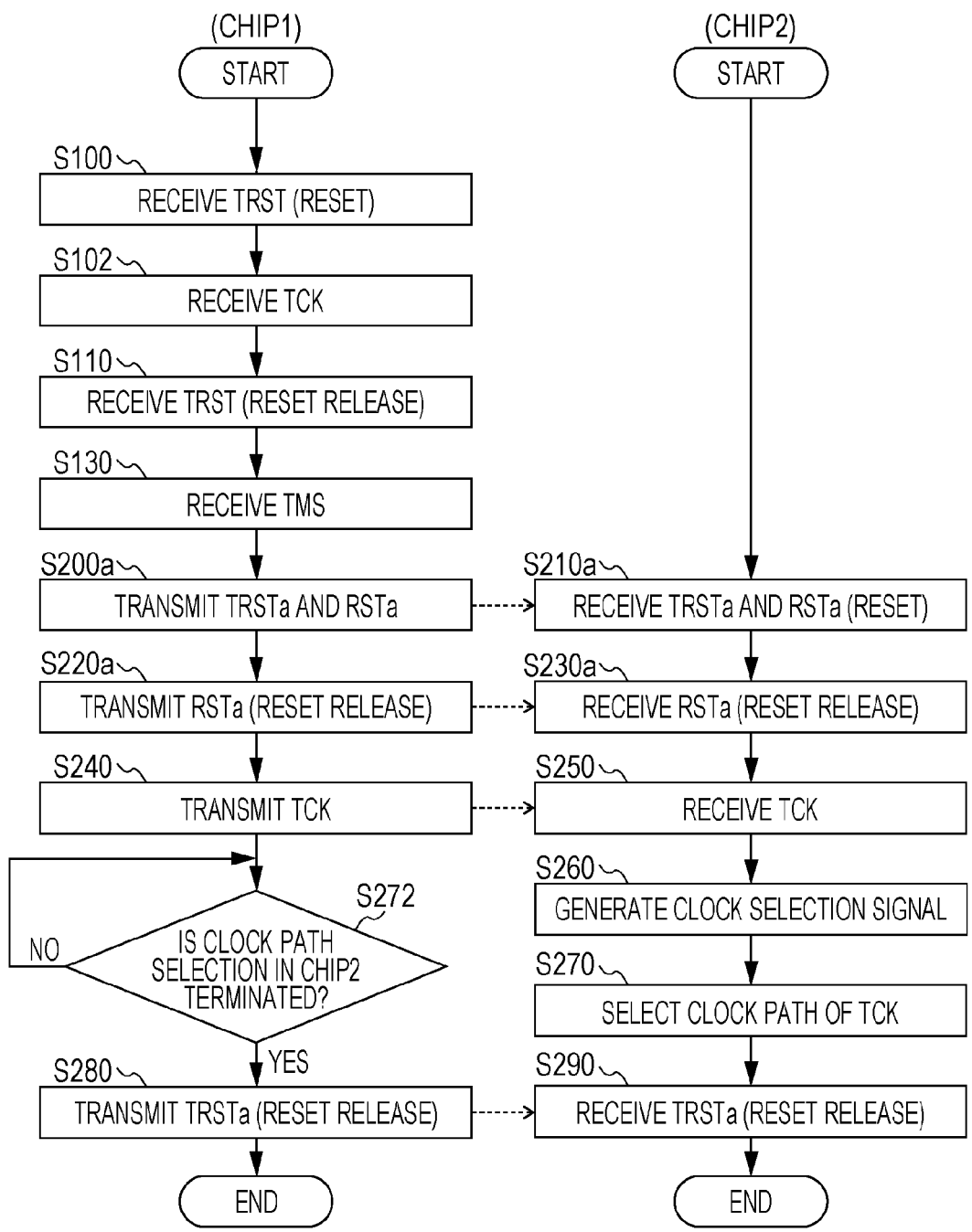
FIG. 11 is a diagram illustrating an example of a method of controlling the test circuit illustrated in FIG. 8.

FIG. 11 illustrates an example of a method of controlling the test circuit TESC2 illustrated in FIG. 8. In addition, FIG. 11 illustrates an example of the method of controlling the test circuit TESC2 when setting the clock path PTc between the semiconductor chips CHIP1 and CHIP2. Steps S100 to S130, S200a, S220a, S240, S272, and S280 in FIG. 11 represent the operation of the test circuit TESC2 that is included in the semiconductor chip CHIP1. In addition, steps S210a, S230a, S250, S260, S270, and S290 represent the operation of the test circuit TESC2 that is included in the semiconductor chip CHIP2. For example, the operation illustrated in FIG. 11 is controlled by a test device that tests the semiconductor device SEM2.

In the operation illustrated in FIG. 11, processes in steps S200a, S210a, S220a, and S230a are carried out instead of the processes in steps S200, S210, S220, and S230 in FIG. 7. In addition, in the operation illustrated in FIG. 11, a process (reset release) in step S110 is carried out after the process (clock supply) in step S120 illustrated in FIG. 7 (in FIG. 11, step S102), and steps S280 and S290 are added to the operation illustrated in FIG. 7. The same or similar symbols will be given to operations which are the same as or similar to the operations described in FIG. 7, and detailed description thereof will not be repeated.

In step S100, the semiconductor chip CHIP1 receives the reset signal TRST1, which resets the state of the semiconductor chips CHIP1, CHIP2, and CHIP3, by the test reset terminal TRST1. According to this, the semiconductor chips CHIP1, CHIP2, and CHIP3 are reset.

In step S102, the semiconductor chip CHIP1 receives the test clock TCK, which is supplied from the test device, by the test clock terminal TCK1.

In step S110, the semiconductor chip CHIP1 receives the reset signal TRST, which releases reset, by the test reset terminal TRST1. According to this, reset with respect to the semiconductor chips CHIP1, CHIP2, and CHIP3 is released.

In step S130, the semiconductor chip CHIP1 receives the test mode select TMS, which is supplied from the test device, by a test mode select terminal TMS1.

In step S200a, the test unit TAPa1 of the semiconductor chip CHIP1 transmits the reset signals TRSTa and RSTa, which respectively reset states of the test unit TAPa2 and the clock control unit DET2 of the semiconductor chip CHIP2, to the semiconductor chip CHIP2.

For example, the test device sets the mode of the TAP controller in the test unit TAPa1 of the semiconductor chip CHIP1 to a mode including the second reset state illustrated in FIG. 10 by using the test mode select TMS. According to this, the reset signal TRSTa, which resets the state of the test unit TAPa2 of the semiconductor chip CHIP2, is transmitted from the semiconductor chip CHIP1 to the semiconductor chip CHIP2 through the signal paths PTr13, PTr14, and PTr15. In addition, the signal RSTa, which resets the state of the clock control unit DET2 of the semiconductor chip CHIP2, is transmitted from the semiconductor chip CHIP1 to the semiconductor chip CHIP2 through the signal paths PTr10, PTr11, and PTr12.

In step S210a, the semiconductor chip CHIP2 receives the reset signals TRSTa and RSTa, which reset states of the test unit TAPa2 and the clock control unit DET2, respectively, from the semiconductor chip CHIP1.

According to this, the majority decision selection unit MAJ23 of the semiconductor chip CHIP2 receives reset signals TRSTa which are transmitted through the three signal paths PTr13, PTr14, and PTr15, respectively. In addition, the majority decision selection unit MAJ23 determines a logical value of a signal, which is transmitted to the OR circuit OR202, among logical values of the reset signals TRSTa which are transmitted through the three signal paths PTr13, PTr14, and PTr15, respectively, based on majority decision logic. According to this, the test unit TAPa2 of the semiconductor chip CHIP2 is reset.

In addition, the majority decision selection unit MAJ22 of the semiconductor chip CHIP2 receives the reset signals RSTa which are transmitted through the three signal paths PTr10, PTr11, and PTr12, respectively. In addition, the majority decision selection unit MAJ22 determines a logical value of a signal, which is transmitted to the OR circuit OR200, among logical values of the reset signals RSTa which are transmitted through the three signal paths PTr10, PTr11, and PTr12, respectively, based on a majority decision basis. According to this, the clock control unit DET2 of the semiconductor chip CHIP2 is reset.

In step S220a, the test unit TAPa1 of the semiconductor chip CHIP1 transmits the reset signal RSTa, which releases reset with respect to the clock control unit DET2 of the semiconductor chip CHIP2, to the semiconductor chip CHIP2.

For example, the test device sets the mode of the TAP controller in the test unit TAPa1 of the semiconductor chip CHIP1 to a mode including the third reset state illustrated in FIG. 10 by using the test mode select TMS. According to this, the reset signal RSTa, which releases reset with respect to the clock control unit DET2 of the semiconductor chip CHIP2, is transmitted from the semiconductor chip CHIP1 to the semiconductor chip CHIP2 through the signal path PTr10, PTr11, and PTr12. In addition, the reset signal TRSTa is retained to a state (for example, a logical value "1") of resetting the state of the test unit TAPa2 of the semiconductor chip CHIP2.

In step S230a, the semiconductor chip CHIP2 receives the reset signal RSTa, which releases reset with respect to the clock control unit DET2, from the semiconductor chip CHIP1. According to this, the majority decision selection unit MAJ22 of the semiconductor chip CHIP2 receives reset signals RSTa which are transmitted through the three signal paths PTr10, PTr11, and PTr12, respectively. In addition, the majority decision selection unit MAJ22 determines a logical value of a signal, which is transmitted to the OR circuit OR200, among logical values of the reset signals RSTa which are transmitted through the three signal paths PTr10, PTr11, and PTr12, respectively, based on majority decision logic.

According to this, reset with respect to the clock control unit DET2 of the semiconductor chip CHIP2 is released. That is, the process of resetting the state of the clock control unit DET2 is terminated. In addition, reset with respect to the test unit TAPa2 of the semiconductor chip CHIP2 continues.

In step S240, the semiconductor chip CHIP1 transmits the test clock TCK, which is supplied to the test clock terminal TCK1, to the semiconductor chip CHIP2 by using a plurality of clock paths PTc10 and PTc11.

In step S250, the semiconductor chip CHIP2 receives the test clock TCK, which is transmitted from the semiconductor chip CHIP1, by terminals TCK20 and TCK21.

In step S260, the clock detection unit DET2 of the semiconductor chip CHIP2 generates a clock selection signal CS2.

In step S270, the clock path selection unit SELc2 of the semiconductor chip CHIP2 selects the clock path PTc through which the test clock TCK, of which the number of clocks reaches a predetermined number, is transmitted. According to this, the test clock TCK is supplied to the test unit TAPa2 of the semiconductor chip CHIP2.

In step S272, the test unit TAPa1 of the semiconductor chip CHIP1 waits carrying out of step S280 until clock path selection by the clock path selection unit SELc2 of the semiconductor chip CHIP2 (step S270) is terminated. For example, the test device waits transmission of the test mode select TMS until the number of clocks (the number of clocks after reset) of the test clock TCK, which is supplied to the test clock terminal TCK1, reaches a predetermined number.

In step S280, the test unit TAPa1 of the semiconductor chip CHIP1 transmits the reset signal TRSTa, which releases reset with respect to the test unit TAPa2 of the semiconductor chip CHIP2, to the semiconductor chip CHIP2.

For example, after the number of clocks of the test clock TCK reaches a predetermined number, the test device sets the mode of the TAP controller in the test unit TAPa1 of the semiconductor chip CHIP1 to a mode including the fourth reset state illustrated in FIG. 10 by using the test mode select TMS.

According to this, the reset signal TRSTa, which releases reset with respect to the test unit TAPa2 of the semiconductor chip CHIP2, is transmitted from the semiconductor chip CHIP1 to the semiconductor chip CHIP2 through the signal paths PTr13, PTr14, and PTr15. In addition, the reset signal RSTa is retained to a state (for example, a logical value "0") of releasing reset with respect to the clock detection unit DET2 of the semiconductor chip CHIP2.

In step S290, the semiconductor chip CHIP2 receives the reset signal TRSTa, which releases reset with respect to the test unit TAPa2, from the semiconductor chip CHIP1. According to this, the majority decision selection unit MAJ23 of the semiconductor chip CHIP2 receives the reset signals TRSTa which are transmitted through the three signal paths PTr13, PTr14, and PTr15, respectively.

In addition, the majority decision selection unit MAJ23 determines a logical value of a signal, which is transmitted to the OR circuit OR202, among logical values of the reset signals TRSTa which are transmitted through the three signal paths PTr13, PTr14, and PTr15, respectively, based on majority decision logic. According to this, reset with respect to the test unit TAPa2 of the semiconductor chip CHIP2 is released. That is, the process of resetting the state of the test unit TAPa2 is terminated.

As described above, the semiconductor chip CHIP1 separately transmits the reset signal TRSTa that resets the test unit TAPa2, and the reset signal RSTa that resets the clock detection unit DET2 to the semiconductor chip CHIP2. According to this, the test circuit TESC2 can further shorten time, which is taken until the test clock TCK is supplied to the test unit TAPa2 after reset with respect to the test unit TAPa2 is released, in comparison to the test circuit TESC1.

Here, in a period in which reset of the test unit TAPa2 is released, in a case where the test clock TCK is not supplied to the test unit TAPa2, there is a concern that the operation of the test unit TAPa2 may be unstable. In the operation illustrated in FIG. 11, the test clock path PTc between the semiconductor chips CHIP1 and CHIP2 is set before reset of the test unit TAPa2 is released. That is, the test unit TAPa2 receives the test clock TCK before reset is released. According to this, in this embodiment, it is possible to avoid the operation of the test unit TAPa2 being unstable.

In addition, setting of the test clock path PTc between the semiconductor chips CHIP2 and CHIP3 is carried out, for example, after step S290. In this case, the test device carries out the same operations as in steps S200a, S220a, S240, S272, and S280 in the semiconductor chip CHIP2. In addition, the test device carries out the same operations as in steps S210a, S230a, S250, S260, S270, and S290 in the semiconductor chip CHIP3.

For example, as the same operation as in step S200a, the test device sets the mode of the TAP controller in the test unit TAPa2 of the semiconductor chip CHIP2 to a mode including the second reset state illustrated in FIG. 10 by using the test mode select TMS. In addition, the test device allows the test circuit TESC2 to sequentially carry out the same operations in step S210a, S220a, S230a, and S240 to S290. According to this, the test clock path PTc between the semiconductor chips CHIP2 and CHIP3 is set.

After the test clock path PTc between a plurality of semiconductor chips CHIP is set, the data TDI that tests the semiconductor device SEM2 is supplied to a test input terminal TDI1. In addition, the method of controlling the test circuit TESC2 is not limited to the example illustrated in FIG. 11.

As described above, even in the embodiment illustrated in FIG. 8 to FIG. 11, it is possible to obtain the same effect as in the embodiment illustrated in FIG. 2 to FIG. 7. For example, in this embodiment, even in a case where one of the clock paths PTc10 and PTc11, and one of the clock paths PTc20 and PTc21 fail, it is possible to carry out a test for detecting a failure site in the signal path between the semiconductor chips CHIP. According to this, it is possible to retrieve the failure by bypassing the failure site. As a result, in this embodiment, it is possible to improve a yield ratio of the semiconductor device SEM2.

In addition, in this embodiment, the test circuit TESC2 separately controls reset with respect to the clock detection unit DET, and reset with respect to the test unit TAPa. According to this, the test circuit TESC2 can supply the test clock TCK to the test unit TAPa before reset with respect to the test unit TAPa is released. As a result, in this embodiment, it is possible to avoid the operation of the test unit TAPa being unstable.

Figure 12:
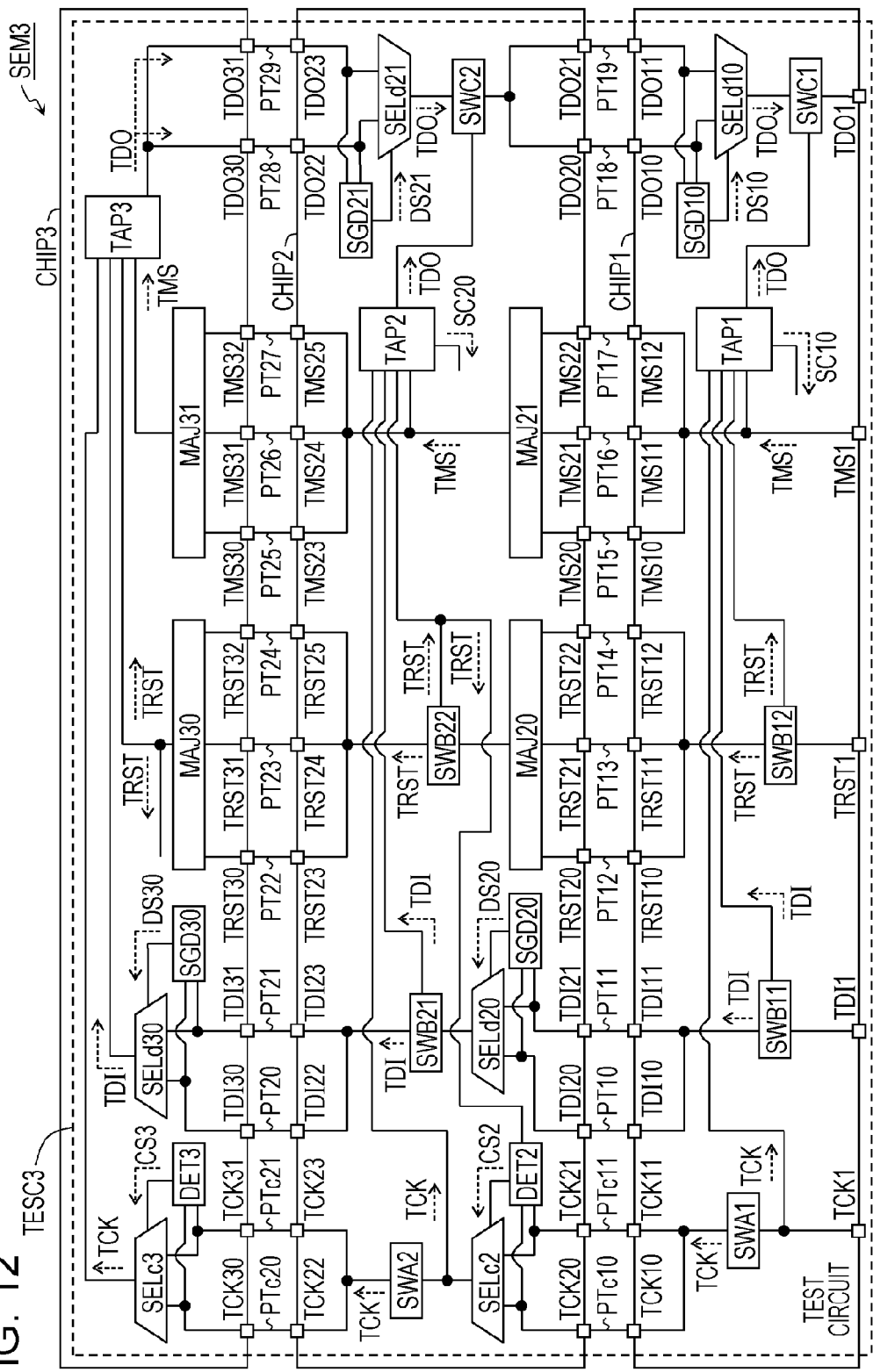
FIG. 12 is a diagram illustrating still another embodiment of the test circuit and the method of controlling the test circuit.

FIG. 12 illustrates still another embodiment of the test circuit and the method of controlling the test circuit. The same or similar symbols will be given to elements which are the same as or similar to those illustrated in FIG. 1 to FIG. 11, and details description thereof will not be repeated. A test circuit TESC3 tests a semiconductor device SEM3 including a plurality of semiconductor chips CHIP (CHIP1, CHIP2, and CHIP3). The semiconductor device SEM3 is the same as or similar to the semiconductor device SEM1 illustrated in FIG. 2 except that the semiconductor device SEM3 includes test circuit TESC3 instead of the test circuit TESC1 illustrated in FIG. 2.

In addition, in FIG. 12, description of a signal line between switching units SWA, SWB, and SWC and a test unit TAP of the semiconductor chips CHIP1 and CHIP2, a signal line between a majority decision selection unit MAJ30 and a clock detection unit DET3, and the like is omitted for easy comprehension of the drawing.

In the test circuit TESC3, a selection signal generation unit SGD (SGD10, SGD20, SGD21, SGD30), and a data path selection unit SELd (SELd10, SELd20, SELd21, SELd30) are added to the configuration of the test circuit TESC1 illustrated in FIG. 2. In addition, terminals TDI10, TDI20, TDI22, TDI30, TDO11, TDO21, TDO23, and TDO31 are added to the configuration of the test circuit TESC1 illustrated in FIG. 2. The other configurations of the test circuit TESC3 are the same as or similar to those of the test circuit TESC1 illustrated in FIG. 2.

For example, the test circuit TESC3 includes a functional block (clock detection unit DET, and the like) that is included in the test circuit TESC1 illustrated in FIG. 2, the selection signal generation unit SGD, and the data path selection unit SELd.

The terminals TDI10, TDI11, TDO10, and TDO11 are disposed on a rear surface of the semiconductor chip CHIP1. The terminals TDI20, TDI21, TDO20, and TDO21 are disposed on a front surface of the semiconductor chip CHIP2. The terminals TDI20, TDI21, TDO20, and TDO21 are connected to the terminals TDI10, TDI11, TDO10, and TDO11, respectively, through a bump and the like.

The terminals TDI22, TDI23, TDO22, and TDO23 are disposed on a rear surface of the semiconductor chip CHIP2. The terminals TDI30, TDI31, TDO30, and TDO31 are disposed on a front surface of the semiconductor chip CHIP3. The terminals TDI30, TDI31, TDO30, and TDO31 are connected to the terminals TDI20, TDI21, TDO20, and TDO21, respectively, through a bump and the like.

In addition, signal paths PT10 and PT11 between the semiconductor chips CHIP1 and CHIP2, and signal paths PT20 and PT21 between the semiconductor chips CHIP2 and CHIP3 are signal paths for test through which data TDI (test data) is transmitted. Signal paths PT18 and PT19 between the semiconductor chips CHIP1 and CHIP2, and signal paths PT28 and PT29 between the semiconductor chips CHIP2 and CHIP3 are signal paths for test through which data TDO (test data) is transmitted.

For example, the signal path PT10 between the terminals TDI10 and TDI20, and the signal path PT11 between the terminals TDI11 and TDI21 are test paths between the semiconductor chips CHIP1 and CHIP2 through which data TDI supplied to a test input terminal TDI1 is transmitted. In addition, the signal path PT20 between the terminals TDI22 and TDI30, and the signal path PT21 between the terminals TDI23 and TDI31 are test paths between the semiconductor chips CHIP2 and CHIP3 through which the data TDI supplied to the test input terminal TDI1 is transmitted. As described above, the test circuit TESC3 includes a plurality of the test paths PT10, PT11, PT20, and PT21 through which the data TDI supplied to the test input terminal TDI1 is redundantly transmitted.

Hereinafter, description will be given of the selection signal generation unit SGD, the data path selection unit SELd, and the like in the test circuit TESC3 for each of the semiconductor chips CHIP1, CHIP2, and CHIP3. First, description will be given of the selection signal generation unit SGD10, the data path selection unit SELd10, and a transmission destination switching unit SWB11 which are included in the semiconductor chip CHIP1.

Two input terminals of the selection signal generation unit SGD10 are connected to the terminals TDO10 and TDO11, respectively. That is, the selection signal generation unit SGD10 of the semiconductor chip CHIP1 is connected to the terminals TDO20 and TDO21 through the signal paths PT18 and PT19 of the semiconductor chip CHIP2.

For example, the selection signal generation unit SGD10 receives data TDO of the same logical value as an expected value, which is set in advance, from a test unit TAP2 of another semiconductor chip CHIP2 through the plurality of signal paths PT18 and PT19, and outputs a data selection signal DS10 to the data path selection unit SELd10.

For example, in a case where a failure occurs in the signal path PT19 between the plurality of signal paths PT18 and PT19, the selection signal generation unit SGD10 receives the data TDO of the same logical value as the expected value through the signal path PT18. In this case, the selection signal generation unit SGD10 generates a data selection signal DS10 that represents the signal path PT18, and outputs the data selection signal DS10 that is generated to a control terminal of the data path selection unit SELd10.

As described above, when receiving the data TDO, which represents the expected value through any one of the plurality of signal paths PT18 and PT19, the selection signal generation unit SGD10 generate the data selection signal DS10 that represents the signal path PT through which the data TDO representing the expected value is transmitted.

In addition, data TDO, which is transmitted from the semiconductor chip CHIP2 to the semiconductor chip CHIP1 when selecting the test path PT, is data TDI that is transmitted from the test input terminal TDI1 to the test unit TAP2 of the semiconductor chip CHIP2 through the semiconductor chip CHIP1 and the like. Accordingly, for example, the selection signal generation unit SGD10 receives the data TDO of the same logical value as the expected value that is set in advance from the test input terminal TDI1 through another semiconductor chip CHIP2 and the plurality of signal paths PT18 and PT19.

Two input terminals of the data path selection unit SELd10 are connected to the terminals TDO10 and TDO11, respectively. That is, the data path selection unit SELd10 is connected to the terminals TDO20 and TDO21 of the semiconductor chip CHIP2 through the signal path PT18 and PT19. An output terminal of the data path selection unit SELd10 is connected to one of two input terminals of the transmission data switching unit SWC1.

The data path selection unit SELd10 selects a signal path PT, which is used during test of the semiconductor device SEM3, between the plurality of signal path PT18 and PT19 based on the data selection signal DS10. For example, in a case where a failure occurs in the signal path PT19 between the plurality of signal paths PT18 and PT19, the data path selection unit SELd10 receives the data selection signal DS10, which represents the signal path PT18, from the selection signal generation unit SGD10.

In this case, the data path selection unit SELd10 selects the signal path PT18, which is represented by the data selection signal DS10, between the plurality of signal path PT18 and PT19, as the signal path PT between the semiconductor chips CHIP1 and CHIP2. For example, the data path selection unit SELd10 transmits the data TDO, which is received from the test unit TAP2 of another semiconductor chip CHIP2 through the signal path PT18, to the transmission data switching unit SWC1.

An input terminal of the transmission destination switching unit SWB11 is connected to the test input terminal TDI1. One of two output terminals of the transmission destination switching unit SWB11 is connected to the terminals TDI10 and TDI11, and the other of the two output terminals of the transmission destination switching unit SWB11 is connected to the test unit TAP1.

Next, description will be given of the selection signal generation units SGD20 and SGD21 which are included in the semiconductor chip CHIP2, the data path selection units SELd20 and SELd21, the transmission destination switching unit SWB21, and a transmission data switching unit SWC2.

The selection signal generation unit SGD20 is the same as or similar to the selection signal generation unit SGD10. For example, the selection signal generation unit SGD20 receives data TDI of the same logical value as the expected value that is set in advance from the test input terminal TDI1 through another semiconductor chip CHIP1 and the plurality of signal paths PT10 and PT11. In addition, the selection signal generation unit SGD20 outputs a data selection signal DS20 to the data path selection unit SELd20.

For example, in a case where a failure occurs in the signal path PT10 between the plurality of signal paths PT10 and PT11, the selection signal generation unit SGD20 receives data TDI of the same logical value as the expected value through the signal path PT11. In this case, the selection signal generation unit SGD20 generates the data selection signal DS20 that represents the signal path PT11, and outputs the data selection signal DS20 that is generated to a control terminal of the data path selection unit SELd20. As described above, when receiving the data TDI, which represents the expected value, through any one of the plurality of signal paths PT10 and PT11, the selection signal generation unit SGD20 generates data selection signal DS20 that represents the signal path PT through which the data TDI representing the expected value is transmitted.

The data path selection unit SELd20 is the same as or similar to the data path selection unit SELd10. For example, the data path selection unit SELd20 selects a signal path PT, which is used during test of the semiconductor device SEM3, between the plurality of signal paths PT10 and PT11 based on the data selection signal DS10.

Two input terminals of the data path selection unit SELd20 are connected to the terminals TDI20 and TDI21, respectively. That is, the data path selection unit SELd20 of the semiconductor chip CHIP2 is connected to the terminal TDI10 and TDI11 of the semiconductor chip CHIP1 through the signal paths PT10 and PT11. In addition, an output terminal of the data path selection unit SELd20 is connected to the transmission destination switching unit SWB21.

For example, in a case where a failure occurs in the signal path PT10 between the plurality of signal paths PT10 and PT11, the data path selection unit SELd20 receives the data selection signal DS20, which represents the signal path PT11, from the selection signal generation unit SGD20. In this case, the data path selection unit SELd20 selects the signal path PT11, which is represented by the data selection signal DS20 between the plurality of signal paths PT10 and PT11, as the signal path PT between the semiconductor chips CHIP1 and CHIP2. For example, the data path selection unit SELd20 transmits the data TDI, which is received from the test input terminal TDI1 through the signal path PT11, to the transmission destination switching unit SWB21.

The selection signal generation unit SGD21 is the same as or similar to the selection signal generation unit SGD10. Two input terminals of the selection signal generation unit SGD21 are connected to the terminals TDO22 and TDO23, respectively. That is, the selection signal generation unit SGD21 of the semiconductor chip CHIP2 is connected to the terminals TDO30 and TDO31 of the semiconductor chip CHIP3 through the signal paths PT28 and PT29. In addition, an output terminal of the selection signal generation unit SGD21 is connected to a control terminal of the data path selection unit SELd21.

The data path selection unit SELd21 is the same as or similar to the data path selection unit SELd10. Two input terminals of the data path selection unit SELd21 are connected to the terminals TDO22 and TDO23, respectively. That is, the data path selection unit SELd21 is connected to the terminal TDO30 and TDO31 of the semiconductor chip CHIP3 through the signal paths PT28 and PT29. In addition, an output terminal of the data path selection unit SELd21 is connected to an input terminal of the transmission data switching unit SWC2.

An input terminal of the transmission destination switching unit SWB21 is connected to the output terminal of the data path selection unit SELd20. One of two output terminals of the transmission destination switching unit SWB21 is connected to the terminals TDI22 and TDI23, and the other of the two output terminals of the transmission destination switching unit SWB21 is connected to the test unit TAP2.

One of two input terminals of the transmission data switching unit SWC2 is connected to the data path selection unit SELd21, and the other of the two input terminals of the transmission data switching unit SWC2 is connected to the test unit TAP2. In addition, an output terminal of the transmission data switching unit SWC2 is connected to the terminals TDO20 and TDO21.

Accordingly, in a case of the transmission destination switching units SWB of the semiconductor chips CHIP1 and CHIP2 are set to the passing state and the internal transmission state, respectively, the data TDI, which is supplied to the test input terminal TDI1, is transmitted to the test unit TAP2 of the semiconductor chip CHIP2. In addition, a signal TRST, which is supplied to a terminal TRST1, is transmitted to the test unit TAP2 of the semiconductor chip CHIP2.

In addition, the transmission destination switching units SWB of both of the semiconductor chips CHIP1 and CHIP2 are set to the passing state, the signals TDI and TRST, which are supplied to the terminals TDI1 and TRST1, are transmitted to the semiconductor chip CHIP3.

In addition, in a case where the transmission data switching units SWC of the semiconductor chips CHIP1 and CHIP2 are set to the passing state and the internal transmission state, respectively, data TDO, which is transmitted from the test unit TAP2 of the semiconductor chip CHIP2, is transmitted to the test output terminal TDO1. In addition, in a case where transmission data switching units SWC of both of the semiconductor chips CHIP1 and CHIP2 are set to the passing state, data TDO, which is transmitted from a test unit TAP3 of the semiconductor chip CHIP3, is transmitted to the test output terminal TDO1.

Next, description will be given of the selection signal generation unit SGD30, and the data path selection unit SELd30 which are included in the semiconductor chip CHIP3. The selection signal generation unit SGD30 and the data path selection unit SELd30 are the same as or similar to the selection signal generation unit SGD20 and the data path selection unit SELd20 of the semiconductor chip CHIP2.

Two input terminals of the selection signal generation unit SGD30 are connected to the terminals TDI30 and TDI31, respectively. That is, the selection signal generation unit SGD30 of the semiconductor chip CHIP3 is connected to the terminals TDI22 and TDI23 of the semiconductor chip CHIP2 through the signal paths PT20 and PT21. In addition, an output terminal of the selection signal generation unit SGD30 is connected to a control terminal of the data path selection unit SELd30.

Two input terminals of the data path selection unit SELd30 are connected to the terminals TDI30 and TDI31, respectively. That is, the data path selection unit SELd30 of the semiconductor chip CHIP3 is connected to the terminals TDI22 and TDI23 of the semiconductor chip CHIP2 through the signal paths PT20 and PT21. In addition, an output terminal of the data path selection unit SELd30 is connected to the test unit TAP3. The test unit TAP3 outputs the data TDO to the terminals TDO30 and TDO31.

The transmission data switching units SWC of both of the semiconductor chips CHIP1 and CHIP2 are set to the passing state, the data TDO, which is output from the test unit TAP3 of the semiconductor chip CHIP3, is transmitted to the test output terminal TDO1.

In a case where transmission destination switching units SWB of both of the semiconductor chips CHIP1 and CHIP2 are set to the passing state, the data TDI, which is supplied to the test input terminal TDI1, is transmitted to the test unit TAP3 of the semiconductor chip CHIP3. In addition, the signal TRST, which is supplied to the terminal TRST1, is transmitted to the test unit TAP3 of the semiconductor chip CHIP3.

In addition, the configuration of the test circuit TESC3 is not limited to the example illustrated in FIG. 12. For example, the clock path PTc (PTc10, PTc11, and the like), through which the test clock TCK received by the test clock terminal TCK1 is transmitted, may be made redundant by using three or more clock paths. In addition, the test path PT (PT10, PT11, and the like), through which the data received by the test input terminal TDI1 is transmitted, may be made redundant by three or more signal paths. In addition, for example, the test circuit TESC3 may be embedded in a semiconductor device SEM (the semiconductor device SEM3 from which the semiconductor chip CHIP2 is omitted) in which two semiconductor chips CHIP are stacked. Alternatively, the test circuit TESC3 may be embedded in a semiconductor device SEM in which four or more semiconductor chips CHIP are stacked.

Figure 13:
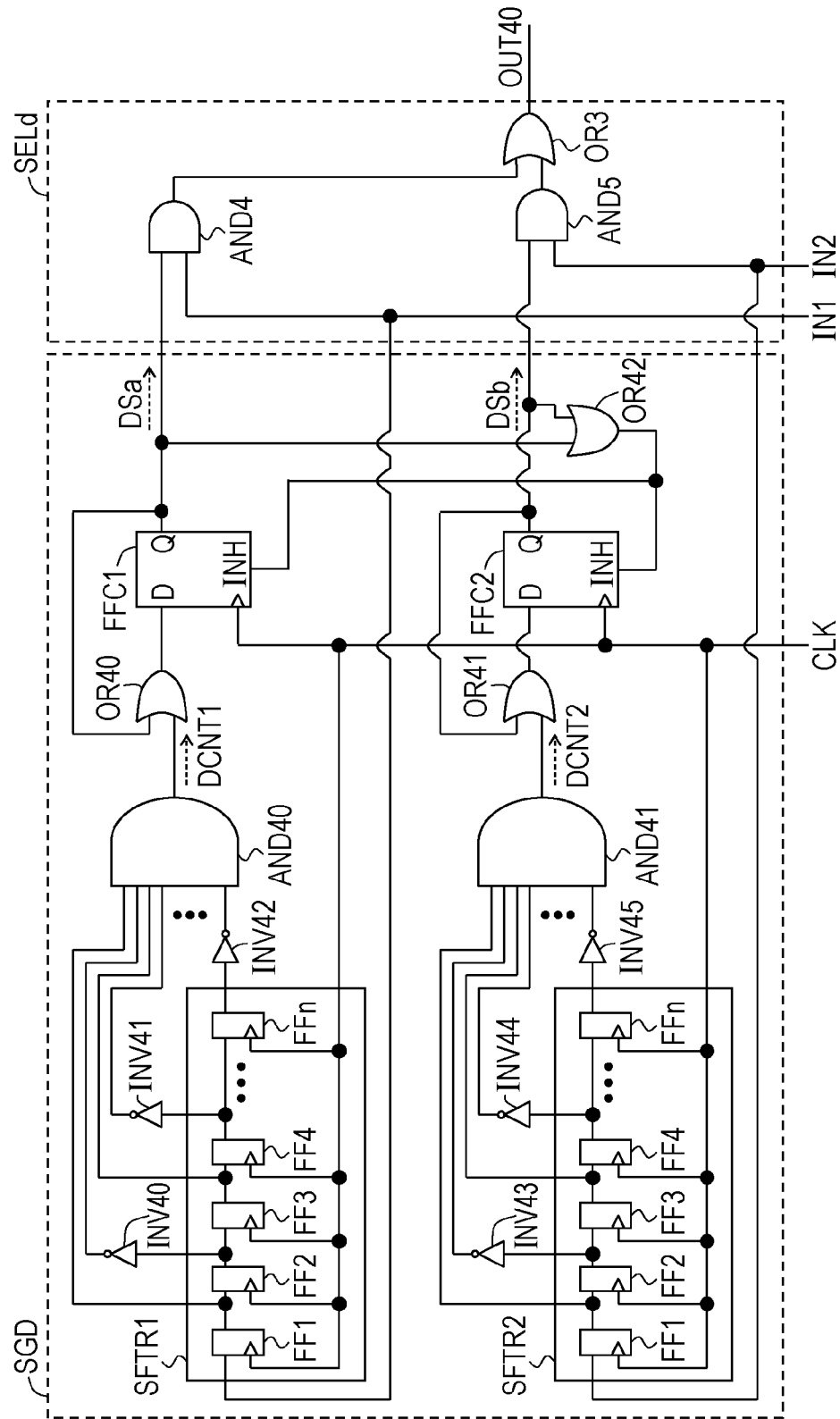
FIG. 13 is a diagram illustrating an example of data selection signal generation unit and a data path selection unit which are illustrated in FIG. 12.

FIG. 13 illustrates an example of the selection signal generation unit SGD and the data path selection unit SELd which are illustrated in FIG. 12. For example, a clock CLK, which is received by a terminal CLK illustrated in FIG. 13, is a test clock TCK (or a clock that is generated by the test clock TCK) that is received by a test clock terminal TCK1 illustrated in FIG. 12.

In addition, in the selection signal generation unit SGD20 and the data path selection unit SELd20 of the semiconductor chip CHIP2, terminals IN1 and IN2 are connected to the terminals TDI20 and TDI21, respectively. In the selection signal generation unit SGD30 and the data path selection unit SELd30 of the semiconductor chip CHIP3, the terminals IN1 and IN2 are connected to the terminals TDI30 and TDI31, respectively.

In addition, in the selection signal generation unit SGD21 and the data path selection unit SELd21 of the semiconductor chip CHIP2, the terminals IN1 and IN2 are connected to the terminals TDO22 and TDO23, respectively. In the selection signal generation unit SGD10 and the data path selection unit SELd10 of the semiconductor chip CHIP1, the terminals IN1 and IN2 are connected to the terminals TDO10 and TDO11, respectively.

In the data path selection unit SELd20 of the semiconductor chip CHIP2, a terminal OUT40 is connected to the transmission destination switching unit SWB21. In addition, in the data path selection unit SELd30 of the semiconductor chip CHIP3, the terminal OUT40 is connected to the test unit TAP3. In addition, in the data path selection unit SELd10 of the semiconductor chip CHIP1, the terminal OUT40 is connected to the transmission data switching unit SWC1. In the data path selection unit SELd21 of the semiconductor chip CHIP2, the terminal OUT40 is connected to the transmission data switching unit SWC2.

First, description will be given of the selection signal generation unit SGD between the selection signal generation unit SGD (SGD10, SGD20, SGD21, SGD30), and the data path selection unit SELd (SELd10, SELd20, SELd21, SELd30). The configuration and operation of the selection signal generation units SGD10, SGD21, and SGD30 are the same as or similar to those the selection signal generation unit SGD20, and thus description will be given of the selection signal generation unit SGD20.

The selection signal generation unit SGD20 includes n-bit shift registers SFTR1 and SFTR2 (n is an integer of two or greater), AND circuits AND40 and AND41, OR circuits OR40, OR41, and OR42, and flip-flop circuits FFC1 and FFC2. In addition, the selection signal generation unit SGD20 includes an inverter INV.

The shift registers SFTR (SFTR1 and SFTR2) store data (data transmitted to the terminals IN1 and IN2) through the plurality of signal paths PT. For example, the shift registers SFTR operate in synchronization with a clock CLK that is received by the terminal CLK, and sequentially store data that is transmitted to the terminals IN (IN1 and IN2).

Each of the shift registers SFTR includes n flip-flop circuits FF (FF1, FF2, FF3, FF4, . . . , and FFn) which operate in synchronization with the clock CLK that is received by the terminal CLK.

For example, an input terminal of the flip-flop circuit FF1 at an initial state of the shift register SFTR1 is connected to the terminal IN1, and an input terminal of the flip-flop circuit FF1 at initial stage of the shift register SFTR2 is connected to the input terminal IN2. An input terminal of each of the flip-flop circuits FF2, FF3, FF4, . . . , FFn is connected to an output terminal of a flip-flop circuit FF at an immediately previous stage.

In addition, an output terminal of the flip-flop circuit FF at an odd-numbered stage of the shift register SFTR1 is connected to an input terminal of the AND circuit AND40, and an output terminal of the flip-flop circuit FF at an even-numbered stage is connected to the input terminal of the AND circuit AND40 through the inverter INV. The inverter INV outputs a signal inverted from a signal that is received by an input terminal thereof. In an example in FIG. 13, output terminals of the flip-flop circuits FF2, FF4, and FFn of the shift register SFTR1 are connected to input terminals of inverters INV40, INV41, and INV42, respectively. In addition, in a case where the flip-flop circuit FFn at a final stage is the flip-flop circuit FF at an odd stage, an output terminal of the flip-flop circuit FFn is connected to the input terminal of the AND circuit AND40.

In addition, an output terminal of the flip-flop circuit FF at an odd-numbered stage of the shift register SFTR2 is connected to an input terminal of the AND circuit AND41, and an output terminal of the flip-flop circuit FF at an even-numbered stage is connected to the input terminal of the AND circuit AND41 through the inverter INV. In an example of FIG. 13, output terminals of the flip-flop circuits FF2, FF4, and FFn of the shift register SFTR2 are connected to input terminals of inverters INV43, INV44, and INV45, respectively. In addition, in a case where the flip-flop circuit FFn at a final stage is the flip-flop circuit FF at an odd stage, an output terminal of the flip-flop circuit FFn is connected to the input terminal of the AND circuit AND41.

The AND circuit AND (AND40, AND41) asserts a control signal DCNT (DCNT1, DCNT2) which corresponds to the signal path PT through which data representing the expected value is transmitted. For example, the AND circuit AND40 operates a logical product of data that is received by n input terminals, and outputs an operation result to an input terminal of the OR circuit OR40. In addition, the AND circuit AND41 operates a logical product of data that is received by n input terminals, and outputs an operation result to an input terminal of the OR circuit OR41.

In an example in FIG. 13, data, which represents the expected value, is n-bit data in which a logical value of an odd-numbered bit (output of the flip-flop circuit FF at an odd-numbered stage) is a logical value "1", and a logical value of an even-numbered bit (output of the flip-flop circuit FF at an even-numbered stage) is a logical value "0".

For example, in a case where outputs of the flip-flop circuits FF at an odd-numbered stage and an even-numbered stage of the shift register SFTR1 are a logical value "1" and a logical value "0", respectively, the AND circuit AND40 outputs a control signal DCNT1 of a logical value "1" to the OR circuit OR40. Similarly, in a case where outputs of the flip-flop circuits FF at the odd-numbered stage and the even-numbered stage of the shift register SFTR2 are a logical value "1" and a logical value "0", respectively, the AND circuit AND41 outputs a control signal DCNT2 of a logical value "1" to the OR circuit OR41.

The OR circuits OR40 and OR41 operate a logical sum of data that is received by two input terminals, and outputs an operation result. For example, the two input terminals of the OR circuit OR40 are connected to an output terminal of the AND circuit AND40 and an output terminal of the flip-flop circuit FFC1, respectively, and an output terminal of the OR circuit OR40 is connected to an input terminal of the flip-flop circuit FFC1. In addition, for example, the two input terminals of the OR circuit OR41 are connected to an output terminal of the AND circuit AND41 and an output terminal of the flip-flop circuit FFC2, respectively, and an output terminal of the OR circuit OR41 is connected to an input terminal of the flip-flop circuit FFC2.

Accordingly, in a case where data of a logical value "1" is stored in the flip-flop circuit FFC1, the OR circuit OR40 receives data of a logical value "1" from the flip-flop circuit FFC1. According to this, in a case where data of a logical value "1" is stored in the flip-flop circuit FFC1, the OR circuit OR40 outputs data of a logical value "1" to the flip-flop circuit FFC1 regardless of the logical value of a control signal DCNT1.

Similarly, in a case where data of a logical value "1" is stored in the flip-flop circuit FFC2, the OR circuit OR41 receives data of a logical value "1" from the flip-flop circuit FFC2. According to this, in a case where data of a logical value "1" is stored in the flip-flop circuit FFC2, the OR circuit OR41 outputs data of a logical value "1" to the flip-flop circuit FFC2 regardless of the logical value of the control signal DCNT2.

The flip-flop circuit FFC (FFC1 or FFC2) stores each logical value of a plurality of control signals DCNT (DCNT1 and DCNT2), and outputs data selection signal DSS (DSS1 or DSS2) based on the logical value which is stored. For example, the flip-flop circuit FFC operates in synchronization with the clock CLK, and stores data that is received by an input terminal thereof. In addition, in a case where a terminal INH receives a signal of a logical value "1", the flip-flop circuit FFC prohibits input of the clock CLK. That is, in a period in which the terminal INH receives a signal of a logical value "1", the logical value of the data that is stored in the flip-flop circuit FFC is not updated even in a case where the logical value of the data that is transmitted to the input terminal of the flip-flop circuit FFC varies.

The output terminal of the flip-flop circuit FFC1 is connected to the input terminals of the OR circuits OR40 and OR42, and an input terminal of AND circuit AND4. That is, a data selection signal DSa, which represents the logical value of the data stored in the flip-flop circuit FFC1 is transmitted to the OR circuits OR40 and OR42, and the AND circuit AND4. The output terminal of the flip-flop circuit FFC2 is connected to the input terminals of OR circuits OR41 and OR42, and an input terminal of an AND circuit AND5. That is, a data selection signal DSb, which represents the logical value of the data stored in the flip-flop circuit FFC2, is not transmitted to the OR circuits OR41 and OR42, and the AND circuit AND5.

In a case where a logical value of the control signal DCNT that is asserted is stored in a selection signal storage unit (for example, the flip-flop circuit FFC), the OR circuit OR42 suppresses updating of the logical value that is stored in the selection signal storage unit. For example, the OR circuit OR42 operates a logical sum of the data selection signals DSa and DSb which are received by two input terminals thereof, and outputs an operation result to the terminals INH of the flip-flop circuits FFC1 and FFC2. That is, in a case where data of a logical value "1" is stored in any one of the flip-flop circuits FFC1 and FFC2, the OR circuit OR42 suppresses updating of the logical value of the data that is stored in each of the flip-flop circuits FFC1 and FFC2.

For example, in a case where a failure occurs in the signal path PT10 that is connected to the terminal IN1 between the terminals IN1 and IN2, the control signal DCNT1 is retained in a negated state, and the control signal DCNT2 is asserted. In this case, data of a logical value "0" and data of a logical value "1" are stored in the flip-flop circuits FFC1 and FFC2, respectively. In addition, the OR circuits OR42 receives data selection signal DSa of a logical value of "0" from the flip-flop circuit FFC1, and receives data selection signal DSb of a logical value "1" from the flip-flop circuit FFC2. According to this, the OR circuit OR42 outputs the signal of a logical value "1" to the terminals INH of the flip-flop circuits FFC1 and FFC2.

In a period in which the OR circuit OR42 outputs a signal of a logical value "1" to the terminals INH of the flip-flop circuits FFC1 and FFC2, the flip-flop circuit FFC1 stops updating of the logical value "0" of data that is stored therein. Similarly, in a period in which the OR circuit OR42 outputs a signal of a logical value "1" to the terminals INH of the flip-flop circuits FFC1 and FFC2, the flip-flop circuit FFC2 stops updating of the logical value "1" of data that is stored therein.

According to this, the data selection signals DSa and DSb are retained to a logical value "0" and a logical value "1". That is, the selection signal generation unit SGD20 can avoid the logical value of the data selection signals DSa and DSb varying in accordance with a variation in data that is transmitted to the terminals IN1 and IN2 in a period after the data selection signal DS20, which represents the signal path PT through which data representing the expected value is transmitted, is generated. As described above, the selection signal generation unit SGD20 can stably supply the data selection signal DS20 (data selection signal DSa and DSb), which represents the signal path PT through which the data representing the expected value is transmitted, to the data path selection unit SELd20.

Next, description will be given of the data path selection unit SELd with reference to the data path selection unit SELd20 as an example. In addition, the configuration and operation of the data path selection units SELd10, SELd21, and SELd30 are the same as or similar to those of the data path selection unit SELd20. In addition, the data path selection unit SELd20 is the same as or similar to the clock path selection unit SELc illustrated in FIG. 3. For example, the data path selection unit SELd20 includes the AND circuits AND4 and AND5, and an OR circuit OR3.

Two input terminals of the AND circuit AND4 are connected to the output terminal of the terminal IN1 and the output terminal of the flip-flop circuit FFC1, respectively. For example, the AND circuit AND4 operates a logical product of the data selection signal DSa that is received from the flip-flop circuit FFC1 of the selection signal generation unit SGD, and data that is received from the terminal IN1, and outputs an operation result to the OR circuit OR3.

Two input terminals of the AND circuit AND5 are connected to the terminal IN2 and the output terminal of the flip-flop circuit FFC2, respectively. For example, the AND circuit AND5 operates a logical product of the data selection signal DSb that is received from the flip-flop circuit FFC2 of the selection signal generation unit SGD, and data that is received from the terminal IN2, and outputs an operation result to the OR circuit OR3.

The OR circuit OR3 operates a logical sum of the two pieces of data (output signals of the AND circuits AND4 and AND5) which are received by two input terminals thereof, and outputs an operation result to the terminal OUT40.

For example, in a case where a failure occurs in the signal path PT10 that is connected to the terminal IN1 between the terminals IN1 and IN2, the AND circuit AND4 receives the data selection signal DSa of a logical value "0" from the flip-flop circuit FFC1 of the selection signal generation unit SGD. According to this, the AND circuit AND4 outputs data of a logical value "0" to the OR circuit OR3 regardless of a logical value of data that is transmitted to the terminal IN1.

In addition, in a case where a failure occurs in the signal path PT10 that is connected to the terminal IN1 between the terminals IN1 and IN2, the AND circuit AND5 receives the data selection signal DSb of a logical value "1" from the flip-flop circuit FFC2 of the selection signal generation unit SGD. According to this, the AND circuit AND5 outputs data of the same logical value as that of data, which is transmitted to the terminal IN2, to the OR circuit OR3.

According to this, in a case where a failure occurs in the signal path PT10 that is connected to the terminal IN1 between the terminal IN1 and IN2, the OR circuit OR3 outputs data of the same logical value as that of data, which is transmitted to the terminal IN2, to the terminal OUT40.

In addition, the configuration of the selection signal generation unit SGD and the data path selection unit SELd is not limited to the example illustrated in FIG. 13. For example, the selection signal generation unit SGD may include a NOR circuit instead of the AND circuits AND40 and AND41. In this case, data, which represents the expected value, is n-bit data in which a logical value of an odd-numbered bit (output of the flip-flop circuit FF at an odd-numbered stage) is a logical value "0", and a logical value of an even-numbered bit (output of the flip-flop circuit FF at an even-numbered stage) is a logical value "1".

Alternatively, the selection signal generation unit SGD may include a NAND circuit that operates a negative logical product of the data selection signals DSa and DSb, and an AND circuit that operates a logical product of a result of the negative logical product of the data selection signals DSa and DSb, and the data selection signal DSb. In this case, the selection signal generation unit SGD outputs a result of the logical product of the result of the negative logical product of the data selection signals DSa and DSb, and the data selection signal DSb to the data path selection unit SELd instead of the data selection signal DSb. That is, in a case where a plurality of the signal paths PT, through which data representing the expected value is transmitted, exist, the selection signal generation unit SGD may generate the data selection signal DS that represents one of the plurality of signal paths PT through which the data representing the expected value is transmitted.

Figure 14:
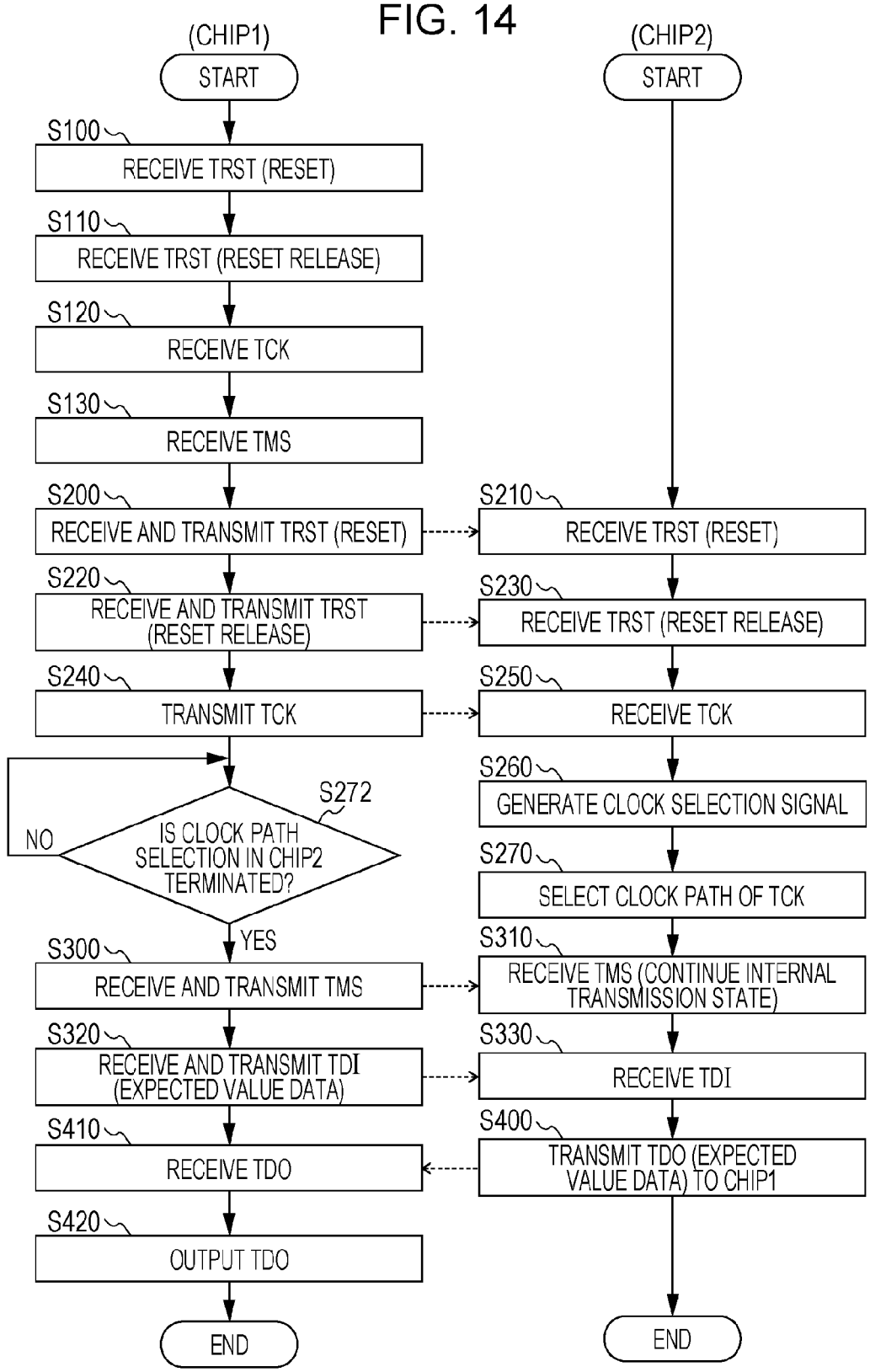
FIG. 14 is a diagram illustrating an example of a method of controlling a test circuit illustrated in FIG. 12.

FIG. 14 illustrates an example of a method of controlling the test circuit TESC3 illustrated in FIG. 12. In addition, FIG. 14 illustrates an example of the method of controlling the test circuit TESC3 when setting the clock path PTc and the test path PT between the semiconductor chips CHIP1 and CHIP2. Steps S100 to S130, S200, S220, S240, S272, S300, S320, S410, and S420 in FIG. 14 illustrate the operation of the test circuit TESC3 that is included in the semiconductor chip CHIP1. In addition, steps S210, S230, S250, S260, S270, S310, S330, and S400 represent the operation of the test circuit TESC3 that is included in the semiconductor chip CHIP2. For example, the operation illustrated in FIG. 14 is controlled by a test device that tests the semiconductor device SEM3. In addition, in the operation illustrated in FIG. 14, the initial state of the transmission destination switching unit SWB and the initial state of the transmission data switching unit SWC are set to the internal transmission state.

In the operation illustrated in FIG. 14, steps S272, S300 to S330, and S400 to S420 are added to the operation illustrated in FIG. 7. The same or similar symbols will be given to operations which are the same as or similar to the operations illustrated in FIG. 7, and detailed description thereof will not be repeated. As illustrated in FIG. 7, the test clock path PTc between the semiconductor chips CHIP1 and CHIP2 is set through the processes from step S100 to step S270.

In step S272, the test circuit TESC3, which is included in the semiconductor chip CHIP1, waits carrying out of step S300 until clock path selection (step S270) in the test circuit TESC3 included in the semiconductor chip CHIP2 is terminated. For example, the test device, which tests the semiconductor device SEM3, waits transmission of a test mode select TMS until the number of clocks (the number of clocks after reset) of the test clock TCK, which is supplied to the test clock terminal TCK1, reaches a predetermined number.

That is, the test device, which tests the semiconductor device SEM3, supplies the test mode select TMS to the test mode select terminal TMS1 after the number of clocks (the number of clocks after reset) of the test clock TCK, which is supplied to the test clock terminal TCK1, reaches a predetermined number. According to this, the test circuit TESC3 waits carrying out of step S300 until the test clock path PTc between the semiconductor chips CHIP1 and CHIP2 is set.

In step S300, the semiconductor chip CHIP1 receives the test mode select TMS, which is supplied from the test device, by the test mode select terminal TMS1. In addition, the semiconductor chip CHIP1 transmits the test mode select TMS, which is received from the test device, to the semiconductor chip CHIP2 by using three signal paths PT15, PT16, and PT17. According to this, in step S310, the semiconductor chip CHIP2 receives the test mode select TMS.

In step S310, the semiconductor chip CHIP2 receives the test mode select TMS by terminals TMS20, TMS21, and TMS22. According to this, a majority decision selection unit MAJ21 of the semiconductor chip CHIP2 receives the signal TMS which is transmitted through each of the three signal paths PT15, PT16, and PT17. In addition, the majority decision selection unit MAJ21 determines a logical value of a signal, which is transmitted to the test unit TAP2 and the like, among logical values of the signals TMS which are transmitted through the three signal paths PT15, PT16, and PT17 based on majority decision logic. According to this, the test mode select TMS is transmitted to the test unit TAP2 of the semiconductor chip CHIP2, and the state of the test unit TAP2 is determined.

For example, the test device sets the state of the test unit TAP2 of the semiconductor chip CHIP2 to a state for setting the test path PT between the semiconductor chips CHIP1 and CHIP2 by using the test mode select TMS. In addition, the state of the transmission destination switching unit SWB and the transmission data switching unit SWC of the semiconductor chip CHIP2 is retained to the internal transmission state.

According to this, the data TDI, which is received by a test input terminal TDI1 from the test device, is transmitted to the test unit TAP2 of the semiconductor chip CHIP2. In addition, the data TDI, which is transmitted to the test unit TAP2 of the semiconductor chip CHIP2, is transmitted to the test output terminal TDO1 as data TDO.

In step S320, the semiconductor chip CHIP1 receives the data TDI of the same logical value as the expected value by the test input terminal TDI1, and transmits the data TDI, which is received, to the semiconductor chip CHIP2 by using the two signal paths PT10 and PT11. For example, the test device alternately transmits data of a logical value "0" and data of a logical value "1" to the test input terminal TDI1. According to this, in a case where one of the signal paths PT10 and PT11 is normal, the semiconductor chip CHIP2 receives the data TDI of the same logical value as the expected value in step S330.

In step S330, the semiconductor chip CHIP2 receives the data TDI by terminals TDI20 and TDI21. According to this, the selection signal generation unit SGD20 of the semiconductor chip CHIP2 receives the data TDI that is transmitted through each of the two signal path PT10 and PT11. In addition, in a case where the data TDI, which is received through any one of the two signal paths PT10 and PT11, represents the expected value, the selection signal generation unit SGD20 generates the data selection signal DS20 that represents a signal path PT through which the data TDI representing the expected value is transmitted. For example, the selection signal generation unit SGD20 asserts a data selection signal DS, which corresponds to the signal path PT through which the data TDI representing the expected value is transmitted, between the data selection signals DSa and DSb illustrated in FIG. 13.

In addition, the data path selection unit SELd20 of the semiconductor chip CHIP2 selects a signal path PT, which is used when testing the semiconductor device SEM3, between the signal path PT10 and PT11 based on the data selection signal DS20 that is received from the selection signal generation unit SGD20. For example, the data path selection unit SELd20 selects the signal path PT that corresponds to the data selection signal DS (the data selection signal DSa or the data selection signal DSb) that is asserted. According to this, the test path PT between the semiconductor chips CHIP1 and CHIP2 when transmitting the data TDI is set.

Since the test path PT when transmitting the data TDI is set, the data TDI (data TDI representing the expected value), which is transmitted from the semiconductor chip CHIP1, is transmitted to the test unit TAP2 of the semiconductor chip CHIP2.

In step S400, the semiconductor chip CHIP2 transmits the data TDI (data TDI representing the expected value), which is transmitted to the test unit TAP2 of the semiconductor chip CHIP2, to the semiconductor chip CHIP1 as data TDO by using the two signal paths PT18 and PT19. According to this, in a case where any one of the signal paths PT18 and PT19 is normal, in step S410, the semiconductor chip CHIP1 receives the data TDO of the same logical value as the expected value.

In step S410, the semiconductor chip CHIP1 receives the data TDO by the terminals TDO10 and TDO11. According to this, the selection signal generation unit SGD10 of the semiconductor chip CHIP1 receives the data TDO that is transmitted through each of the two signal paths PT18 and PT19. In addition, in a case where the data TDO, which is received through any one of the two signal paths PT18 and PT19, represents the expected value, the selection signal generation unit SGD10 generates the data selection signal DS10 that represents the signal path PT through which the data TDO representing the expected value is transmitted. For example, the selection signal generation unit SGD10 asserts a data selection signal DS corresponding to the signal path PT through which the data TDO representing the expected value between the data selection signals DSa and DSb is transmitted.

In addition, the data path selection unit SELd10 of the semiconductor chip CHIP1 selects a signal path PT, which is used during test of the semiconductor device SEM3, between the signal path PT18 and PT19 based on the data selection signal DS10 that is received from the selection signal generation unit SGD10. For example, the data path selection unit SELd10 selects the signal path PT that corresponds to the data selection signal DS that is asserted. According to this, the test path PT between the semiconductor chips CHIP1 and CHIP2 when transmitting the data TDO is set. Since the test path PT when transmitting the data TDO is set, the data TDO, which is transmitted from the semiconductor chip CHIP2, is transmitted to the test output terminal TDO1.

In step S420, the semiconductor chip CHIP1 outputs the data TDO, which is received from the semiconductor chip CHIP2, to the test device through the test output terminal TDO1.

According to this, the test path PT between the semiconductor chips CHIP1 and CHIP2 is set. In addition, for example, setting of the test path PT between the semiconductor chips CHIP2 and CHIP3 is carried out after step S420. For example, the test device controls the test unit TAP2 by using the test mode select TMS to set the transmission destination switching unit SWB and the transmission data switching unit SWC of the semiconductor chip CHIP2 to the passing state.

In addition, the test device carries out the same operations as in steps S200, S220, S240, S272, S300, S320, and S410 in the semiconductor chips CHIP1 and CHIP2. In addition, the test device carries out the same operations as in steps S210, S230, S250, S260, S270, S310, S330, and S400 in the semiconductor chip CHIP3. According to this, the test clock path PTc and the test path PT between the semiconductor chips CHIP2 and CHIP3 are set.

In addition, the method of controlling the test circuit TESC3 is not limited to the example illustrated in FIG. 14.

For example, after the test path PT of the data TDI between the semiconductor chips CHIP1 and CHIP2 is set, the test path PT of the data TDI between the semiconductor chips CHIP2 and CHIP3 may be set before the test path of the data TDO is set. Alternatively, after the test path PT between the semiconductor chips CHIP1 and CHIP2 is set, the test using the test unit TAP2 of the semiconductor chip CHIP2 may be carried out before the test path between the semiconductor chips CHIP2 and CHIP3 is set.

As described above, even in the embodiment illustrated in FIG. 12 to FIG. 14, it is possible to obtain the same effect as in the embodiment illustrated in FIG. 2 to FIG. 7. For example, in this embodiment, even in a case where one of the clock paths PTc10 and PTc11, and one of the clock paths PTc20 and PTc21 fail, it is possible to carry out the test for detecting a failure site in the signal path between the semiconductor chips CHIP. According to this, it is possible to retrieve the failure by bypassing the failure site. As a result, in this embodiment, it is possible to improve a yield ratio of the semiconductor device SEM3.

In addition, in this embodiment, even in a case where one of the redundant signal paths PT (for example, a pair of two signal paths PT) through which the data received by the test input terminal TDI1 is transmitted fails, it is possible to carried out test for detecting a failure site in the signal path between the semiconductor chips CHIP. According to this, in this embodiment, it is possible to improve a yield ratio of the semiconductor device SEM3.

Figure 15:
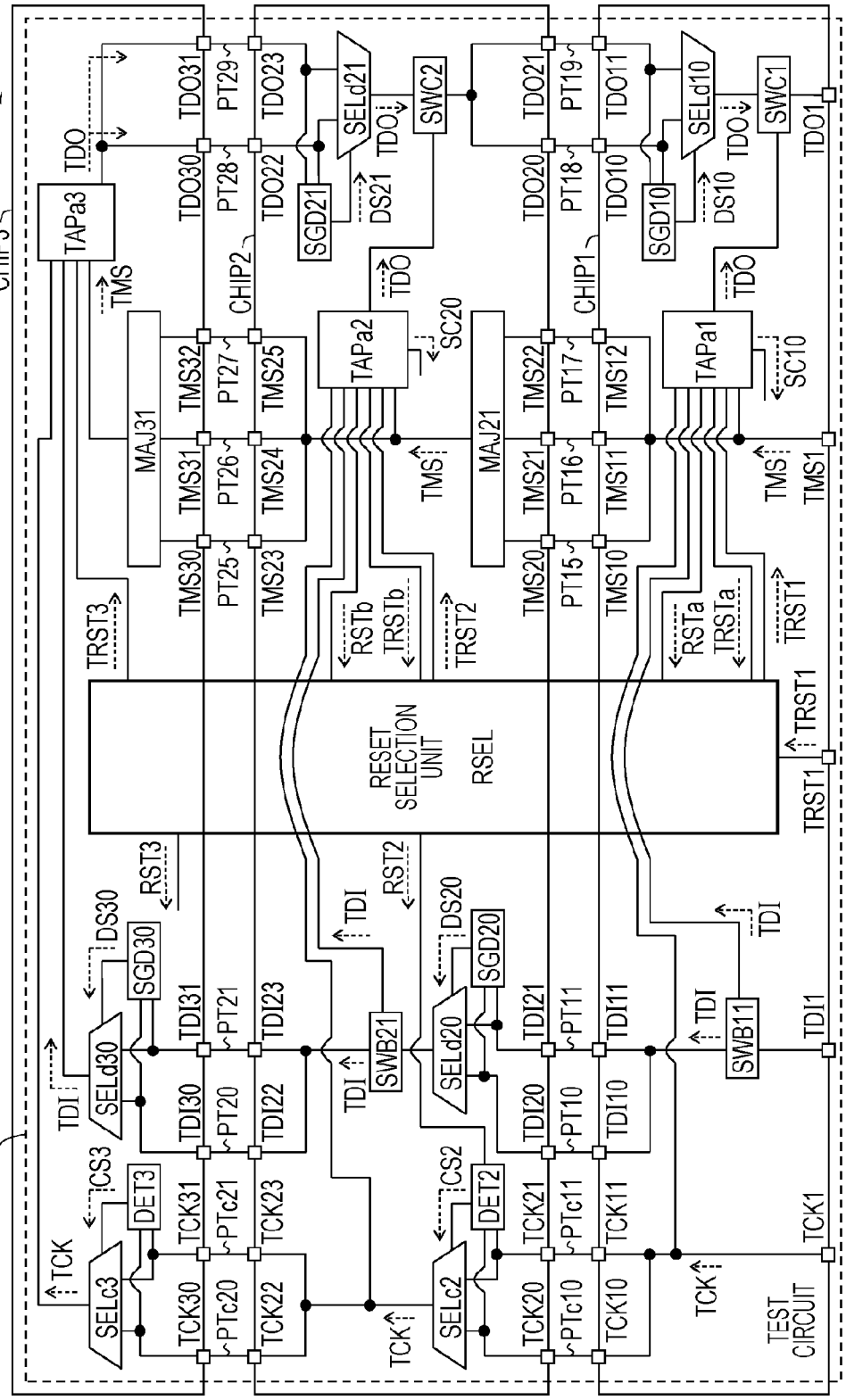
FIG. 15 is a diagram illustrating still another embodiment of the test circuit and the method of controlling the test circuit.

FIG. 15 illustrates still another embodiment of the test circuit and the method of controlling the test circuit. The same or similar symbols will be given to elements which are the same as or similar to those illustrated in FIG. 1 to FIG. 14, and details description thereof will not be repeated. A test circuit TESC4 tests a semiconductor device SEM4 including a plurality of semiconductor chips CHIP (CHIP1, CHIP2, and CHIP3). The semiconductor device SEM4 is the same as or similar to the semiconductor device SEM3 illustrated in FIG. 12 except that the semiconductor device SEM4 includes the test circuit TESC4 instead of the test circuit TESC3 illustrated in FIG. 12.

In addition, in FIG. 15, description of a signal line between switching units SWB and SWC and a test unit TAPa of the semiconductor chips CHIP1 and CHIP2 and the like is omitted for easy comprehension of the drawing.

In the test circuit TESC4, the clock transmission switching units SWA (SWA1 and SWA2), and the transmission destination switching units SWB12 and SWB22 are omitted from the configuration of the test circuit TESC3 illustrated in FIG. 12. In addition, the test circuit TESC4 includes test units TAPa1, TAPa2, and TAPa3 instead of the test units TAP1, TAP2, and TAP3 illustrated in FIG. 12. In addition, the reset selection unit RSEL is added to the configuration of the test circuit TESC3 illustrated in FIG. 12. The other configurations of the test circuit TESC4 are the same as or similar to those of the test circuit TESC3 illustrated in FIG. 12.

The test circuit TESC4 includes a clock detection unit DET (DET2, DET3), a clock path selection unit SELc (SELc2, SELc3), a test unit TAPa (TAPa1, TAPa2, TAPa3), a majority decision selection unit MAJ (MAJ21, MAJ31), and a reset selection unit RSEL. In addition, the test circuit TESC4 includes a transmission destination switching unit SWB (SWB11, SWB21), and a transmission data switching unit SWC (SWC1, SWC2). In addition, the test circuit TESC4 includes a selection signal generation unit SGD (SGD10, SGD20, SGD21, SGD30), and a data path selection unit SELd (SELd10, SELd20, SELd21, SELd30).

The clock detection units DET2 and DET3, and the clock path selection units SELc2 and SELc3 are the same as or similar to the clock detection units DET2 and DET3, and the clock path selection units SELc2 and SELc3 which are illustrated in FIG. 8. The test units TAPa1 to TAPa3, the majority decision selection units MAJ21 and MAJ31, and the reset selection unit RSEL are the same as or similar to the test units TAPa1 to TAPa3, the majority decision selection units MAJ21 and MAJ31, and the reset selection unit RSEL which are illustrated in FIG. 8.

The transmission destination switching units SWB11 and SWB21, and the transmission data switching units SWC1 and SWC2 are the same as or similar to the transmission destination switching units SWB11 and SWB21, and the transmission data switching units SWC1 and SWC2 which are illustrated in FIG. 12. The selection signal generation units SGD10, SGD20, SGD21, and SGD30 are the same as or similar to the selection signal generation units SGD10, SGD20, SGD21, and SGD30 which are illustrated in FIG. 12. In addition, the data path selection units SELd10, SELd20, SELd21, and SELd30 are the same as or similar to the data path selection units SELd10, SELd20, SELd21, and SELd30 which are illustrated in FIG. 12.

In addition, the configuration of the test circuit TESC4 is not limited to the example illustrated in FIG. 15. For example, a clock path PTc (PTc10, PTc11, and the like), through which a test clock TCK received by a test clock terminal TCK1 is transmitted, may be made redundant by using three or more clock paths. In addition, test path PT (PT10, PT11, and the like), through which the data received by the test input terminal TDI1 is transmitted, may be made redundant by three or more signal paths. In addition, for example, the test circuit TESC4 may be embedded in a semiconductor device SEM (the semiconductor device SEM4 from which the semiconductor chip CHIP2 is omitted) in which two semiconductor chips CHIP are stacked. Alternatively, the test circuit TESC4 may be embedded in a semiconductor device SEM in which four or more semiconductor chips CHIP are stacked.

Figure 16:
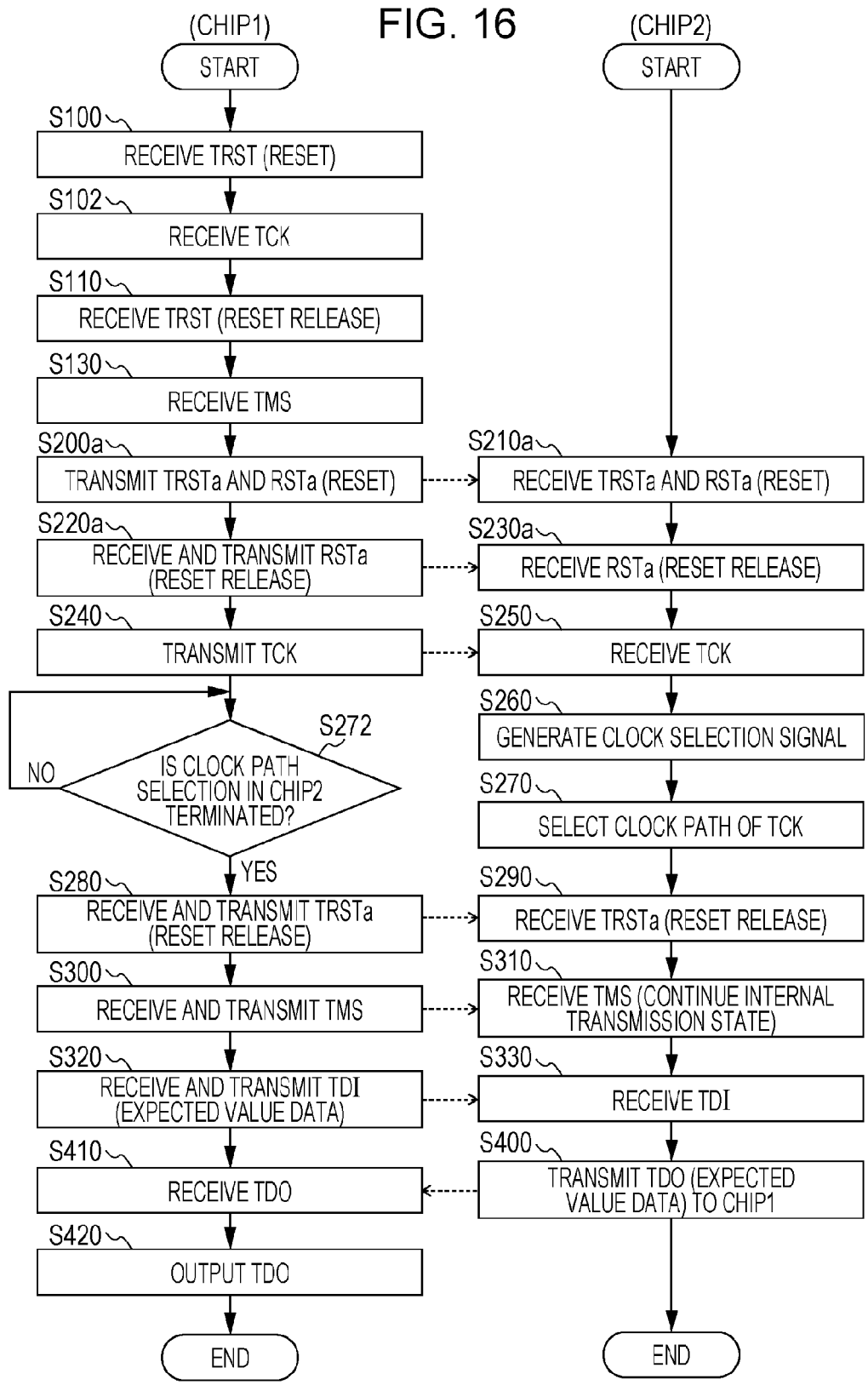
FIG. 16 is a diagram illustrating an example of the method of controlling the test circuit illustrated in FIG. 15.

FIG. 16 illustrates an example of a method of controlling the test circuit TESC4 illustrated in FIG. 15. In addition, FIG. 16 illustrates an example of the method of controlling the test circuit TESC4 when setting the clock path PTc and the test path PT between the semiconductor chips CHIP1 and CHIP2. Steps S100 to S130, S200a, S220a, S240, S272, S280, S300, S320, S410, and S420 in FIG. 16 represent the operation of the test circuit TESC4 that is included in the semiconductor chip CHIP1. In addition, steps S210a, S230a, S250, S260, S270, S290, S310, S330, and S400 represent the operation of the test circuit TESC4 that is included in the semiconductor chip CHIP2. For example, the operation illustrated in FIG. 16 is controlled by a test device that tests the semiconductor device SEM4. In addition, in the operation illustrated in FIG. 16, an initial state of the transmission destination switching unit SWB and an initial state of the transmission data switching unit SWC are set to the internal transmission state.

In the operation illustrated in FIG. 16, processes in steps S200a, S210a, S220a, and S230a are carried out instead of the process in steps S200, S210, S220, and S230 which are illustrated in FIG. 14. In addition, in the operation illustrated in FIG. 16, a process (reset release) in step S110 is carried out after the process (clock supply) in step S120 illustrated in FIG. 14 (in FIG. 16, step S102), and steps S280 and S290 are added to the operation illustrated in FIG. 14.

That is, in the operation illustrated in FIG. 16, steps S300 to S330, and S400 to S420 are added to the operation illustrated in FIG. 11. The same or similar symbols will be given to operations which are the same as or similar to the operations described in FIG. 7, FIG. 11, and FIG. 14, and detailed description thereof will not be repeated.

As illustrated in FIG. 11, the test clock path PTc between the semiconductor chips CHIP1 and CHIP2 is set through the processes from step S100 to step S290.

In step S300, the semiconductor chip CHIP1 receives a test mode select TMS, which is supplied from the test device, by a test mode select terminal TMS1. In addition, the semiconductor chip CHIP1 transmits the test mode select TMS, which is received from the test device, to the semiconductor chip CHIP2 by using three signal paths PT15, PT16, and PT17.

In step S310, the semiconductor chip CHIP2 receives the test mode select TMS by terminals TMS20, TMS21, and TMS22. According to this, the test mode select TMS is transmitted to the test unit TAPa2 of the semiconductor chip CHIP2, and the state of the test unit TAPa2 is determined.

In step S320, the semiconductor chip CHIP1 receives data TDI of the same logical value as the expected value by a test input terminal TDI1, and transmits the data TDI, which is received, to the semiconductor chip CHIP2 by using the two signal paths PT10 and PT11. According to this, in a case where any one of the signal paths PT10 and PT11 is normal, the semiconductor chip CHIP2 receives the data TDI of the same logical value as the expected value in step S330.

In step S330, the semiconductor chip CHIP2 receives the data TDI by terminals TDI20 and TDI21. In a case where the data TDI that is received through any one of the two signal paths PT10 and PT11 represents the expected value, the test path PT between the semiconductor chips CHIP1 and CHIP2 when transmitting the data TDI is set.

In step S400, the semiconductor chip CHIP2 transmits the data TDI (data TDI representing the expected value), which is transmitted to the test unit TAPa2 of the semiconductor chip CHIP2, to the semiconductor chip CHIP1 as data TDO by using two signal paths PT18 and PT19. According to this, in a case where any one of the signal paths PT18 and PT19 is normal, in step S410, the semiconductor chip CHIP1 receives the data TDO of the same logical value as the expected value.

In step S410, the semiconductor chip CHIP1 receives the data TDO by terminals TDO10 and TDO11. In a case where the data TDO, which is received through any one of the two signal paths PT18 and PT19, represents the expected value, the test path PT between the semiconductor chips CHIP1 and CHIP2 when transmitting the data TDO is set.

In step S420, the semiconductor chip CHIP1 outputs the data TDO, which is received from the semiconductor chip CHIP2, to the test device through a test output terminal TDO1.

According to this, the test path PT between the semiconductor chip CHIP1 and CHIP2 is set. In addition, for example, setting of the test path PT between the semiconductor chips CHIP2 and CHIP3 is carried out after step S420. For example, the test device carries out the same operations as in steps S200a, S220a, S240, S272, S280, S300, S320, and S410 in the semiconductor chip CHIP2. In addition, the test device carries out the same operations as in steps S210a, S230a, S250, S260, S270, S290, S310, S330, and S400 in the semiconductor chip CHIP3.

According to this, the test clock path PTc and the test path PT between the semiconductor chips CHIP2 and CHIP3 are set. In addition, the method of controlling the test circuit TESC4 is not limited to the example illustrated in FIG. 16.

As described above, even in the embodiment described in FIG. 15 and FIG. 16, it is possible to obtain the same effect as in the embodiment illustrated in FIG. 2 to FIG. 14. For example, in this embodiment, even in a case where one of the clock paths PTc10 and PTc11, and one of the clock paths PTc20 and PTc21 fails, it is possible to carry out test for detecting a failure site in the signal path between the semiconductor chips CHIP. According to this, it is possible to retrieve the failure by bypassing the failure site. As a result, in this embodiment, it is possible to improve a yield ratio of the semiconductor device SEM4.

In addition, in this embodiment, even in a case where one of the redundant signal paths PT (for example, a pair of two signal paths PT) through which the data received by the test input terminal TDI1 is transmitted fails, it is possible to carried out test for detecting a failure site in the signal path between the semiconductor chips CHIP. According to this, in this embodiment, it is possible to improve a yield ratio of the semiconductor device SEM4.

In addition, in this embodiment, the test circuit TESC4 separately controls reset with respect to the clock detection unit DET, and reset with respect to the test unit TAPa. According to this, the test circuit TESC4 can supply the test clock TCK to the test unit TAPa before reset with respect to the test unit TAPa is released. As a result, in this embodiment, it is possible to the operation of the test unit TAPa being unstable.

Figure 17:
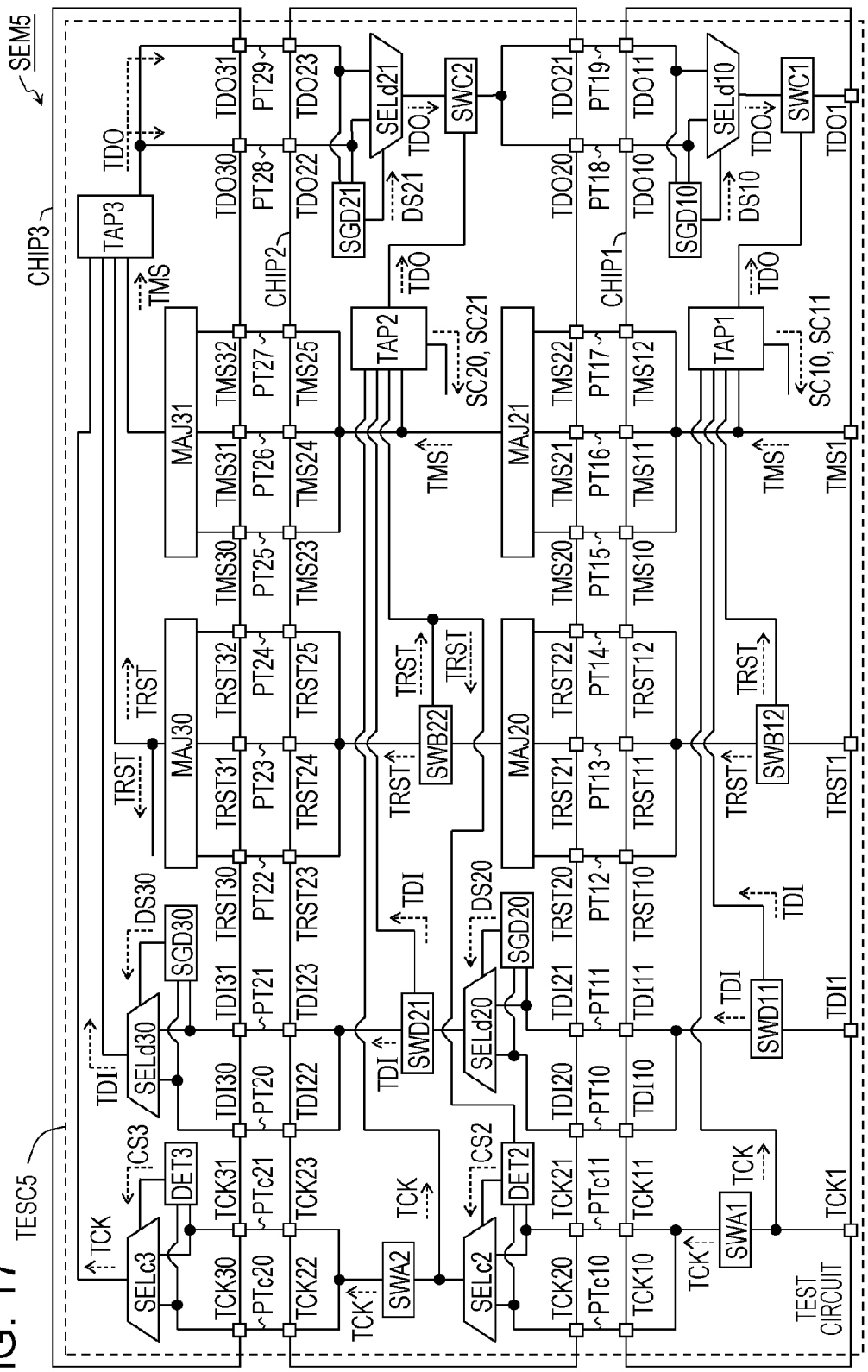
FIG. 17 is a diagram illustrating still another embodiment of the test circuit and the method of controlling the test circuit.

FIG. 17 illustrates still another embodiment of the test circuit and the method of controlling the test circuit. The same or similar symbols will be given to elements which are the same as or similar to those illustrated in FIG. 1 to FIG. 16, and details description thereof will not be repeated. A test circuit TESC5 tests a semiconductor device SEM5 including a plurality of semiconductor chips CHIP (CHIP1, CHIP2, and CHIP5). The semiconductor device SEM5 is the same as or similar to the semiconductor device SEM3 illustrated in FIG. 12 except that the semiconductor device SEM5 includes test circuit TESC5 instead of the test circuit TESC3 illustrated in FIG. 12. In addition, the method of controlling the test circuit TESC5 is the same as or similar to the method of controlling the test circuit TESC3.

The test circuit TESC5 includes a transmission destination switching units SWD11 and SWD21 instead of the transmission destination switching units SWB11 and SWB21 which are illustrated in FIG. 12. According to this, test units TAP1 and TAP2 generate a control signal SC that controls the transmission destination switching unit SWD in addition to a control signal SC that controls switching units SWA, SWB, and SWC. The other configurations of the test circuit TESC5 are the same as or similar to those of the test circuit TESC3 illustrated in FIG. 12.

For example, the test circuit TESC5 includes a clock detection unit DET, a clock path selection unit SELc, a selection signal generation unit SGD, a data path selection unit SELd, a majority decision selection unit MAJ, and a test unit TAP. In addition, the test circuit TESC5 includes a clock transmission switching unit SWA, transmission destination switching unit SWB and SWD, and a transmission data switching unit SWC. Hereinafter, the transmission destination switching unit SWD is also referred to as a switching unit SWD.

The test unit TAP sets the state of the clock transmission switching unit SWA, the transmission destination switching units SWB and SWD, and the transmission data switching unit SWC, for example, in accordance with a test mode select TMS. In addition, in FIG. 17, description of a signal line between the switching units SWA, SWB, SWD, and SWC, and the test unit TAP of the semiconductor chips CHIP1 and CHIP2, a signal line between the majority decision selection unit MAJ30 and the clock detection unit DET3, and the like is omitted for easy comprehension of the drawing.

For example, the test unit TAP1 generates a control signal SC (SC10, SC11) that controls the state of the switching units SWA1, SWD11, SWB12, and SWC1 in accordance with a semiconductor chip CHIP that becomes a test target. In addition, the test unit TAP2 generates a control signal SC (SC20, SC21) that controls the state of the switching units SWA2, SWD21, SWB22, and SWC2 in accordance with a semiconductor chip CHIP that becomes a test target.

The transmission destination switching unit SWD is set to any one of the internal transmission state, the passing state, and a bidirectional state based on the control signal SC that is received from the test unit TAP. In the internal transmission state, data TDI, which is received by the transmission destination switching unit SWD, is transmitted to a test unit TAP of a semiconductor chip CHIP itself. In addition, in the passing state, the data TDI, which is received by the transmission destination switching unit SWD, is transmitted to another semiconductor chip CHIP. In addition, in the bidirectional state, the data TDI, which is received by the transmission destination switching unit SWD, is transmitted to a test unit TAP of a semiconductor chip CHIP itself, and another semiconductor chip CHIP.

A connection relationship of an input terminal and two output terminals of each of the transmission destination switching units SWD11 and SWD21 is the same as or similar to that in each of the transmission destination switching units SWB11 and SWB21 which are illustrated in FIG. 12. Accordingly, in a case where the transmission destination switching unit SWD11 of the semiconductor chip CHIP1 is set to the internal transmission state, the test unit TAP1 of the semiconductor chip CHIP1 receives the data TDI from a terminal TDI1. In addition, in a case where the transmission destination switching unit SWD11 of the semiconductor chip CHIP1 is set to the passing state, the data TDI, which is received by the terminal TDI1, is transmitted to the semiconductor chip CHIP2.

In addition, in a case where the transmission destination switching unit SWD11 of the semiconductor chip CHIP1 is set to the bidirectional state, the data TDI, which is received by the terminal TDI1, is transmitted to the test unit TAP1 of the semiconductor chip CHIP1, and the semiconductor chip CHIP2.

In addition, the configuration of the test circuit TESC5 is not limited to the example illustrated in FIG. 17. For example, clock path PTc (PTc10, PTc11, and the like), through which a test clock TCK received by a test clock terminal TCK1 is transmitted, may be made redundant by using three or more clock paths. In addition, test path PT (PT10, PT11, and the like), through which the data received by the test input terminal TDI1 is transmitted, may be made redundant by three or more signal paths. In addition, for example, the test circuit TESC5 may be embedded in a semiconductor device SEM (the semiconductor device SEM5 from which the semiconductor chip CHIP2 is omitted) in which two semiconductor chips CHIP are stacked. Alternatively, the test circuit TESC5 may be embedded in a semiconductor device SEM in which four or more semiconductor chips CHIP are stacked.

In addition, the transmission destination switching units SWD11 and SWD21 may be included in the semiconductor devices SEM1, SEM2, and SEM4 which are illustrated in FIG. 2, FIG. 8, and FIG. 15 instead of the transmission destination switching units SWB11 and SWB21 which are illustrated in FIG. 2 and the like.

Figure 18:
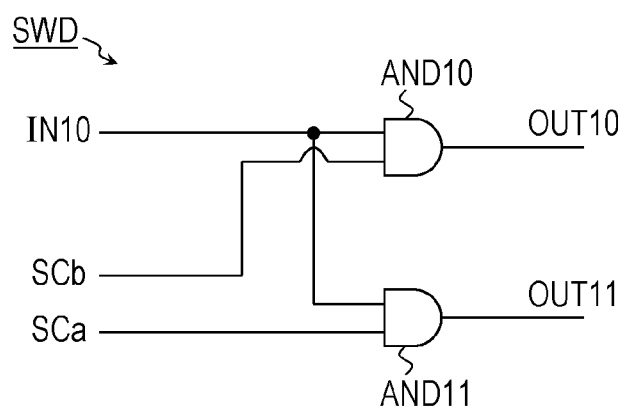
FIG. 18 is a diagram illustrating an example of a transmission destination switching unit illustrated in FIG. 17.

FIG. 18 illustrates an example of the transmission destination switching unit SWD illustrated in FIG. 17. The transmission destination switching unit SWD (SWD11, SWD21) includes AND circuits AND10 and AND11. The AND circuit AND10 operates a logical product of signals which are transmitted to two terminals IN10 and SCb, and outputs an operation result to a terminal OUT10. The AND circuit AND11 operates a logical product of signals which are transmitted to two terminals IN10 and SCa, and outputs an operation result to a terminal OUT11.

For example, in the transmission destination switching unit SWD11 of the semiconductor chip CHIP1, the terminals SCa and SCb receive the control signals SC10 and SC11 are received from the test unit TAP1. In addition, in the transmission destination switching unit SWD21 of the semiconductor chip CHIP2, the terminals SCa and SCb receive control signals SC20 and SC21 from the test unit TAP2.

In a case where the control signals, which are received by the terminals SCa and SCb, are a logical value "0" and a logical value "1", respectively (for example, the internal transmission state), the signal that is received by the terminal IN10 is output from the terminal OUT10, and the terminal OUT11 is retained to a logical value "0". In a case where the control signals, which are received by the terminals SCa and SCb, are a logical value "1" and a logical value "0", respectively (for example, the passing state), the signal that is received by the terminal IN10 is output from the terminal OUT11, and the terminal OUT10 is retained to a logical value "0".

In a case where both of the control signals, which are received by the terminals SCa and SCb, are a logical value "1" (for example, the bidirectional state), the signal that is received by the terminal IN10 is output from both of the terminals OUT10 and OUT11.

For example, in the semiconductor chip CHIP1, the terminal IN10 of the transmission destination switching unit SWD11 is connected to the test input terminal TDI1. In addition, the terminal OUT10 is connected to a test input terminal (terminal receiving the data TDI) of the test unit TAP1, and the terminal OUT11 is connected to terminals TDI10 and TDI11. In addition, in the semiconductor chip CHIP2, the terminal IN10 of the transmission destination switching unit SWD21 is connected to an output terminal of a data path selection unit SELd20. In addition, the terminal OUT10 is connected to a test input terminal (terminal receiving the data TDI) of the test unit TAP2, and the terminal OUT11 is connected to terminals TDI22 and TDI23.

As described above, even in the embodiment illustrated in FIG. 17 and FIG. 18, it is possible to obtain the same effect as in the embodiment illustrated in FIG. 12 to FIG. 14. For example, even in a case where one of the clock paths PTc10 and PTc11, and one of the clock paths PTc20 and PTc21 fails, it is possible to carry out test for detecting a failure site in the signal path between the semiconductor chips CHIP. In addition, in this embodiment, even in a case where one of the redundant signal paths PT (for example, a pair of two signal paths PT) through which the data received by the test input terminal TDI1 is transmitted fails, it is possible to carried out test for detecting a failure site in the signal path between the semiconductor chips CHIP. According to this, it is possible to retrieve the failure by bypassing the failure site. As a result, in this embodiment, it is possible to improve a yield ratio of the semiconductor device SEM5.

In addition, in this embodiment, the test circuit TESC5 includes the transmission destination switching unit SWD that switches the transmission destination of the data TDI. According to this, for example, in a case where the same data is set to data registers in the test units TAP, and the like of a plurality of semiconductor chips CHIP, the test circuit TESC5 can supply the data TDI to the test units TAP of the plurality of semiconductor chips CHIP in a broadcast manner. As a result, in this embodiment, it is possible to shorten time taken to set data to the data registers and the like in the test units TAP, and thus it is possible to shorten test time of the semiconductor device SEM5.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A test circuit which is provided to a semiconductor device including a plurality of semiconductor chips, and tests the semiconductor device, comprising:
   a test clock terminal which is provided to a first semiconductor chip among the plurality of semiconductor chips, and receives a test clock signal that is used when testing the semiconductor device;
   a plurality of first clock paths which are disposed between the first semiconductor chip and a second semiconductor chip among the plurality of semiconductor chips, and through which the test clock signal that is received by the test clock terminal is transmitted from the first semiconductor chip to the second semiconductor chip;
   a test circuit which is provided to the second semiconductor chip, and tests the second semiconductor chip by using the test clock signal that is transmitted to the second semiconductor chip;
   a first clock detection circuit which is provided to the second semiconductor chip, and detects the test clock signal that is received through at least one of the plurality of first clock paths under a predetermined condition; and
   a first clock path selection circuit which is provided to the second semiconductor chip, selects a first clock path, through which the test clock signal detected by the first clock detection circuit is transmitted, among the plurality of first clock paths as a first test clock path, and supplies the test clock signal, which is transmitted through the first test clock path, to the test circuit when the second semiconductor chip is tested.

2. The test circuit according to claim 1,
   wherein the first clock detection circuit detects the test clock signal, of which a number of clocks reaches a predetermined number for a first time, among a plurality of test clock signals which are received through the plurality of first clock paths, and generates a first clock selection signal that represents the first clock path through which the test clock signal that is detected is transmitted, and the first clock path selection circuit selects the first clock path, which is represented by the first clock selection signal, among the plurality of first clock paths as the first test clock path.

3. The test circuit according to claim 2,
wherein the first clock detection circuit includes,
- a plurality of first counters which are respectively provided in correspondence with the plurality of first clock paths, and count a number of clocks of the plurality of test clock signals which are respectively received through the plurality of first clock paths,
- a first setting control circuit that asserts, for each of the plurality of first counters, a first control signal when the number of clocks counted by each of the plurality of first counters reaches the predetermined number,
- a plurality of first selection signal storages which are respectively provided in correspondence with the plurality of first clock paths, store logical values of the plurality of first control signals, and output the first clock selection signal based on each of the logical values which are stored, and
- a first update control circuit that suppresses variation of the logical value of the first clock selection signal after the logical value of the first control signal that is asserted is stored in any one of the plurality of first selection signal storages.

4. The test circuit according to claim 3,
wherein the first update control circuit retains a state of the first selection signal storages, other than the one of the plurality of first selection signal storages which stores a logical value of the first control signal that is asserted, to an initial state during a period in which the logical value of the first control signal that is asserted is stored in the one of the plurality of first selection signal storages.

5. The test circuit according to claim 1, further comprising:
- a first switch which is provided to the first semiconductor chip, and is set to any one of a state of transmitting the test clock signal, which is transmitted from the test clock terminal, to the second semiconductor chip, and a state of not transmitting the test clock signal, which is transmitted from the test clock terminal, to the second semiconductor chip.

6. The test circuit according to claim 1, further comprising:
- a test circuit which is provided to the first semiconductor chip, and transmits a first test circuit reset signal that resets the test circuit of the second semiconductor chip, and a first detection circuit reset signal that resets the first clock detection circuit to the second semiconductor chip.

7. The test circuit according to claim 1, further comprising:
- a plurality of second clock paths which are disposed between the second semiconductor chip and a third semiconductor chip among the plurality of semiconductor chips, and transmit the test clock signal, which is transmitted to the second semiconductor chip, to the third semiconductor chip;
- a second test circuit which is provided to the third semiconductor chip, and tests the third semiconductor chip by using the test clock signal that is transmitted to the third semiconductor chip;
- a second clock detection circuit which is provided to the third semiconductor chip, and detects the test clock signal that is received through each of the plurality of second clock paths; and
- a second clock path selection circuit which is provided to the third semiconductor chip, selects a second clock path, through which the test clock signal detected by the second clock detection circuit is transmitted, among the plurality of second clock paths as a second test clock path, and supplies the test clock signal, which is transmitted through the second test clock path, to the second test circuit of the third semiconductor chip when the third semiconductor chip is tested,
wherein the first clock path selection circuit transmits the test clock signal, which is transmitted through the first test clock path, to the third semiconductor chip when the third semiconductor chip is tested.

8. The test circuit according to claim 7, further comprising:
- a second switch, which is provided to the second semiconductor chip and receives the test clock signal transmitted through the first test clock path from the first clock path selection circuit, is set to any one of a state of transmitting the test clock, which is received from the first clock path selection circuit, to the third semiconductor chip, and a state of not transmitting the test clock, which is received from the first clock path selection circuit, to the third semiconductor chip.

9. The test circuit according to claim 7,
wherein the test circuit of the second semiconductor chip transmits a second test circuit reset signal that resets the second test circuit of the third semiconductor chip, and a second detection circuit reset signal that resets the second clock detection circuit to the third semiconductor chip.

10. The test circuit according to claim 7,
the second clock detection circuit detects the test clock signal, of which a number of clocks reaches a predetermined number for a first time, among a plurality of test clock signals which are received through the plurality of second clock paths, and generates a second clock selection signal that represents the second clock path through which the test clock signal that is detected is transmitted, and
the second clock path selection circuit selects the second clock path, which is represented by the second clock selection signal, among the plurality of second clock paths as the second test clock path.

11. The test circuit according to claim 10,
wherein the second clock detection circuit includes,
- a plurality of second counters which are respectively provided in correspondence with the plurality of second clock paths, and count a number of clocks of the plurality of test clock signals which are respectively received through the plurality of second clock paths,
- a second setting control circuit that asserts, for each of the plurality of second counters, a second control signal when the number of clocks counted by each of the plurality of second counters reaches the predetermined number,
- a plurality of second selection signal storages which are respectively provided in correspondence with the plurality of second clock paths, store logical values of the plurality of second control signals, and output the second clock selection signal based on each of the logical values which are stored, and a second update control circuit that suppresses variation of the logical value of the second clock selection signal after the logical value of the second control signal that is asserted is stored in any one of the plurality of second selection signal storages.

12. The test circuit according to claim 11,
wherein the second update control circuit retains a state of the second selection signal storages, other than the one of the plurality of second selection signal storages which stores a logical value of the second control signal that is asserted, to an initial state during a period in which the logical value of the second control signal that is asserted is stored in the one of the plurality of second selection signal storages.

13. The test circuit according to claim 1, further comprising:
a test data input terminal which is provide to the first semiconductor chip, and receives test data that is used when the semiconductor device is tested;
a plurality of first test paths which are disposed between the first semiconductor chip and the second semiconductor chip, and transmit the test data, which is received by the test data input terminal, from the first semiconductor chip to the second semiconductor chip;
a first selection signal generation circuit which is provided to the second semiconductor chip, and generates a first data selection signal that represents a first test path, through which data that represents an expected value is transmitted, in a case where the data that represents the expected value is received through any one of the plurality of first test paths; and
a first data path selection circuit which is provided to the second semiconductor chip, selects a first test path, which is represented by the first data selection signal, among the plurality of first test paths as a first test data path, and supplies the test data, which is transmitted through the first test data path, to the test circuit of the second semiconductor chip when the second semiconductor chip is tested.

14. The test circuit according to claim 7, further comprising:
a test data input terminal which is provide to the first semiconductor chip, and receives test data that is used when the semiconductor device is tested;
a plurality of first test paths which are disposed between the first semiconductor chip and the second semiconductor chip, and transmit the test data, which is received by the test data input terminal, from the first semiconductor chip to the second semiconductor chip;
a plurality of second test paths which are disposed between the second semiconductor chip and the third semiconductor chips, and transmit the test data, which is transmitted to the second semiconductor chip, to the third semiconductor chip;
a first selection signal generation circuit which is provided to the second semiconductor chip, and generates a first data selection signal that represents a first test path, through which data that represents an expected value is transmitted, in a case where the data that represents the expected value is received through any one of the plurality of first test paths;
a first data path selection circuit which is provided to the second semiconductor chip, selects a first test path, which is represented by the first data selection signal, among the plurality of first test paths as a first test data path, and supplies the test data, which is transmitted through the first test data path, to the test circuit of the second semiconductor chip when the second semiconductor chip is tested;
a second selection signal generation circuit which is provided to the third semiconductor chip, and generates a second data selection signal that represents a second test path, through which data that represents an expected value is transmitted, in a case where the data that represents the expected value is received through any one of the plurality of second test paths; and
a second data path selection circuit which is provided to the third semiconductor chip, selects a second test path, which is represented by the second data selection signal, among the plurality of second test paths as a second test data path, and supplies the test data, which is transmitted through the second test data path, to the test circuit of the third semiconductor chip when the third semiconductor chip is tested.

15. A method of controlling a test circuit including a test clock terminal which is provided to a first semiconductor chip among the plurality of semiconductor chips which are included in a semiconductor device, and receives a test clock signal that is used when testing the semiconductor device, a plurality of first clock paths which are disposed between the first semiconductor chip, and a second semiconductor chip among the plurality of semiconductor chips, and through which a test clock signal that is received by the test clock terminal is transmitted from the first semiconductor chip to the second semiconductor chip, a test circuit which is provided to the second semiconductor chip, and tests the second semiconductor chip by using the test clock signal that is transmitted to the second semiconductor chip, a first clock detection circuit which is provided to the second semiconductor chip, and detects the test clock signal that is received through each of the plurality of first clock paths, and a first clock path selection circuit which is provided to the second semiconductor chip, selects a first clock path, through which the test clock signal detected by the first clock detection circuit is transmitted, among the plurality of first clock paths as a first test clock path, and supplies the test clock signal, which is transmitted through the first test clock path, to the test circuit when the second semiconductor chip is tested, the method comprising:
allowing a test device, which tests the semiconductor device, to supply a test clock signal to the test clock terminal; and
allowing the test device to supply data, which is used to test the semiconductor device, to a test data input terminal of the semiconductor device after the first clock path selection unit circuit selects the first test clock path among the plurality of first clock paths.

* * * * *